United States Patent [19]
Kawabata et al.

[11] Patent Number: 5,674,646
[45] Date of Patent: Oct. 7, 1997

[54] MASK PRODUCING METHOD

[75] Inventors: Toshiaki Kawabata, Kawasaki; Kenji Nakagawa, Isehara, both of Japan; Seiichiro Yamaguchi, Tempe, Ariz.; Masao Taguchi, Sagamihara, Japan; Kazuhiko Sumi; Yuichiro Yanagishita, both of Kawasaki, Japan

[73] Assignee: Fujitsu Ltd., Kawasaki, Japan

[21] Appl. No.: 463,857

[22] Filed: Jun. 5, 1995

Related U.S. Application Data

[62] Division of Ser. No. 54,608, Apr. 30, 1993, Pat. No. 5,489,509, which is a continuation of Ser. No. 516,347, Apr. 27, 1990, abandoned.

[30] Foreign Application Priority Data

Apr. 28, 1989 [JP] Japan ................. 1-111675
Aug. 11, 1989 [JP] Japan ................. 1-206837
Feb. 6, 1990 [JP] Japan ................. 2-26623

[51] Int. Cl.⁶ .......................................... G03F 9/00
[52] U.S. Cl. .................. 430/5; 430/311; 430/314; 430/313; 430/396
[58] Field of Search .................. 430/5, 311, 312, 430/313, 314, 396

[56] References Cited

U.S. PATENT DOCUMENTS

| | | | |
|---|---|---|---|
| 4,890,309 | 12/1989 | Smith | 378/34 |
| 5,045,417 | 9/1991 | Okamoto | 430/5 |
| 5,132,186 | 7/1992 | Takeuchi et al. | 430/5 |

FOREIGN PATENT DOCUMENTS

| | | | |
|---|---|---|---|
| 1190082 | 7/1985 | Canada | 430/5 |
| 0383534 | 8/1980 | European Pat. Off. | |
| 0090924 | 10/1983 | European Pat. Off. | |
| 0234547 | 9/1987 | European Pat. Off. | |
| 0437376 | 1/1991 | European Pat. Off. | 430/5 |
| 58-173744 | 10/1983 | Japan | |
| 61-292643 | 12/1986 | Japan | |
| 62-67514 | 3/1987 | Japan | |
| 62-189468 | 8/1987 | Japan | |
| 1-147458 | 6/1989 | Japan | |
| 2-140743 | 5/1990 | Japan | |
| 140743 | 5/1990 | Japan | 430/5 |
| 2-211451 | 8/1990 | Japan | |
| 247647 | 10/1990 | Japan | 430/5 |
| 287542 | 11/1990 | Japan | 430/5 |
| 3-125150 | 5/1991 | Japan | |
| 3-141354 | 6/1991 | Japan | |
| 3-203737 | 9/1991 | Japan | |

*Primary Examiner*—S. Rosasco
*Attorney, Agent, or Firm*—Staas & Halsey

[57] ABSTRACT

A mask includes a transparent layer which is transparent with respect to a light which is used for an exposure, and a mask pattern layer which is formed on the transparent layer. At least a portion of the mask pattern layer is made up solely of a phase shift layer for transmitting the light, so that a phase shift occurs between a phase of the light transmitted through the phase shift layer and a phase of the light transmitted through a portion of the mask having no phase shift layer.

12 Claims, 70 Drawing Sheets

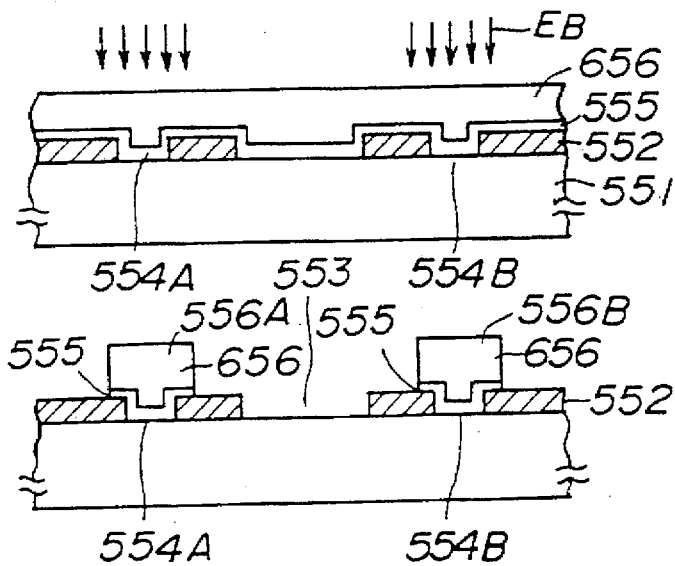
FIG. 5A (PRIOR ART)
FIG. 5B (PRIOR ART)
FIG. 5C (PRIOR ART)
FIG. 5D (PRIOR ART)
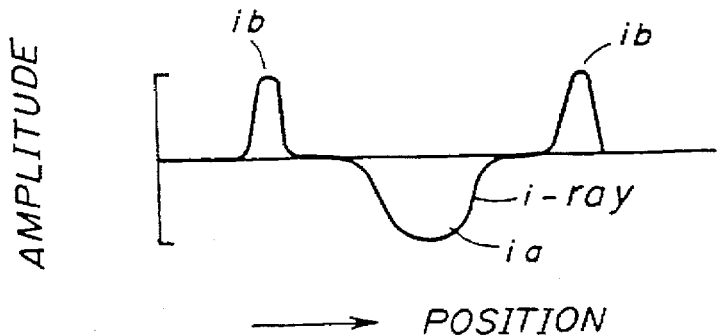
FIG. 6 (PRIOR ART)

FIG.31A  FIG.31B
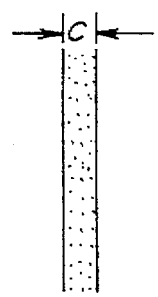
FIG.33A
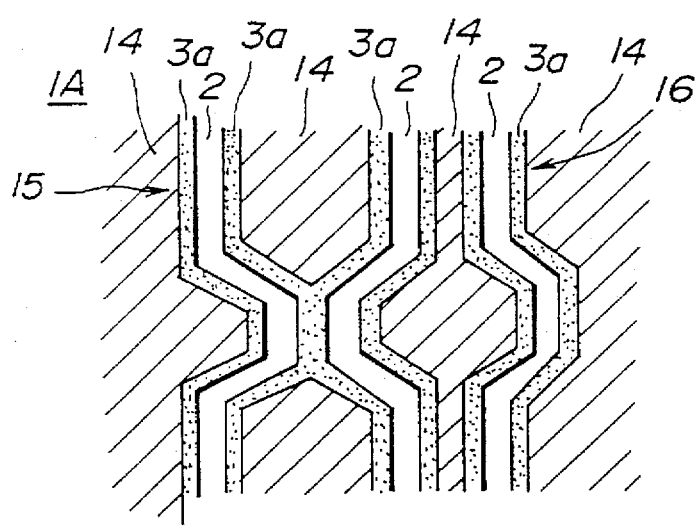
FIG.33B
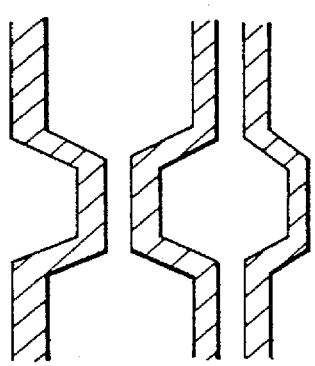
FIG.34A
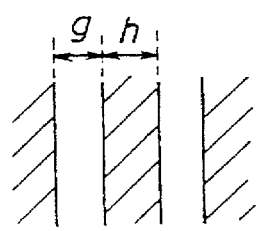
FIG.34B
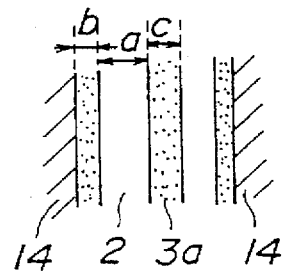
FIG.34C
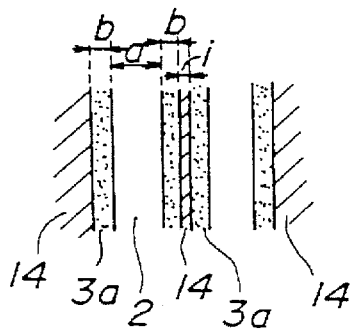

ELECTRICAL VECTOR OF LIGHT E

LIGHT INTENSITY P

85

86($\pi$)

87($\pi$)

90(0)

88($\pi$)

89($\pi/2$)

91

92

93

MASK PRODUCING METHOD

This application is a division of application Ser. No. 08/054,608, filed Apr. 30, 1993, now U.S. Pat. No. 5,489,509 which is a continuation of application Ser. No. 07/516,347, filed Apr. 27, 1990, now abandoned.

BACKGROUND OF THE INVENTION

The present invention generally relates to masks for forming patterns on semiconductor devices and the like, mask producing methods and pattern forming methods using masks, and more particularly to a mask which uses light phase shift principles, a mask producing method for producing such a mask and a pattern forming method which uses such a mask.

When forming patterns of elements and circuits and the like on semiconductor wafers in production processes for semiconductor devices, it is normal to employ ultraviolet light for the pattern transfer exposure.

Patterns to be transferred onto a wafer are formed utilizing a thin, opaque metal film provided on a glass substrate which is transparent with respect to the exposure light. The pattern on the glass substrate to be transferred onto the wafer is called a mask when this pattern is identical to the chip pattern which is actually transferred onto the wafer. On the other hand, the pattern on the glass substrate is called an enlarged mask or a reticle when this pattern is enlarged compared to the chip pattern which is actually transferred onto the wafer. When using the mask, the pattern is transferred to a resist layer on the wafer using parallel ray exposure. On the other hand, when using the reticle, the pattern is transferred to the resist layer on the wafer using a reduction lens exposure system which projects a reduced pattern onto the resist layer.

In order to improve the resolution of the pattern which is transferred, especially when the integration density of the integrated circuit is large and the pattern is fine, it is necessary to improve the contrast at the edge portions of the region which is exposed.

FIG. 1 shows an example of a conventional mask which is made up of an opaque layer having a predetermined pattern and a transparent substrate. FIG. 2 shows an example of an optical system for forming a pattern on the wafer using the mask shown in FIG. 1.

In FIG. 1, a mask 450 comprises a transparent substrate 452 and an opaque layer 451 which is made of a material such as chromium (Cr). The opaque layer 451 is formed to a predetermined pattern by lithography and etching processes.

In FIG. 2, a light C which is emitted by an exposure apparatus (not shown) illuminates the mask 450. The light C cannot be transmitted through the opaque layer 451 but is transmitted through the portions of the transparent substrate 452 not provided with the opaque layer 451. The transmitted light passes through an imaging lens system 453 and is used to expose a resist material 455 which is coated on a wafer 454. For example, a resist OFPR manufactured by Tokyo Ooka Kogyo K. K. of Japan may be used as the resist material 455. As a result, a pattern identical to the pattern of the mask 450 is formed on the wafer 454 by an etching process.

When forming the pattern using an optical lens system, the exposure of wafer 454 is based solely on the contrast available as a result of the existence of the opaque layer 451 on the transparent substrate 452. For this reason, the resolution of the pattern formation is physically limited by the wavelength of the light which is obtained via the optical lens system, and depending on the wavelength of the light used for the exposure it is often difficult to form a fine pattern.

Conventionally, photolithography processes employ reticles made by forming an opaque layer on a transparent substrate and patterning the opaque layer. For example, the opaque layer is made of Cr and the transparent substrate is made of a transparent material such as glass and quartz. FIGS. 3A through 3D are diagrams for explaining such a conventional pattern forming method.

In FIG. 3A, the optical system includes a light source 461, an illumination lens 462, and an imaging lens system 465. A reticle 464 is arranged between the illumination lens 462 and the imaging lens system 465. The light source 461 may be a mercury lamp or an excimer laser or the like and is provided with a filter for emitting i-ray or g-ray beams. The light 463 from the light source 461 illuminates the reticle 464 via the illumination lens 462. For example, the partial coherency $\sigma$ of the illumination lens 462 is 0.5. The reticle comprises a transparent substrate 468 and an opaque pattern 469 which is formed on the transparent substrate 468. For example, the transparent substrate 468 is made of glass and the opaque pattern 469 is made of Cr. The opaque pattern 469 on the reticle 464 is imaged on a photoresist layer 467 formed on a semiconductor substrate 466 via the imaging lens system 465. For example, the imaging lens system 465 has a numerical aperture (NA) of 0.50.

According to this pattern forming method, the resolution is described by the expression $K1 \cdot \lambda/NA$, where K1 denotes a process coefficient which is normally 0.6 to 0.8 and X denotes the wavelength of the light. The wavelength $\lambda$ of the light 463 is approximately 365 nm in the case of i-rays emitted using a mercury lamp and is 248 nm or 198 nm when an excimer laser is used. The numerical aperture NA differs depending on the imaging lens system 465 which is used, but is approximately 0.5, for example. In order to improve the resolution, it is necessary to set K1 or $\lambda$ to a small value and to set NA to a large value. However, the values of K1 and NA cannot be set freely. In addition, the value of $\lambda$ is restricted by the light source 461 and the optical system used. The resolution is determined when the wavelength $\lambda$ of the light used for the exposure, the numerical aperture NA and the process coefficient K1 are set, and it is impossible to image a pattern finer than the resolution.

The light 463 emitted from the light source 461 illuminates the entire surface of the reticle 464, and the portion of the light 463 which illuminates the opaque pattern 469 is blocked by the opaque pattern 469. For this reason, only the portion of the light 463 which illuminates the portion of the reticle 464 not provided with the opaque pattern 469 is transmitted through the reticle 464 and is imaged onto the photoresist layer 467 via the imaging lens system 465. FIG. 3B shows the electrical vector E of the light transmitted through the reticle 464, and FIG. 3C shows the light intensity P of the light transmitted through the reticle 464. A pattern having a light intensity distribution proportional to the square of the amplitude of the light illuminating the photoresist layer 467 is formed on the photoresist layer 467, and the photoresist layer 467 is selectively exposed.

FIG. 3D shows a portion of the reticle (opaque mask) 464 on an enlarged scale. The minimum width W of the pattern which can be exposed is dictated by the resolution which is a function of the imaging lens system 465.

FIGS. 4A through 4D illustrate the light intensity distribution for cases where the pattern which is exposed is a line pattern which is finer than the resolution. In FIGS. 4A through 4D, the wavelength λ of the light used is 365 nm, the numerical aperture NA is 0.50 and the partial coherency σ of the light is approximately 0.5.

FIG. 4A shows the light intensity distribution for a case where the line pattern which is imaged has a width of 0.35 µm. The light intensity approaches zero approximately at the center position (0.0) and gradually rises on each side of the center position (0.0). The line width is approximately 1.0 µm or greater at a position where the light intensity is at a maximum. When the photoresist layer is exposed using a position where the light intensity is approximately 0.2 as a developing threshold, it is possible to develop a pattern which has a design width in the order of 0.35 µm.

FIG. 4B shows the light intensity distribution for a case where the line pattern which is imaged has a width of 0.30 µm. The minimum value for the light intensity at the center position (0.0) is greater than the minimum value for the light intensity distribution shown in FIG. 4A. The width of the light intensity distribution curve itself as shown in FIG. 4B is not much different from that of FIG. 4A.

FIGS. 4C and 4D respectively show the light intensity distributions for cases where the line patterns which are imaged have widths of 0.25 µm and 0.20 µm. Similarly to the case of FIG. 4B, in each of FIGS. 4C and 4D the minimum value for the light intensity at the center position (0.0) is greater than the minimum value for the light intensity distribution shown in FIG. 4A. The width of the light intensity distribution curve itself as shown in each of FIGS. 4C and 4D is not much different from that of FIG. 4A. In other words, when the pattern width is reduced to a point which is less than the resolution, the width of the light intensity distribution curve which is obtained does not decrease and the minimum value for the light intensity at the center position (0.0) increases. In these cases it is possible to reduce the width of the line which is exposed, and a black area is exposed instead as a gray area. For these reasons, it is impossible to form an image which is finer than the resolution.

On the other hand, a method of shifting the phase of the light which is transmitted through the mask and exposed on the wafer by 180° depending on the patterns of the mask has been proposed by Marc D. Levenson, "Improving Resolution in Photolithography with a Phase-Shifting Mask", IEEE TRANSACTIONS ON ELECTRON DEVICES, Vol. ED-29, No. 12, December 1982. According to this proposed method, interference between the patterns is eliminated so as to improve the contrast on the wafer and improve the resolution of the exposure apparatus.

However, it is difficult to apply this proposed method to masks and reticles having fine patterns, and there is a problem in that it is troublesome to generate pattern data peculiar to the phase shift pattern. For this reason, there is a demand for realization of a phase shift pattern which is easily applicable to masks and reticles having fine patterns and which does not substantially increase the number of processes involved in the generation of the pattern data.

The phase shift pattern of the phase-shifting mask which is used according to this proposed method is formed as follows. First, an auxiliary pattern having a width smaller than that of the design pattern is formed in the vicinity of the design pattern (white pattern) which is to be transformed onto the wafer. Secondly, a phase shifter is formed on the auxiliary pattern. The phase shifter is an organic pattern made of a resist or the like formed by coating, exposure and developing processes, or an inorganic pattern formed by chemical vapor deposition and lithography processes. For example, a description of a method of forming a phase-shifting mask which uses a negative resist pattern as the phase shifter is as follows, with reference to FIGS. 5A through 5D.

In FIG. 5A, an opaque layer 552 is formed on a glass substrate 551. An aperture pattern, that is, a design pattern 553 comprising a transmission region, and fine patterns 554A and 554B is formed in opaque layer 552 by lithography using electron beam exposure. For example, the design pattern 553 has a width in the order of 1.5 µm, and the fine aperture patterns 554A and 554B have widths in the order of 0.5 µm. The fine aperture patterns 554A and 554B are formed as auxiliary patterns in regions neighboring the design pattern and are separated therefrom by a distance in the order of 0.5 µm, for example.

Next, as shown in FIG. 5B, a transparent conductor layer 555 for preventing charge up at the time of the electron beam exposure is formed on the surface of the glass substrate 551 and on the opaque layer 552 so as to cover the inner sides of the aperture patterns 553, 554A and 554B.

Then, as shown in FIG. 5C, a negative resist layer 656 is formed on top of the entire assemblage to a thickness such that the phase of the light which is transmitted through the negative resist layer 656 is shifted by 180°. A prebaking process is performed if needed, and a phase shift pattern is formed over the fine patterns 554A and 554B by electron beam exposure.

The thickness D of the negative resist layer 656 may be determined using the following formula (1), where X denotes a wavelength of the light used for the exposure and n denotes the refractive index of the shifter material.

$$D = \lambda/2(n-1) \qquad (1)$$

When using an i-ray beam having a wavelength of 365 nm for the exposure, the refractive index n of the negative resist layer 656 is approximately 1.6 and the thickness D becomes approximately 304 µm.

Next, as shown in FIG. 5D, a developing process is performed to selectively form phase shift patterns 556A and 556B on the fine patterns 554A and 554B, respectively. The phase shift patterns 556A and 556B are made up of the negative resist layer 656 which has a thickness D.

FIG. 6 shows a phase profile corresponding to the phase pattern of an i-ray beam transmitted through the phase-shifting mask of FIG. 5D when an i-ray beam is used for the exposure.

On the other hand, when a positive resist is used, a phase shift pattern 557 which is made up of the positive resist is selectively formed on the design pattern 553 as shown in FIG. 7 by processes similar to those described in conjunction with FIGS. 5A through 5D. In FIG. 7, those parts which are essentially the same as corresponding parts of FIGS. 5A through 5D are designated by the same reference numerals, and a description thereof will be omitted.

FIG. 8 shows a phase profile corresponding to the phase pattern of an i-ray beam transmitted through the phase-shift mask of FIG. 7 when an i-ray beam is used for the exposure.

When the phase-shifting masks of FIGS. 5D and 7 are used, the phase of the portions of the i-ray beam ($i_a$ and $i_c$) transmitted through the design pattern 553 differs by 180° from the phase of the portions of the i-ray beam ($i_b$ and $i_d$) transmitted through the fine patterns (auxiliary patterns) 554A and 554B, as may be seen from FIGS. 6 and 8. For this reason, i-ray beams scattering in the horizontal direction from the region immediately below the design pattern ($i_a$ and $i_c$) is cancelled by i-ray beam scattering in the horizontal direction from the region immediately below the auxiliary pattern ($i_b$ and $i_d$), and the contrast at the ends of the exposure region is improved thereby improving the resolution.

The aperture width of the auxiliary patterns 554A and 554B is made to be sufficiently narrow so that the light transmitted therethrough during a standard exposure is insufficient to expose the resist layer all the way to the bottom portions thereof. Hence, the auxiliary pattern will not be transferred onto the wafer when an exposure is made using the phase-shifting mask.

The methods described in conjunction with FIGS. 5 through 8 are proposed in Japanese Laid-Open Patent Applications No. 61-292643, No. 62-67514 and No. 62-18946.

However, conventional masks suffer from the following disadvantages.

First, in the case of masks which do not use phase shifting principles, it is difficult to form a pattern which is narrower than the wavelength of the light due to the physical resolution limits of the optical system. When an attempt is made to realize narrow line widths, it is necessary to make structural modifications such as by reducing the wavelength of the light or by increasing the numerical aperture. Accordingly, it is impossible to form fine patterns such as are desirable for future integrated circuits using an optical method.

Second, in the case of prior art masks which employ phase shifting, such pattern formation can only be applied to patterns such as so-called line-and-space patterns which have regularity and cannot be applied in the production of integrated circuits having various patterns. In addition, it is impossible to form a fine pattern because an opaque layer must always be provided.

Third, in the case of prior masks which use phase shifting, the auxiliary pattern must be patterned to a finer degree than the design pattern. For this reason, the fineness of the design pattern must be restricted so that the resolution limit of the auxiliary pattern is not exceeded.

Fourth, in the case of such masks which use phase shifting, the number of steps required to generate the pattern data is large because, in addition to the data related to the design pattern, it is necessary to generate the pattern data related to the auxiliary pattern, the pattern data related to the phase shift and the like.

Fifth, in the case of prior masks which utilize phase shifting, it is difficult to control the quality and thickness of the phase shifter material and this affects the refractive index when an organic resist material is used as the phase shifter. For this reason, it is difficult to form a uniform phase shift pattern having accurate phase shift qualities.

Sixth, in the case of prior masks which employ phase shifting, the phase shifter is made of a material that is different than the glass substrate. Thus, a reflection occurs at the boundary of the phase shifter and the glass substrate to thereby deteriorate the exposure efficiency.

SUMMARY OF THE INVENTION

Accordingly, it is a general object of the present invention to provide a novel and useful mask, a mask producing method and a pattern forming method in which the problems described above are eliminated.

Another and more specific object of the present invention is to provide a mask comprising a first layer which is transparent with respect to the light which is used for an exposure and a mask pattern layer which is formed on the first layer. At least a portion of the mask pattern layer is made up of a phase shift pattern which includes one or more phase shift regions adapted to transmit the light impinging thereon and shift the phase of the light transmitted through the phase shift pattern relative to the phase of the light transmitted through the first layer but does not impinge on the phase shift pattern. With the mask of the present invention, it is possible to form narrow patterns having widths which are narrower than would be possible using conventional masks and techniques.

Still another object of the present invention is to provide a mask comprising a first layer which is transparent with respect to an exposure light, an opaque layer covering a portion of said first layer and having an edge portion, and a phase shift pattern including a phase shift region on said first layer adjacent said edge portion, said phase shift region being adapted for transmitting exposure light impinging thereon and shifting the phase of the transmitted light relative to exposure light which does not impinge on the phase shaft region.

A further object of the present invention is to provide a method for producing a mask which comprises the steps of forming a pattern of a resist material on a first layer which is transparent with respect to an exposure light, forming a phase shift layer to a predetermined thickness on said resist pattern, and subsequently removing the resist pattern, said phase shift layer being made of a phase shift material that is capable, of transmitting exposure light impinging thereon and shifting the phase of the transmitted light relative to exposure light which does not impinge on the phase shift layer.

Another object of the present invention is to provide a method for producing a mask comprising the steps of forming a stopper layer on a first layer which is transparent with respect to an exposure light, forming a phase shift layer to a predetermined thickness on said stopper layer, forming a pattern of a resist material on said phase shift layer, and etching said phase shift layer using said stopper layer as an etching stopper and said resist pattern as an etching mask, said phase shift layer being made of a phase shift material capable of transmitting exposure light impinging thereon and shifting the phase of the transmitted light relative to exposure light which does not impinge on the phase shift layer.

Still another object of the present invention is to provide a method for producing a mask which comprises the steps of providing a first layer which is transparent with respect to an exposure light, forming an opaque layer so as to cover a portion of said first layer and present an edge portion of the opaque layer, forming a second phase shift layer to a predetermined thickness on said resist pattern, and removing said resist pattern in such a manner that a region of the phase shift pattern remains on said first layer adjacent said edge portion of the opaque layer, said phase shift layers each being made up of a phase shift material that is capable of transmitting exposure light impinging thereon and shifting the phase of the transmitted light relative to exposure light which does not impinge on the phase shift layer.

A further object of the present invention is to provide a mask producing method comprising the steps of providing a first layer which is transparent with respect to an exposure light, forming an opaque layer so as to cover a portion of said first layer and present an edge portion, forming a stopper layer on said opaque layer, forming a phase shift layer to a predetermined thickness on said stopper layer, forming a pattern of a resist material on said phase shift layer, and etching said phase shift layer using said stopper layer as an etching stopper and said resist pattern as an etching mask so that a region of the phase shift layer remains on said stopper layer adjacent said edge portion of the opaque layer, said phase shift layer being made up of a phase shift material capable of transmitting exposure light impinging thereon and shifting the phase of the transmitted light relative to exposure light which does not impinge on the phase shift layer.

Another object of the present invention is to provide a mask producing method comprising the steps of providing a first layer which is transparent with respect to an exposure light, forming an opaque layer so as to cover a portion of said portion of Said first layer and prevent an edge portion of the opaque layer, forming a pattern of a resist material on said opaque layer, and forming a phase shift region adjacent said edge portion of the opaque layer by etching the first layer to a predetermined thickness using said resist pattern as an etching mask, said phase shift region being adapted, as a result of being etched to said thickness for transmitting exposure light impinging thereon and shifting the phase of the transmitted light relative to exposure light which passes through the first layer but does not impinge on the phase shift region.

Still another object of the present invention is to provide a mask producing method comprising the steps of providing a first layer which is transparent with respect to an exposure light, forming an opaque layer so as to cover a portion of said first layer and present an edge portion of said opaque layer, forming a phase shift region adjacent said edge portion by etching said first layer to predetermined thickness using said opaque layer as an etching mask, forming a pattern of a resist material on a selected portion of said opaque layer, and etching unmasked portions of the opaque layer, said phase shift region being adapted, as a result of being etched to said thickness, for transmitting exposure light impinging thereon and shifting the phase of the transmitted light relative to exposure light which passes through the first layer but does not impinge on the phase shift region.

Another object of the present invention is to provide a mask producing method comprising the steps of providing a first layer which is transparent with respect to an exposure light, forming an opaque layer on portions of one side of said first layer, etching said first layer to a predetermined thickness using said opaque layer as a mask, forming a resist layer on said opaque layer, exposing said resist layer from the opposite side of said first layer so as to develop said resist layer into a resist pattern, removing a portion of said opaque layer by side etching to present an edge portion, and removing said resist pattern to uncover a phase shift region on said first layer adjacent said edge portion, said phase shift region having a different thickness than the remaining areas of the first layer and being adapted to transmit exposure light impinging thereon and shift the phase of the transmitted light relative to exposure light which passes through said remaining areas but does not impinge on the phase shift region.

Still another object of the present invention is to provide a mask producing method comprising the steps of providing a first layer which is transparent with respect to an exposure light, forming an opaque layer on portions of one side of said first layer, etching said first layer to a predetermined thickness using said opaque layer as a mask, forming a resist layer on said opaque layer, exposing said resist layer from the opposite side of said first layer so as to develop said resist layer with a resist pattern and expose a portion of said opaque layer, and removing the exposed portion of said opaque layer to present an edge portion and uncover a phase shift region on said first layer adjacent said edge portion, said phase shift region having a different thickness than the remaining areas of said first area of said first layer and being adapted for transmitting exposure light impinging thereon and shifting the phase of the transmitted light relative to exposure light which passes through said remaining areas but does not impinge on the phase shift region.

A further object of the present invention is to provide a pattern forming method comprising the steps of illuminating a mask with a light from a light source whereby a portion of the light is transmitted through the mask, imaging the light transmitted through the mask onto a photoresist layer on a wafer using a lens system so as to expose a pattern on the layer, and developing the exposed pattern. The mask used in accordance with this aspect of the invention comprises a first layer which is transparent with respect to the exposure light and a mask pattern layer on the first layer. At least a portion of the mask pattern layer comprises a phase shift region adapted for transmitting light and shifting the phase of the transmitted light, whereby interference occurs between light transmitted through said region and light transmitted to other portions of the mask pattern layer.

Another object of the present invention is to provide a pattern forming method comprising the steps of illuminating a mask with a light from a light source whereby a portion of the light is transmitted through the mask, imaging the light transmitted through the mask onto a photoresist layer on a wafer using a lens system so as to expose a pattern on the layer, and developing the exposed pattern. The mask utilized in this form of the invention comprises a first layer which is transparent with respect to said exposure light, an opaque layer covering a portion of said first layer and having an edge portion, and a phase shift region formed adjacent said edge portion of the opaque layer. The opaque layer and the phase shift layer region present a mask pattern on the first layer, and the phase shift region is adapted for transmitting light and shifting the phase of the transmitted light, whereby interference occurs between light transmitted through the phase shift and light transmitted through other portions of the first layer.

Other objects and further features of the present invention will be apparent from the following detailed description when read in conjunction with the accompanying drawings.

BRIEF DESCRIPTION OF THE DRAWINGS

FIG. 5A through 5D are cross-sectional views for explaining a method of producing a conventional mask which has a phase shift layer and uses a negative resist;

FIG. 6 shows the phase profile of the light transmitted through the mask shown in FIG. 5D;

FIGS. 31A and 31B are diagrams for explaining the formation of a black pattern on a white background;

FIGS. 33A and 33B are diagrams for explaining the case where the second embodiment of the mask is applied to the formation of the integrated circuit pattern;

FIGS. 34A through 34C are diagrams showing respective portions of the integrated circuit pattern shown in FIGS. 33A and 33B;

DESCRIPTION OF THE PREFERRED EMBODIMENTS

Figure 9:
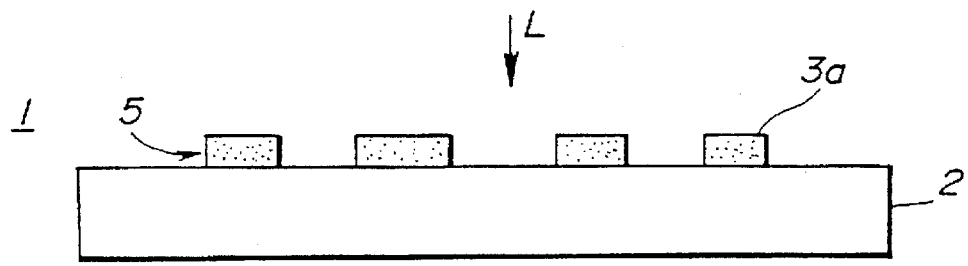
FIG. 9 is a cross-sectional view showing a first embodiment of a mask according to the present invention.

A first embodiment of a mask according to the present invention is illustrated in FIG. 9. In FIG. 9, a mask 1 comprises a transparent substrate 2 which is transparent with respect to a light L which is used for the exposure, and a mask pattern layer 5 which is formed on the transparent substrate 2. At least one portion of the mask pattern layer 5 is made up solely of a phase shift region 3a. The light L can be transmitted through the phase shift layer at region 3a.

The phase of the light which is transmitted through the phase shift region 3a is shifted relative to the phase of the light which is transmitted through only the transparent substrate 2. Accordingly, an interference occurs and the light intensity decreases at the boundary of the light which is transmitted through only the transmitted substrate 2 and the light Which is transmitted through the phase shift region 3a. For this reason, it is possible to form on a wafer (not shown) an interference pattern which is smaller than the wavelength of the light L which is used for the exposure. In addition, it is possible to adjust the degree to which the phase of the light is shifted and improve the resolution of the exposure pattern by adjusting the thickness of the mask pattern layer 5.

Figure 10A:
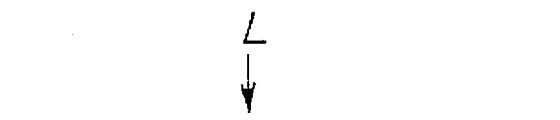
FIGS. 10A through 10C are diagrams for explaining the light intensity at one edge portion of a phase shift layer of the mask of FIG. 9.
Figure 10B:
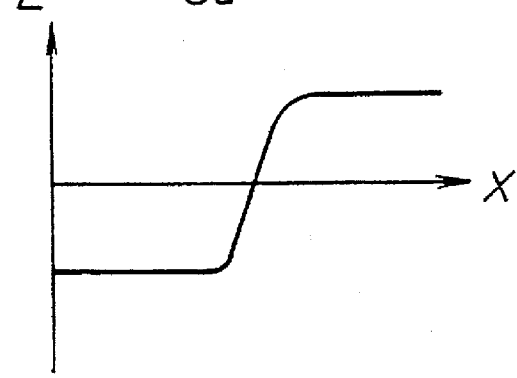
Figure 10C:
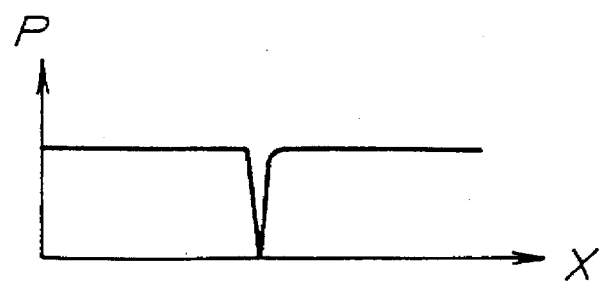

FIGS. 10A through 10C are diagrams for explaining the light intensity at one edge portion of the phase shift region 3a of the mask 1. In FIG. 10A, the phase of the light transmitted through the transparent substrate 2 and the phase shift region 3a is shifted by approximately 180° with respect to the light transmitted through only the transparent substrate 2. Hence, the electrical vector E and the light intensity P of the light transmitted through the mask 1 respectively are as shown in FIGS. 10B and 10C. As may be seen from FIG. 10C, it is possible to expose a light pattern by using the light intensity change at the edge portion of the phase shift region 3a.

Figure 11A:
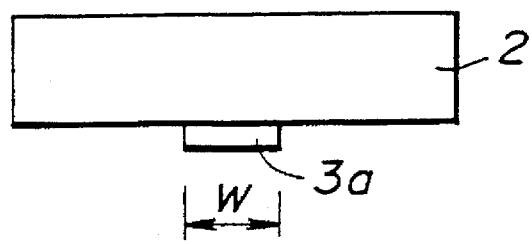
FIGS. 11A through 11C are diagrams for explaining the light intensity at two edge portions of the phase shift layer of the mask of FIG. 9.
Figure 11B:
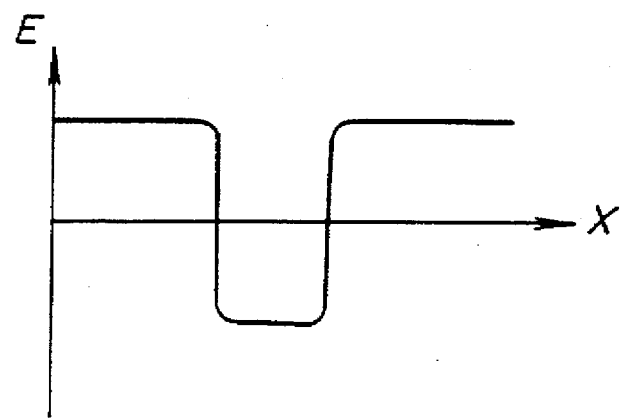
Figure 11C:
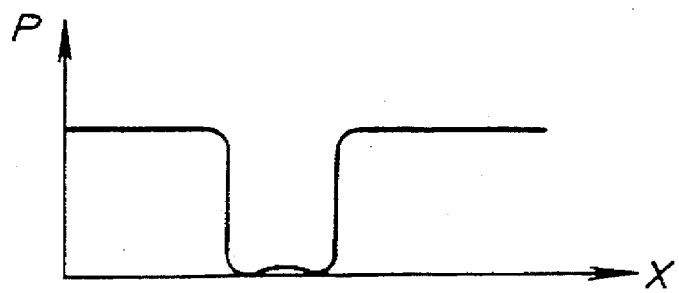

FIGS. 11A through 11C are diagrams for explaining the light intensity at two different edge portions of the phase shift region 3a of the mask 1. In FIGS. 11A through 11C, parts which are the same as corresponding parts in FIGS. 10A through 10C are designated by the same reference numerals, and a description thereof is omitted. In this case, the light intensity P of the light transmitted through the mask 1 is as shown in FIG. 11C when the width W of the phase shift region 3a is sufficiently small. Thus, it is possible to control the width of the line pattern by controlling the width W.

Figure 12:
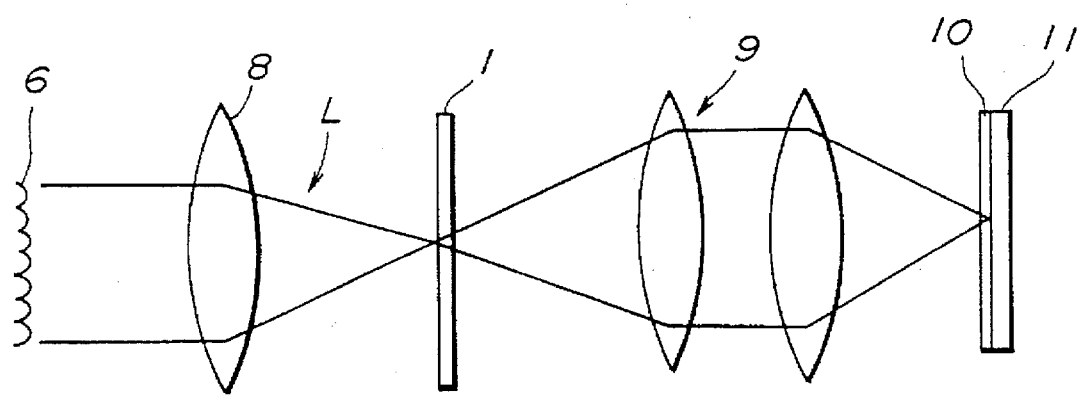
FIG. 12 generally shows an optical system which is used for making an exposure using a first embodiment of the mask.

FIG. 12 generally shows an optical system which is used for making an exposure using the mask 1. For example, a light source 6 is made up of a mercury lamp which is provided with a filter (not shown) for passing only i-rays having a wavelength of 365 nm. The light from the light source 6 passes through an illumination lens system 8 and reaches the mask I as the light L. The mask 1 is positioned at the focal distance of the lens system 8. The partial coherency σ of the light L in this embodiment is 0.5, but the partial coherency σ may be selected within a range such that $0.3 \leq \sigma \leq 0.7$.

The light transmitted through the mask 1 is imaged wafer 11 coated with a photoresist layer 10 via an imaging lens system 9. The imaging lens system 9 includes a ⅕ reduction lens and has a numerical aperture NA of 0.5. The wafer 11 is maintained in a flat position by a chuck (not shown).

Figure 13:
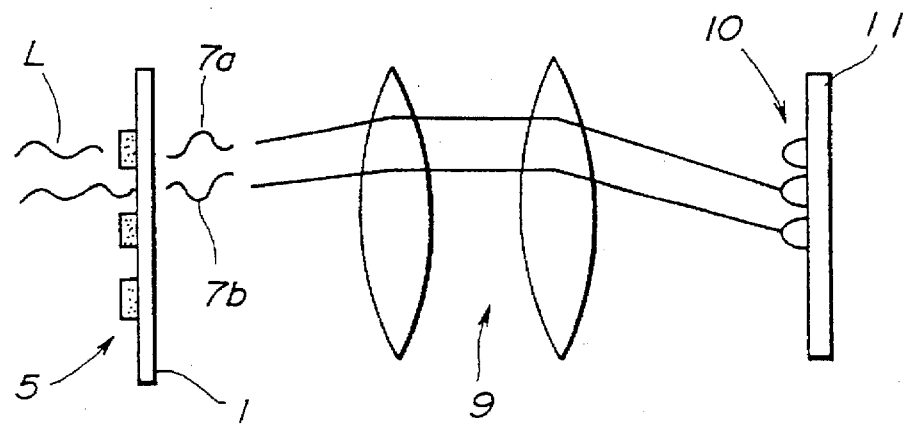
FIG. 13 is a diagram for explaining a first embodiment of a pattern forming method according to the present invention.

A first embodiment of a pattern forming method according to the present invention is illustrated in FIG. 13 which shows the exposure state produced in FIG. 12 using a mask of the present invention. The light which passes through the illumination lens system 8 shown in FIG. 12 is transmitted through the mask 1 in FIG. 13, and the light which is transmitted through the mask 1 is divided into light portion 7a which has been transmitted through the phase shift region 3a of mask pattern layer 5 of the mask and light portion 7b which has been transmitted through a portion of the mask 1 not provided with the mask pattern layer 5. The phase of light portion 7a differs by 180° with respect to the phase of light portion 7b.

Light portions 7a and 7b are imaged on the layer 10 on the wafer 11 via the imaging lens system 9. A sharp light intensity change occurs at the edges of the light portions corresponding to the edge portion of the phase shift region 3a due to interference. Hence, it is possible to form a pattern on wafer 11 which is smaller than the wavelength of the light used for the exposure.

First and second embodiments of mask producing methods according to the present invention are illustrated in FIGS. 14 and 15. In FIGS. 14 and 15, parts which are essentially the same as corresponding parts in FIG. 9 are designated by the same reference numerals.

Figure 14A:
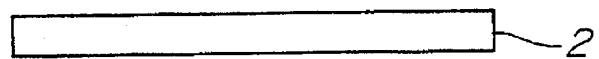
FIGS. 14A through 14E are cross-sectional views for explaining a first embodiment of a mask producing method according to the present invention.
Figure 14B:
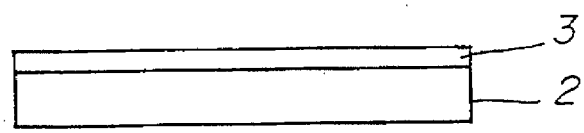
Figure 14C:
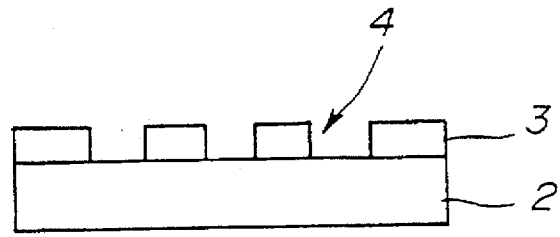
Figure 14D:
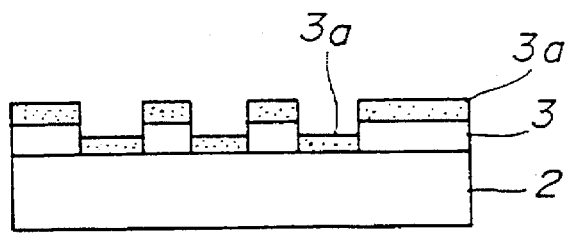
Figure 14E:
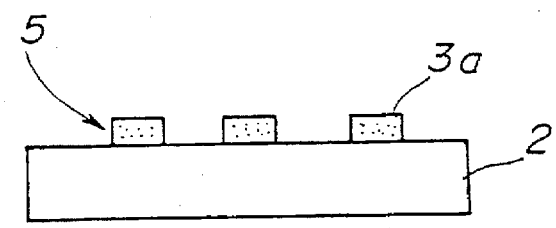

In FIG. 14A, the transparent substrate 2 is made of a material such as quartz or glass which transmits i-ray light. A resist material 3 is formed on the transparent substrate 2 as shown in FIG. 14B. A resist such as an electron beam (EB) resist or a photoresist is used as the resist material 3. When an EB resist is used as the resist material 3, a resist pattern 4 as shown in FIG. 14C is formed by drawing with the electron beam and then carrying out a developing process. Then, a film of silicon oxide phase shift material 3a is sputtered onto the surface of the resist pattern 4 as shown in FIG. 14D to a thickness of 0.388 μm. Thereafter, the EB resist is removed using a resist removal agent so that a mask pattern layer 5 of phase shift regions (silicon oxide layer) 3a is formed on the transparent substrate 2 as shown in FIG. 14E.

Figure 15A:
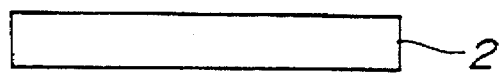
FIGS. 15A through 15F are cross-sectional views for explaining a second embodiment of a mask producing method according to the present invention.
Figure 15B:
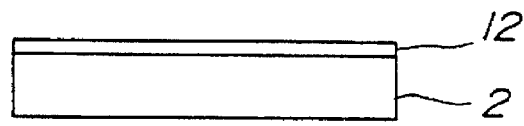
Figure 15C:
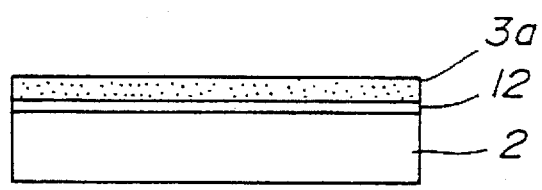
Figure 15D:
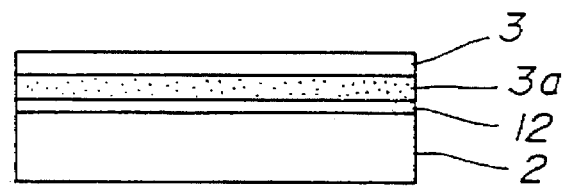
Figure 15E:
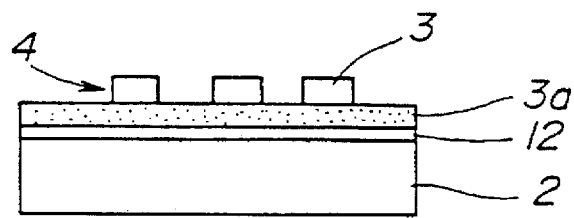
Figure 15F:
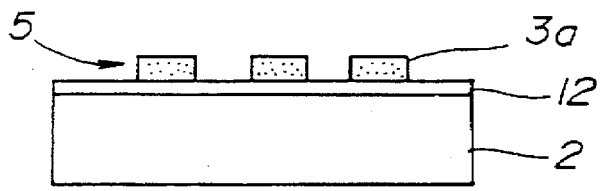

In the embodiment shown in FIGS. 15A through 15F, the transparent substrate 2 shown in FIG. 15A is the same as that of FIG. 14A; however, a thin aluminum oxide film 12 is first formed on the transparent substrate 2 as shown in FIG. 15B. As shown in FIG. 15C, a film of silicon oxide phase shift material 3a is sputtered onto the thin film 12 to a thickness of 0.388 μm. Furthermore, the resist material 3 is then formed on the phase shift layer 3a as shown in FIG. 15D. A resist pattern 4 as shown in FIG. 15E is formed by drawing with an electron beam and then carrying out a developing process. Thereafter, plasma etching or reactive ion etching (RIE) is carried out on the phase shift layer 3a using a $CF_4$ gas. The resist material 3 is removed by ashing with an oxygen plasma, and thus a mask pattern 5 of phase shift regions (silicon oxide layer) 3a is formed as shown in FIG. 15F. Because it is not etched by the $CF_4$ gas, the thin film 12 acts as an etching stopper. Thus it is possible to obtain a mask pattern 5 which is made up of phase shift regions 3a that have been accurately formed so as to have a thickness of 0.388 μm.

The thickness of the phase shift layer 3a is set at 0.388 μm for the purpose of shifting the phase of i-ray light by 180°, that is, of inverting the phase. The phase shifting ability and the corresponding thickness of the phase shift layer 3a can be described in the following general formula (2), wherein n denotes the refractive index of the phase shift layer 3a, λ denotes the wavelength of the light (L) used, S represents the expression (phase shift quantity in radians)/2π (or ½ when inverting the phase), and t denotes the thickness of the phase shift layer 3a.

$$(n \cdot t/\lambda) - (t/\lambda) = S \quad (2)$$

In the embodiments shown in FIGS. 14 and 15, the refractive index n of the phase shift layer 3a is 1.47, the wavelength λ of the light L used is 0.365 nm, and the phase shift quantity S is ½. Hence, the general formula (2) can be rewritten as the following formula (3).

$$(1.47 t/0.365) - (t/0.365) = ½ \quad (3)$$

Therefore, the thickness t of the phase shift layer 3a is calculated as 0.388 μm from the formula (3). The phase shift quantity S is set at ½ (180°) in these embodiments because 180° is an optimum phase shift quantity for forming a pattern using phase interference.

Figure 16:
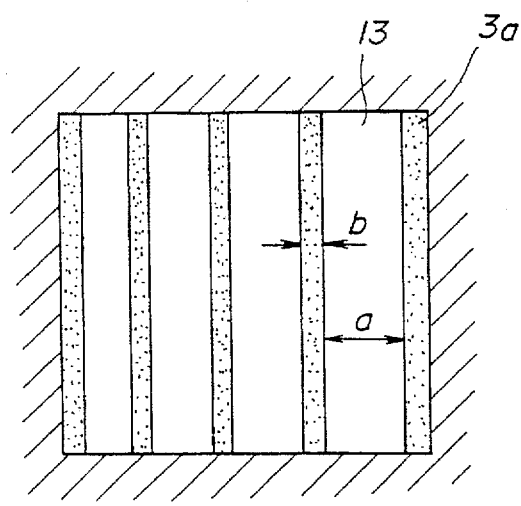
FIG. 16 is a plan view showing a mask pattern.

FIG. 16 shows a plan view of a mask pattern 5 for the mask 1 which has been produced in the above described manner. When forming a line-and-space pattern with a resolution limit of 0.35 μm using a ⅕ reduction lens system, a light intensity pattern as shown in FIG. 17B can be obtained on the wafer 11 when the width b of phase shift region 3a (FIG. 16) is set at 0.15 μm (reticle size of 0.75 μm) and the width a of region 13 which has no phase shift layer thereon is set at 0.55 μm (reticle size of 2.75 μm).

Figure 1:
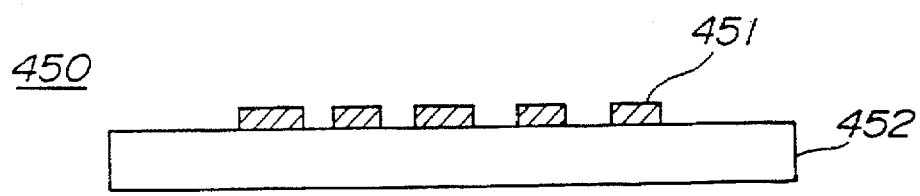
FIG. 1 is a cross-sectional view showing a conventional mask provided with an opaque layer.
Figure 2:
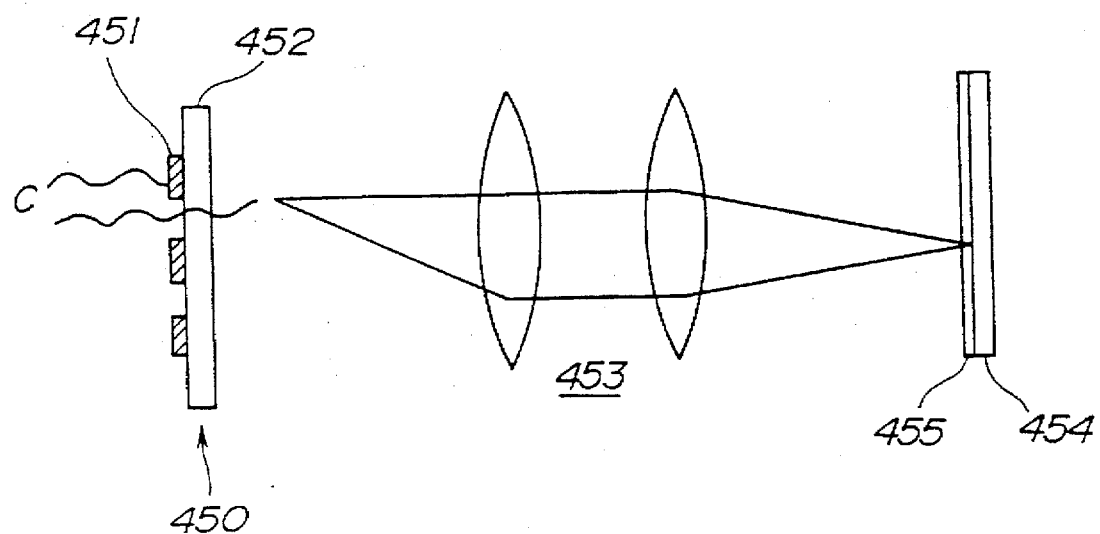
FIG. 2 generally shows an optical system which forms a pattern using the mask shown in FIG. 1.
Figure 3A:
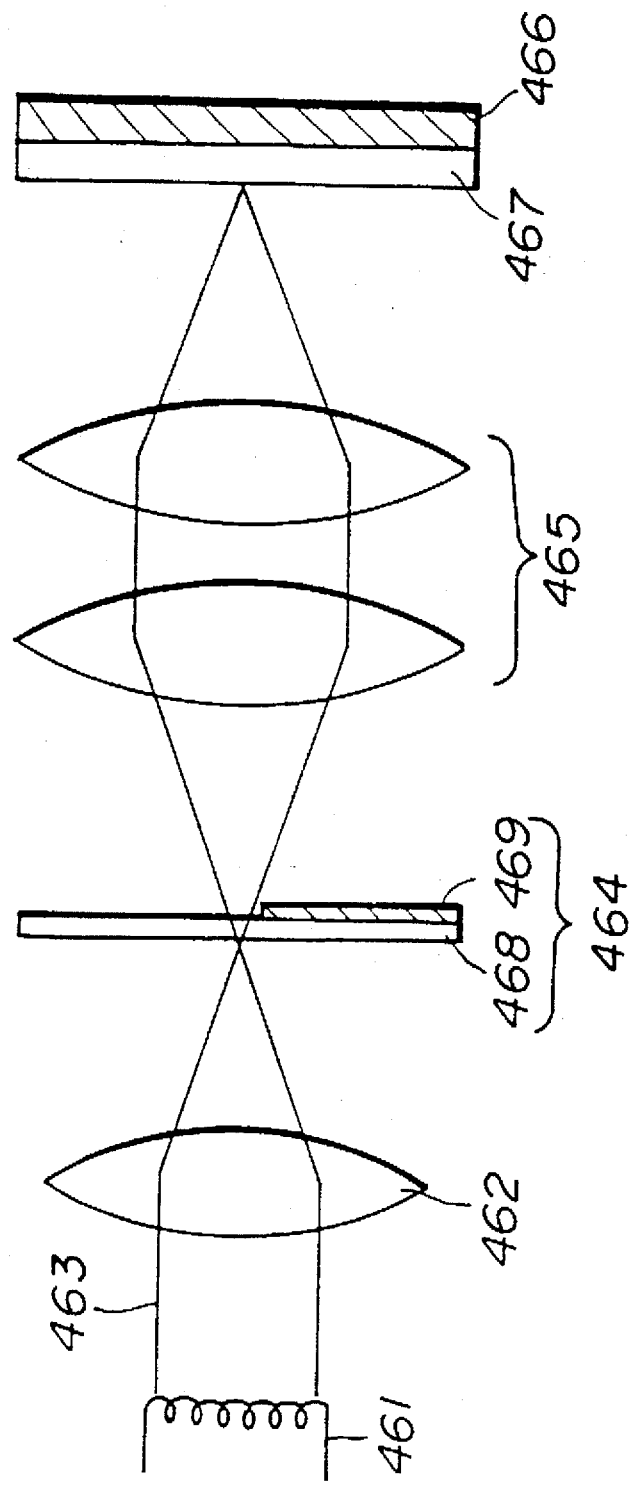
FIGS. 3A through 3D are diagrams for explaining a conventional pattern forming method.
Figure 3B:
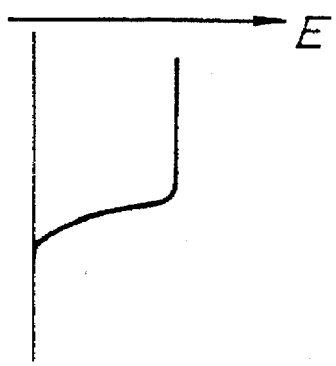
Figure 3C:
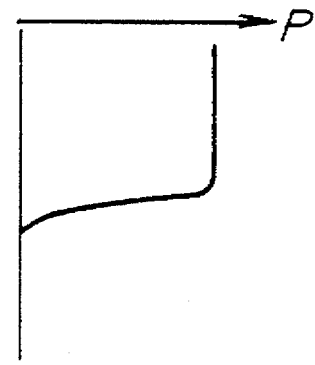
Figure 3D:
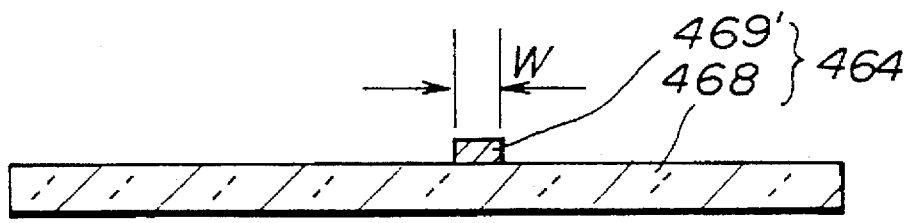
Figure 4:
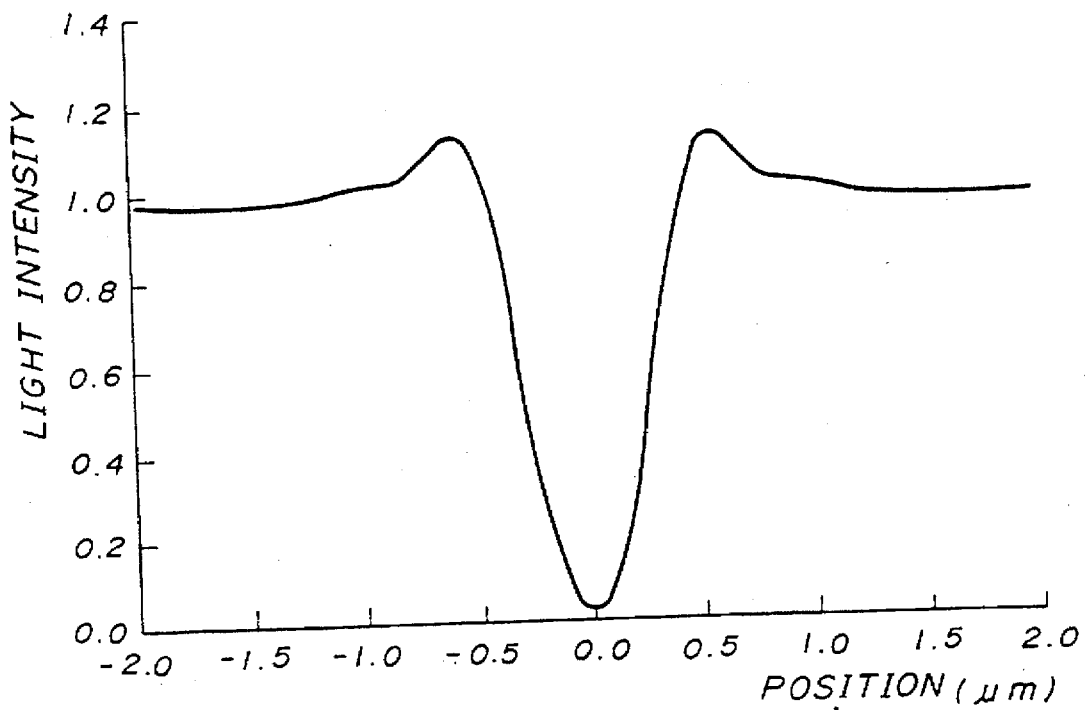
FIGS. 4A through 4D show light intensity distributional curves of prior art devices.
Figure 4:
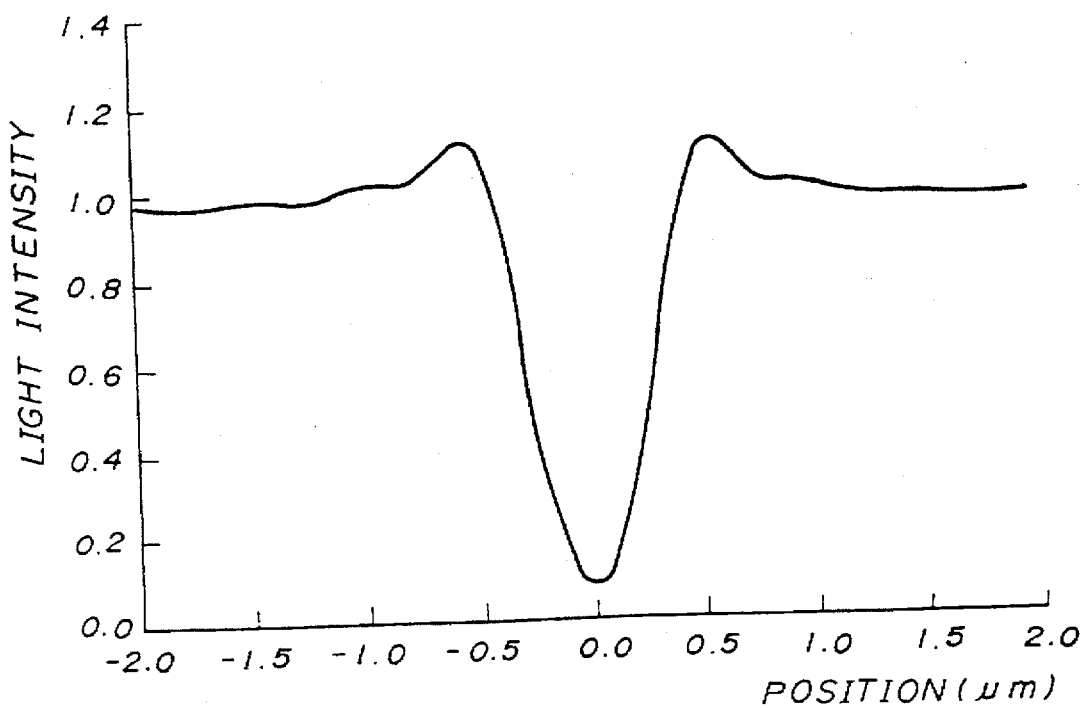
Figure 4C:
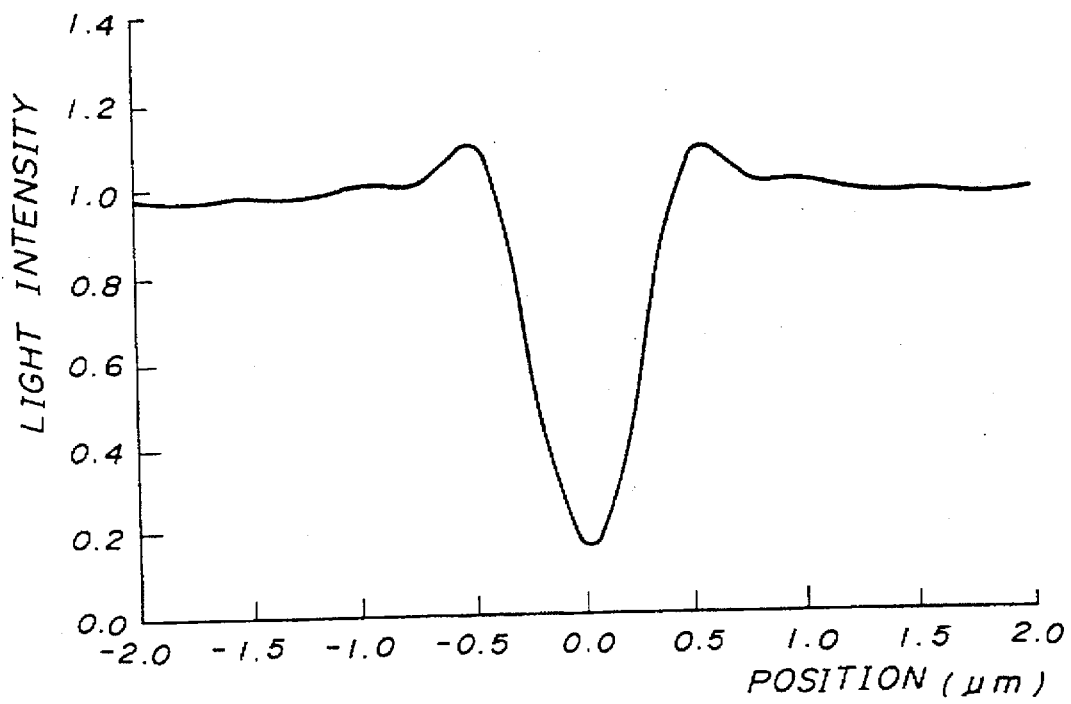
Figure 4D:
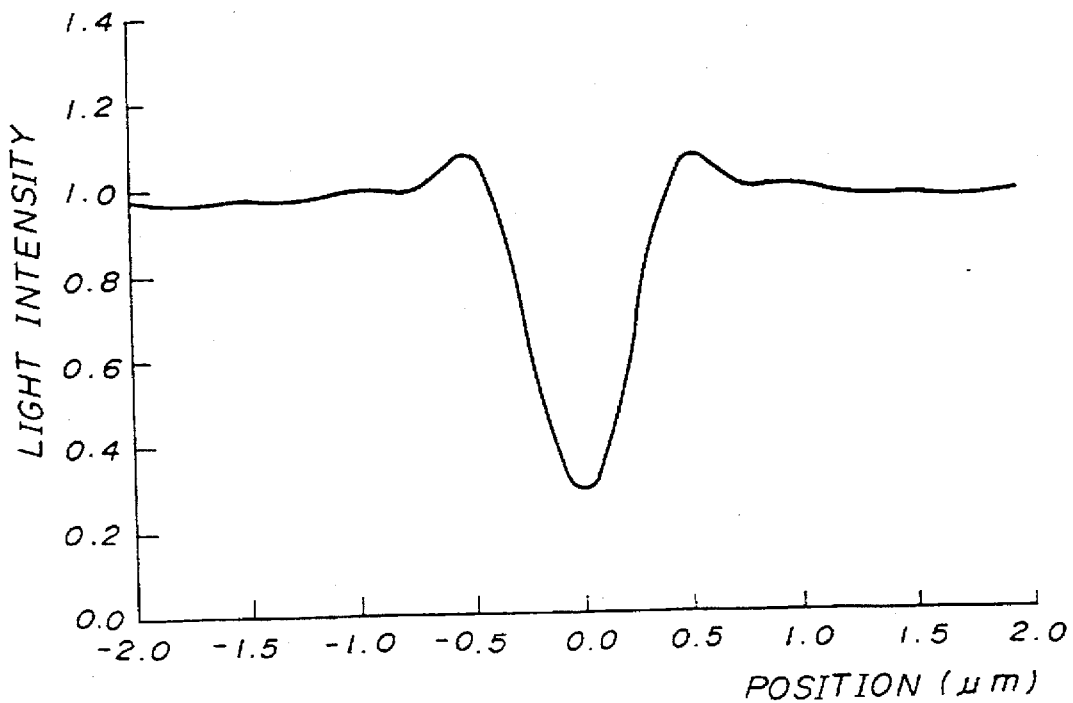
Figure 7:
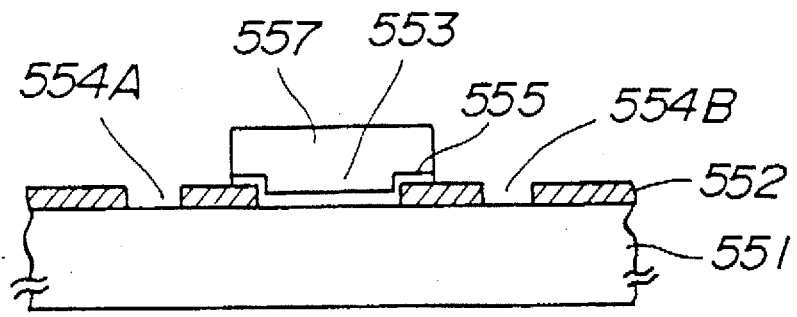
FIG. 7 is a cross-sectional view for explaining a method of producing a conventional mask which has a phase shift layer and uses a positive resist.
Figure 8:
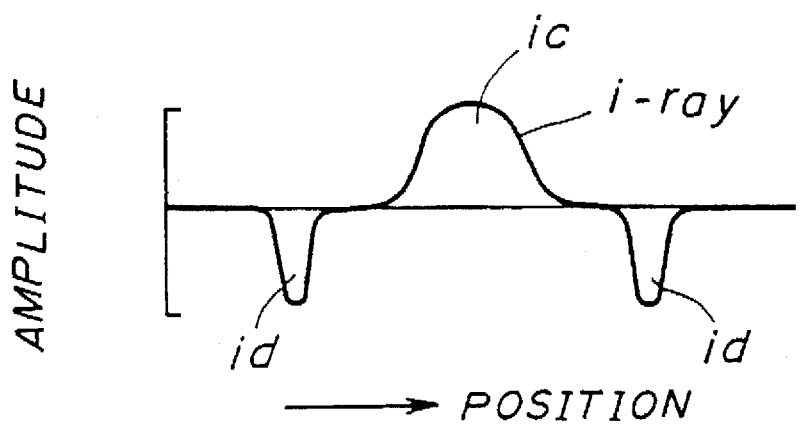
FIG. 8 shows the phase profile of the light transmitted through the mask shown in FIG. 7.
Figure 17A:
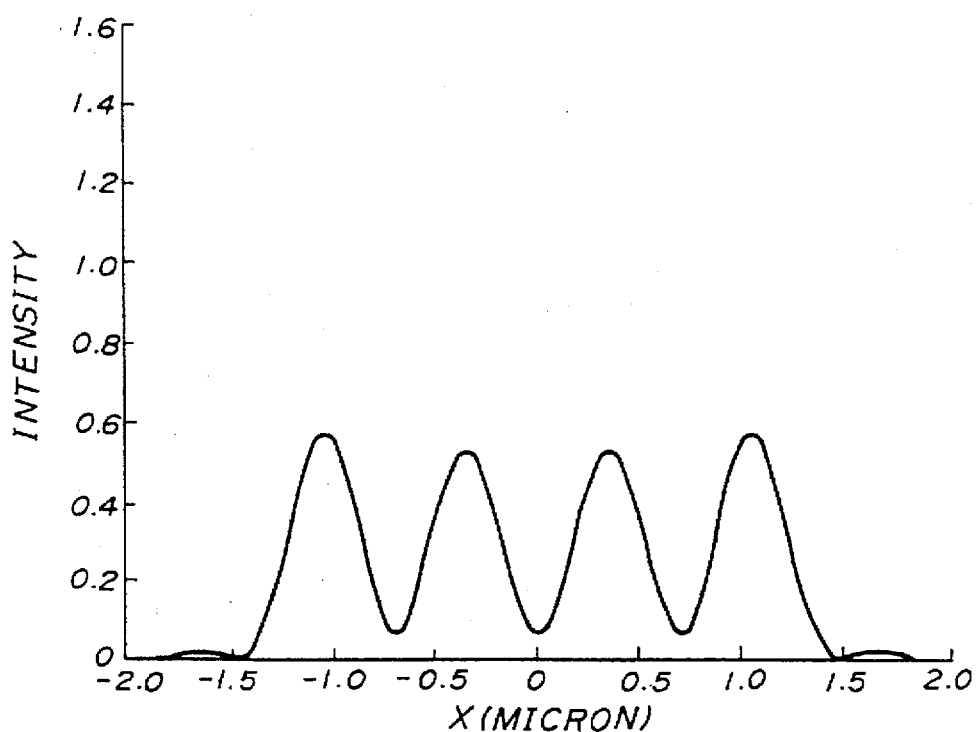
FIGS. 17A and 17B are diagrams for explaining the difference between the light intensity distribution patterns developed using the masks of FIG. 1 and FIG. 16.
Figure 17B:
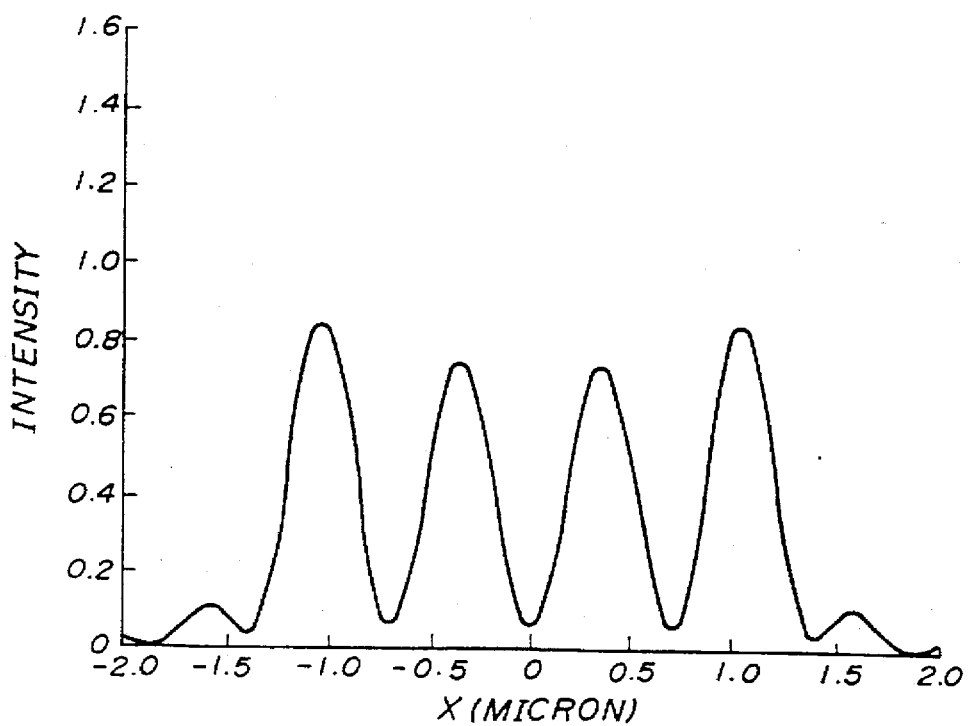

FIGS. 17A and 17B provide a comparison between the light intensity patterns provided by the conventional mask of FIG. 1 and a mask of the present invention. For the sake of convenience, it is assumed that the opaque layer 451 shown in FIG. 1 is made of Cr and has a thickness in the range of 50 to 80 nm and a width of 0.35 μm (reticle size of 1.75 μm) for the conventional method. In addition, it is assumed that the interval of the opaque pattern is set at 0.35 μm (reticle size of 1.75 μm) for the conventional method. As shown in FIG. 17A, the light intensity is approximately 50% according to the conventional method, and it is evident that the contrast is poor. In this state, it is possible to form a pattern on the photoresist layer 455 on the wafer 454 in FIG. 2. But on the other hand, in the above described embodiments of the invention, the light intensity is approximately 80% on the wafer 11 as shown in FIG. 17B. Accordingly, the light intensity is greatly improved. In addition, the contrast (resolution) is greatly improved because there is no change in intensity at the dark portions of the curve.

Figure 18A:
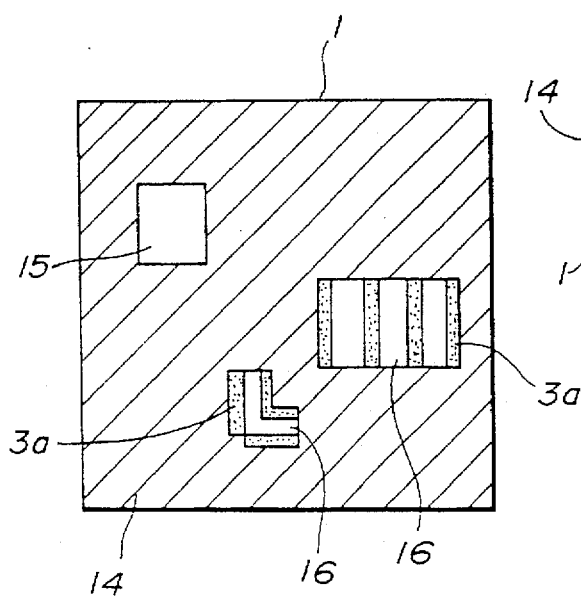
FIGS. 18A through 18C are diagrams for explaining a second embodiment of a pattern forming method according to the present invention.
Figure 18B:
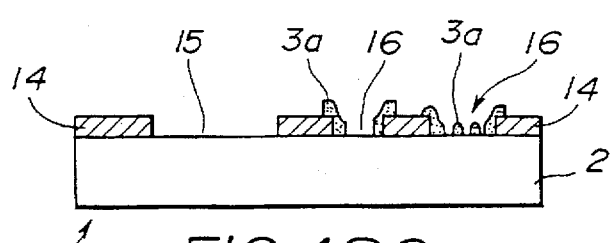
Figure 18C:
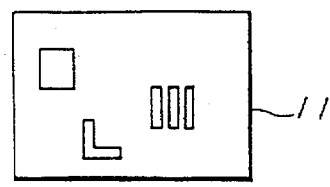

A second embodiment of the pattern forming method according to the present invention is illustrated in FIGS. 18A and 18B. FIGS. 18A and 18B respectively are a plan view and a cross-sectional view showing a mask 1 which is used for forming a pattern on a wafer where large and fine patterns coexist in the pattern. An opaque chromium layer 14 having a thickness of 50 to 80 nm is indicated by hatching. In addition, an exposed portion of the transparent substrate 2 is indicated by a white background. The exposed portion is divided into a large pattern region 15 and fine pattern regions 16. The phase shift layer 3a is formed within the fine pattern regions 16. The large pattern region 15 is patterned using a conventional method, while the fine pattern regions 16 are formed using the phase shift layer 3a. Large patterns and fine patterns usually coexist in an integrated circuit. Hence, this embodiment is especially suited for patterning integrated circuits. FIG. 18C shows a pattern which is imaged on the wafer 11 using the mask shown in FIGS. 18A and 18B. According to this embodiment, it is possible to form the pattern with a small number of steps even when the pattern includes fine patterns, and it is possible to sufficiently improve the resolution.

Figure 19:
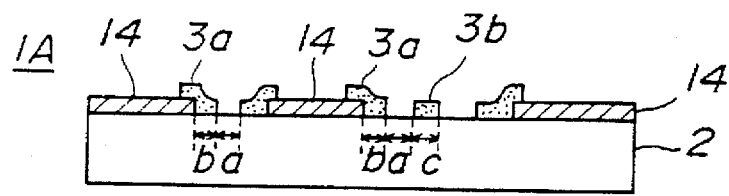
FIG. 19 is a cross-sectional view showing a second embodiment of a mask according to the present invention.

A second embodiment of a mask according to the present invention is illustrated in FIG. 19. The mask 1A shown in FIG. 19 comprises a transparent substrate 2, an opaque layer 14 which is formed on the transparent substrate 2, and a phase shift layer 3a which is formed at the edge portions of the opaque layer 14. For example, the opaque layer 14 is made of Cr and is formed to a thickness of 50 to 80 nm. For the sake of convenience, it is assumed that a single fine pattern is located at the left hand part of the transparent substrate 2 in FIG. 19 and a pair of adjacent fine patterns are located at the right hand part of the transparent substrate 2. In addition, a pattern 3b for forming the fine pattern is made up solely of a phase shift layer 3a. This pattern 3b is transferred onto the wafer 11 by the interference caused by the phase shifter, as will be described later in the specification. Distances a, b and c shown in FIG. 19 will also be described later in the specification.

Figure 20A:
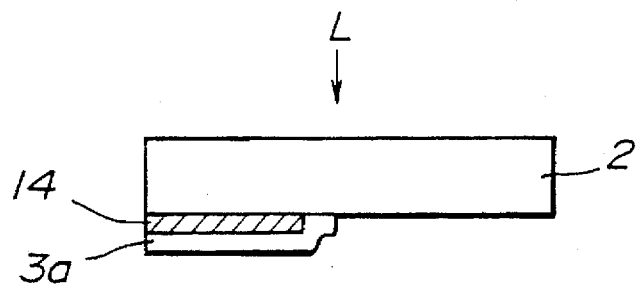
FIGS. 20A and 20B are diagrams for explaining the light intensity at one edge portion of the phase shift layer of the mask of FIG. 19.
Figure 20B:
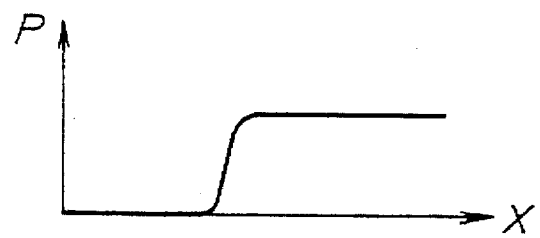

FIGS. 20A and 20B are diagrams for explaining the light intensity at the edge portion of the phase shift layer 3a of the mask 1A. In FIG. 20A, the phase of the light transmitted through the transparent substrate 2 and the phase shift layer 3a is shifted approximately 180° relative to the phase of light transmitted only through the transparent substrate 2. Hence, the light intensity P of the light transmitted through the mask 1A is as shown in FIG. 20B. As may be seen from FIG. 20B, it is possible to expose a line pattern using the light intensity change at the edge portion of the phase shift layer 3a.

Figure 21A:
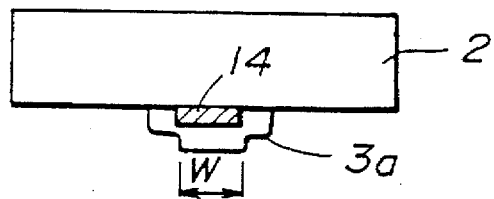
FIGS. 21A and 21B are diagrams for explaining the light intensity at two edge portions oft he phase shift layer of the mask of FIG. 19.
Figure 21B:
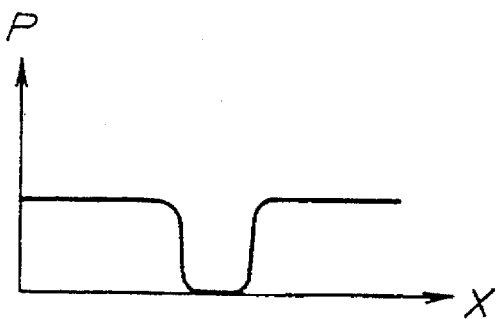

FIGS. 21A and 21B are diagrams for explaining the light intensity at two spaced edge portions of the phase shift layer 3a of the mask 1A. In FIGS. 21A and 21B, parts which are the same as corresponding parts in FIGS. 20A and 20B are designated by the same reference numerals, and a description thereof will be omitted. In this case, the light intensity P of the light transmitted through the mask 1A is as shown in FIG. 21B. Thus, it is possible to control the width of the line pattern by controlling the width W.

Figure 22:
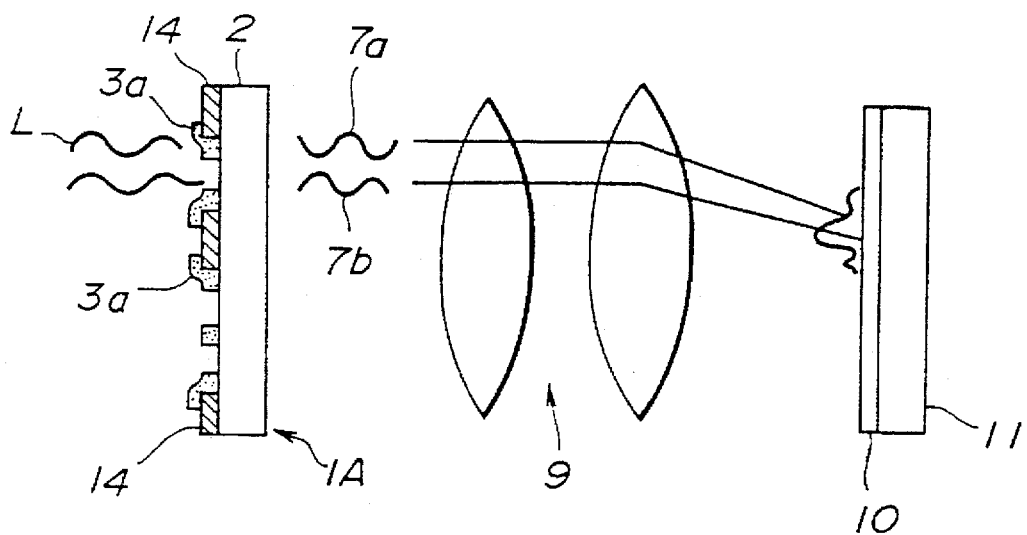
FIG. 22 is a diagram for explaining a third embodiment of a pattern forming method according to the present invention.

A third embodiment of a pattern forming method according to the present invention is illustrated in FIG. 22 which generally shows an optical system which uses the mask 1A for the exposure. In FIG. 22, parts which are essentially the same as corresponding parts in FIG. 13 are designated by the same reference numerals, and a description thereof will be omitted.

In FIG. 22, the light L which originates from the light source 6 and reaches the mask 1A via the illumination lens system 8 is blocked by the opaque layer 14. The phase of the light portion 7a transmitted through the phase shift layer 3a is shifted and is inverted with respect to the phase of the light portion 7b which is transmitted only through the transparent substrate 2. The light portions 7a and 7b are imaged on the photoresist layer 10 on the wafer 11 via the imaging lens system 9. In this case, the adjacent edges of the light portions 7a and 7b mutually interfere and a sharp light intensity change occurs. Accordingly, it is possible to improve the light contrast at the boundary between the transparent portion of the mask 1A which has no opaque layer 14 and the opaque portion which is covered by the opaque layer 14. The conditions of the optical system shown in FIG. 22 are the same as those of the optical system shown in FIG. 13. Thus, the thickness of the phase shift layer 3a is 0.388 µm and the phase shift quantity is therefore 180° based on the formula (3).

The effects obtained by forming the phase shift layer 3a at the edge portion of the opaque layer 14 are illustrated with reference to FIGS. 23 through 26.

Figure 23A:
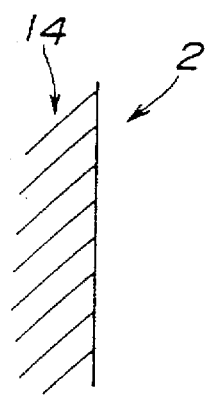
FIGS. 23A and 23B are diagrams for explaining the illumination pattern of the mask of FIG. 19.
Figure 23B:
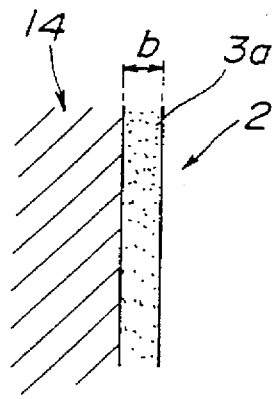
Figure 24A:
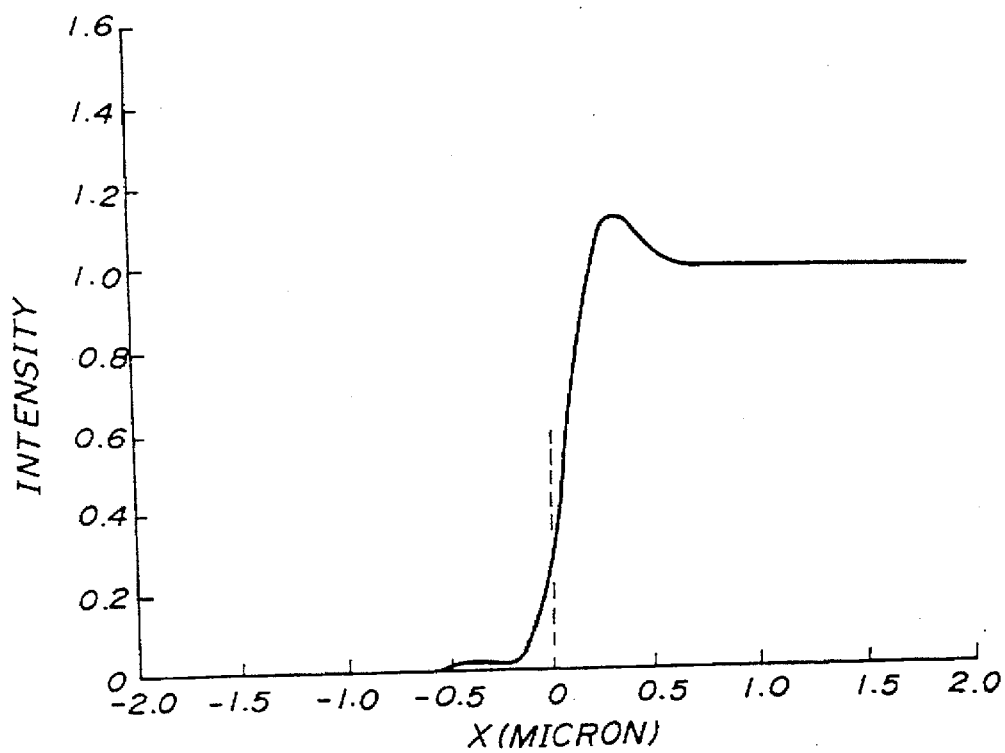
FIGS. 24A and 24B are respective diagrams for explaining the light intensity distribution patterns which correspond with the patterns of FIGS. 23A and 23B.
Figure 24B:
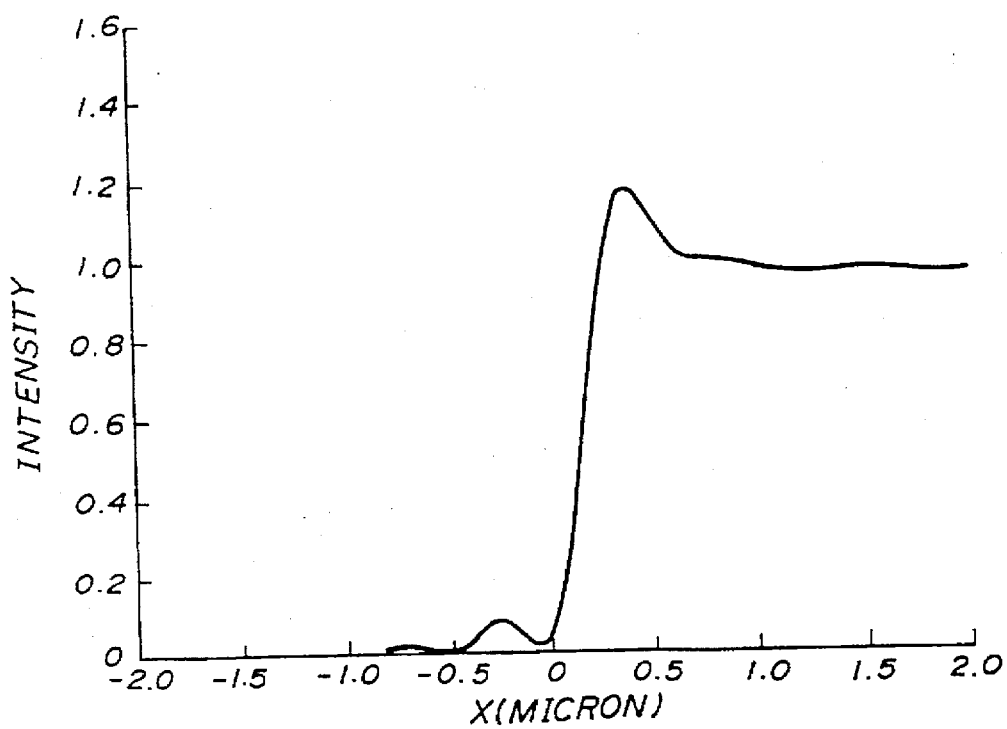

FIG. 23A shows a case where no phase shift layer 3a is provided at the edge portion of the opaque layer 14, and FIG. 23B shows a case where a phase shift layer 3a having a width b of 0.15 µm is provided at the edge portion of the opaque layer 14. FIGS. 24A and 24B respectively show the light intensity distributions for the cases shown in in FIGS. 23A and 23B. In FIG. 24B it can be seen that the light intensity changes sharply at the edge portion of the phase shift layer 3a, which is graphically represented by the 0 point on the x-axis. In other words, it can be seen from FIG. 24B that the capability of forming a fine pattern is very good in this case. In the illustrated case, the boundary between the phase shift layer 3a and the exposed portion of the transparent substrate 2 is 0.0 µm on the x-axis. Thus, when the boundary between the opaque layer 14 and the phase shift layer 3a is assumed to be −0.15 µm on the x-axis, the boundary between the black and white portions of the pattern becomes +0.1 µm from FIG. 24B.

When the light used for the exposure is an i-ray beam having a wavelength of 365 nm and the numerical aperture NA of the lens system is 0.5, it is possible to form a resist pattern to a predetermined design dimension when the exposed portion of the transparent substrate 2 is 0.2 µm (0.1 µm on each side) larger than the design dimension and the phase shift layer 3a has a width of 0.15 µm at the peripheral edge portions of the exposed segment of the transparent substrate 2. In a case where the mask 1A is a reticle which has a pattern with a dimension five times that of the resist pattern to be exposed on the wafer 11, it is possible to form the resist pattern to the design dimension when the exposed portion of the transparent substrate 2 is 1.0 µm (0.5 µm on each side) larger than the design dimension and the phase shift layer 3a has a width of 0.75 µm at the peripheral edge portions of the exposed segment of the transparent substrate 2. In the descriptions which follow it is assumed for the sake of convenience that reticles are made and used according to the foregoing rule.

The rule described above must be changed, however, when the wavelength λ of the light or the numerical aperture NA of the lens system is changed. In other words, in such a case it would be necessary to change the dimension conversion quantity of the exposed portion of the transparent substrate 2 and the width of the phase shift layer 3a formed at the peripheral edge portion of the opaque layer 14. For example, when a KrF laser which emits the light having a wavelength of 248 nm is used as a light source and the lens system has a numerical aperture of 0.48, it is possible to obtain optimum effects when the exposed portion of the transparent substrate 2 is 0.13 µm (0.065 µm on each side) larger than the design dimension and the phase shift layer 3a at the peripheral edge portion of the opaque layer 14 has a width of 0.06 µm. In the case where the mask 1A is a reticle which has a pattern dimension that is five times larger than that of the resist pattern to be exposed on the wafer 11, it is possible to obtain optimum effects when the exposed portion of the transparent substrate 2 is 0.65 µm (0.325 µm on each side) larger than the design dimension and the phase shift layer 3a has a width of 0.30 µm at the periphery of the exposed portion of the transparent substrate 2. As the white patterns close and overlap, the pattern of the opaque layer 14 between the white patterns disappears and the white patterns are thus separated solely by the phase shift layer 3a.

It is known from experience that the resolution is improved by 20% when the phase shift method is employed. Hence, the dimension conversion quantity at the exposed portion of the transparent substrate 2 and the width of the phase shift layer 3a can be calculated using this knowledge. That is, when an i-ray beam is used for the exposure and the numerical aperture NA of the lens system is 0.5, the resolution limit for a case where phase shift procedures are not used described by the expression $0.6 \times (\lambda/NA)$ and the resolution limit for a case where phase shift procedures are used is described by the expression $0.6 \times (\lambda/NA) \times 0.8$. Therefore, the width of the phase shift layer 3a is calculated as 0.35 µm when numerical values are substituted.

Figure 25:
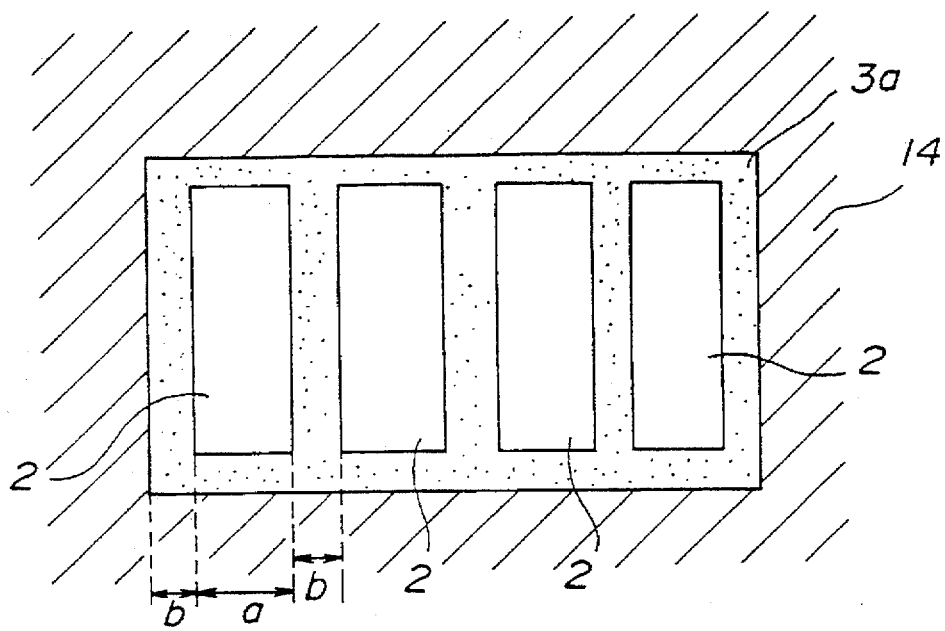
FIG. 25 is a diagram for explaining a second embodiment of the mask as applied to a line-and-space pattern.

FIG. 25 shows a case where the foregoing embodiment is applied to a so-called line-and-space pattern. In FIG. 25, a phase shift layer 3a is located at the edge portion of the opaque layer 14 and between the four spaces where the transparent substrate 2 is exposed.

FIGS. 26A through 26D show the light intensity distributions of the line-and-space pattern of FIG. 25 where the resolution limit is 0.35 µm, where phase shifting procedures are used and where the dimension conversion quantity a at the exposed portion of the transparent substrate 2 and the width b of the phase shift layer 3a are varied.

Figure 26A:
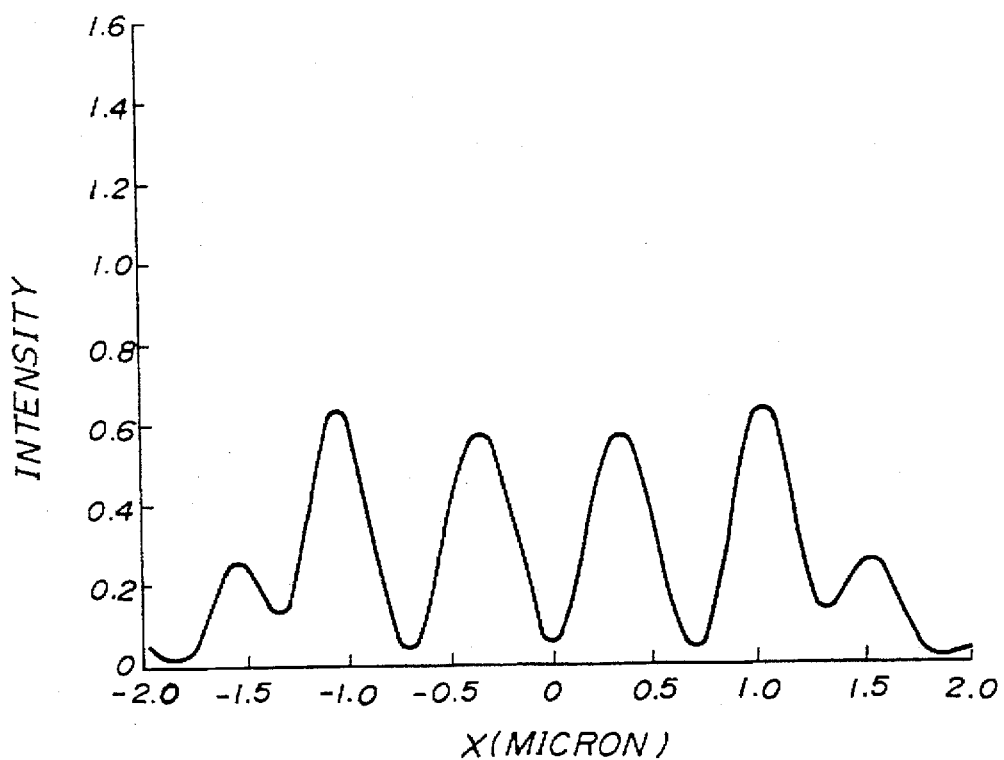
FIGS. 26A through 26D are diagrams for explaining the light intensity distribution patterns for different dimension conversion quantities and widths of the phase shift layer.
Figure 26B:
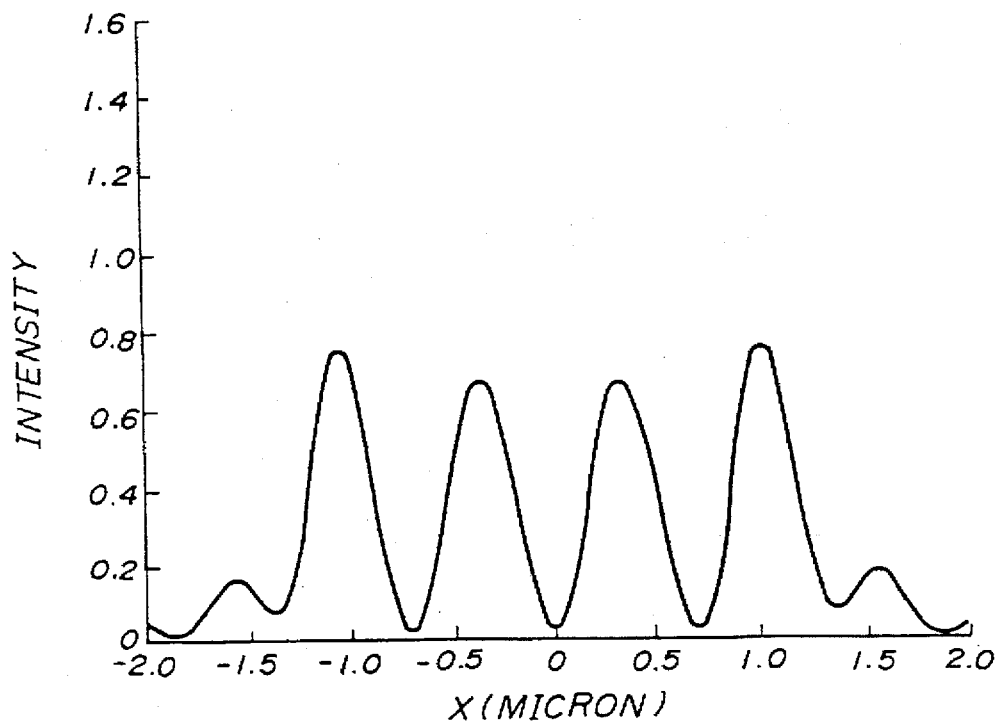
Figure 26C:
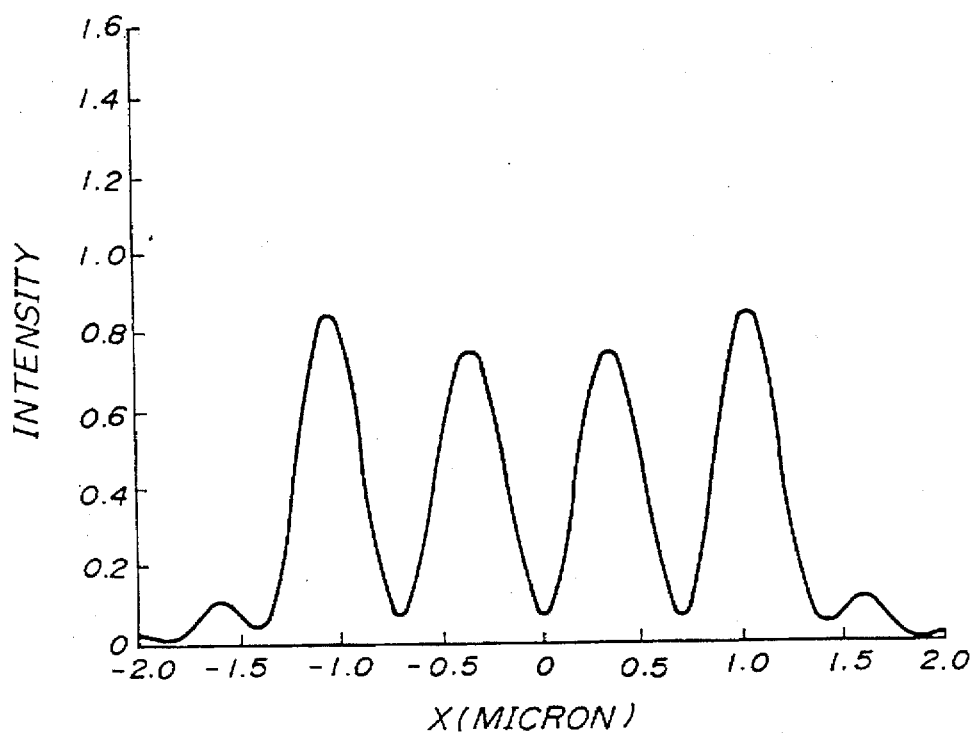
Figure 26D:
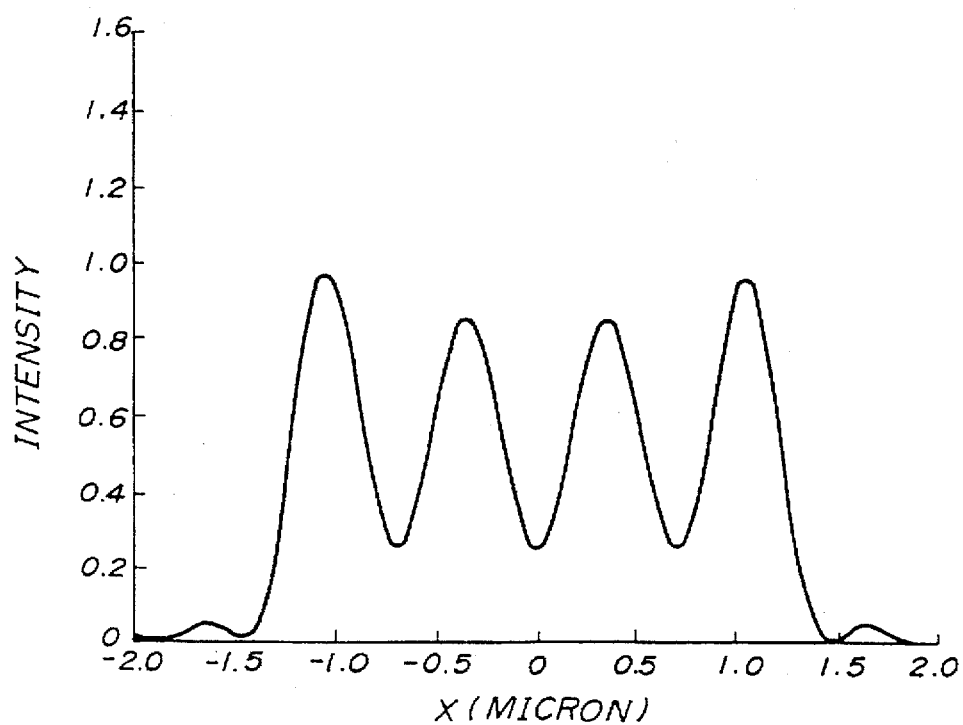

FIG. 26A shows the light intensity distribution for the case where a=0.45 µm and b=0.25 µm. FIG. 26B shows the light intensity distribution for the case where a=0.50 µm and b=0.20 µm. FIG. 26C shows the light intensity distribution for the case where a=0.55 µm and b=0.15 µm. FIG. 26D shows the light intensity distribution for the case where a=0.60 µm and b=0.10 µm. It is necessary that a+b=0.70 µm in order to form a line-and-space pattern. As can be seen from FIGS. 26A through 26D, the light intensity at the intensity peaks decreases as the width b of the phase shift layer 3a becomes larger. In addition, as the width b of the phase shift layer 3a becomes smaller, the light intensity at the intensity valleys increases so that the contrast decreases.

In the foregoing situation, optimum contrast is obtained when b=0.15 μm, and a=0.55 μm. The boundary between the phase shift layer 3a and the exposed portion of the transparent substrate 2 is shifted so as to enlarge the exposed portion of the transparent substrate 2 by 0.10 μm on each side from the design dimension, and this case corresponds to the edge portion of the large pattern described above. The width b of the phase shift layer 3a must be set within 30 to 60% of the resolution limit, that is, within the range of 0.144 to 0.228 μm.

High contrast can be obtained especially when the width b of the phase shift layer 3a is set within 40 to 50% of the resolution limit.

Figure 27:
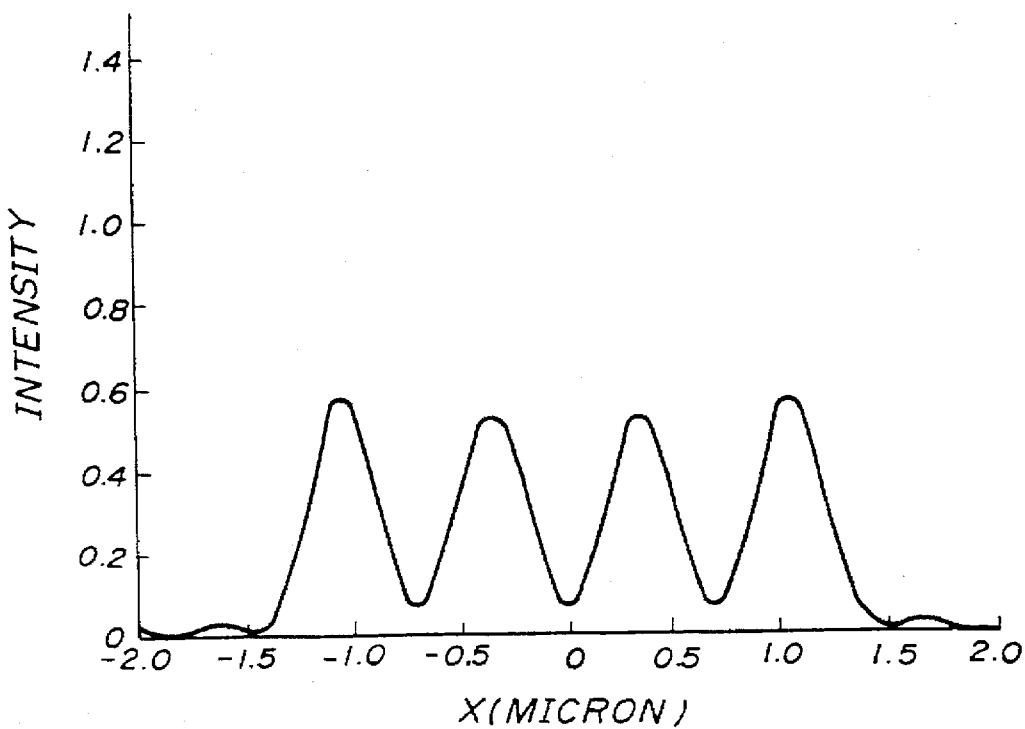
FIG. 27 is a diagram for explaining the conventional light intensity distribution in correspondence with the mask of FIG. 25.

FIG. 27 shows the light intensity distribution pattern for the conventional mask of FIG. 1 in a case where the width of the exposed portion of the transparent substrate 452 is 0.35 μm and the width of the opaque layer 451 is 0.35 μm. In a case where the mask is a conventional reticle having a pattern dimension that is five times larger than that of the resist pattern to be exposed on the wafer, FIG. 27 shows the light intensity distribution in such case where the width of the exposed portion of the transparent substrate 452 is 1.75 μm and the width of the opaque layer 451 is 1.75 μm. In FIG. 27, the light intensity of the intensity peaks is approximately 55% while the light intensity at the intensity peaks is approximately 80% in FIG. 26C. Hence, it is readily seen that the contrast is greatly improved by this embodiment of the invention.

When the width b of the phase shift layer 3a is 30 to 60% of the resolution limit, the phase shift pattern should be smaller than the design pattern by 20 to 35% (on one side) of the resolution limit. When an i-ray beam is used and the numerical aperture NA of the lens system is 0.5, the phase shift pattern is 0.070 to 0.123 μm (on one side) smaller than the design pattern. Furthermore, it is known from experience that for a case where the phase shift layer is arranged between the opaque layer and the exposed portion of the transparent substrate, the width of the phase shift pattern is desirably 1.0 to 1.5 times the reduced width which is 20 to 35% (on one side) of the resolution limit. This width is 0.070 to 0.185 μm when an i-ray beam is used and the numerical aperture NA of the lens system is 0.5.

Figure 28A:
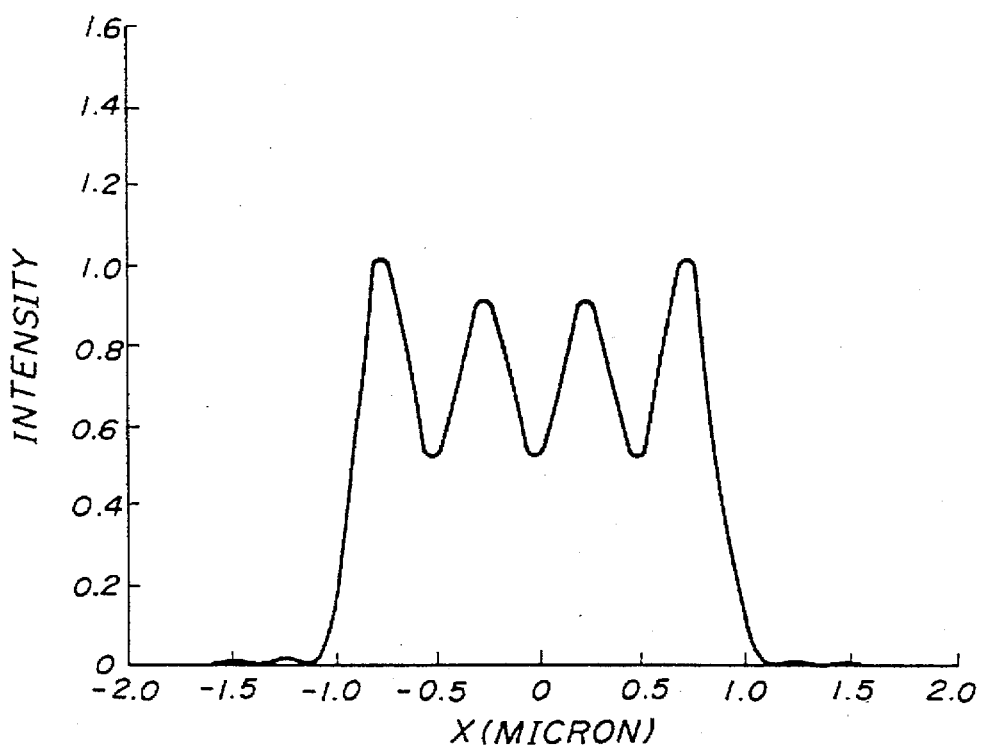
FIGS. 28A through 28F are diagrams for explaining the light intensity distribution for a case where a KrF excimer laser is used in connection with the mask of FIG. 25.
Figure 28B:
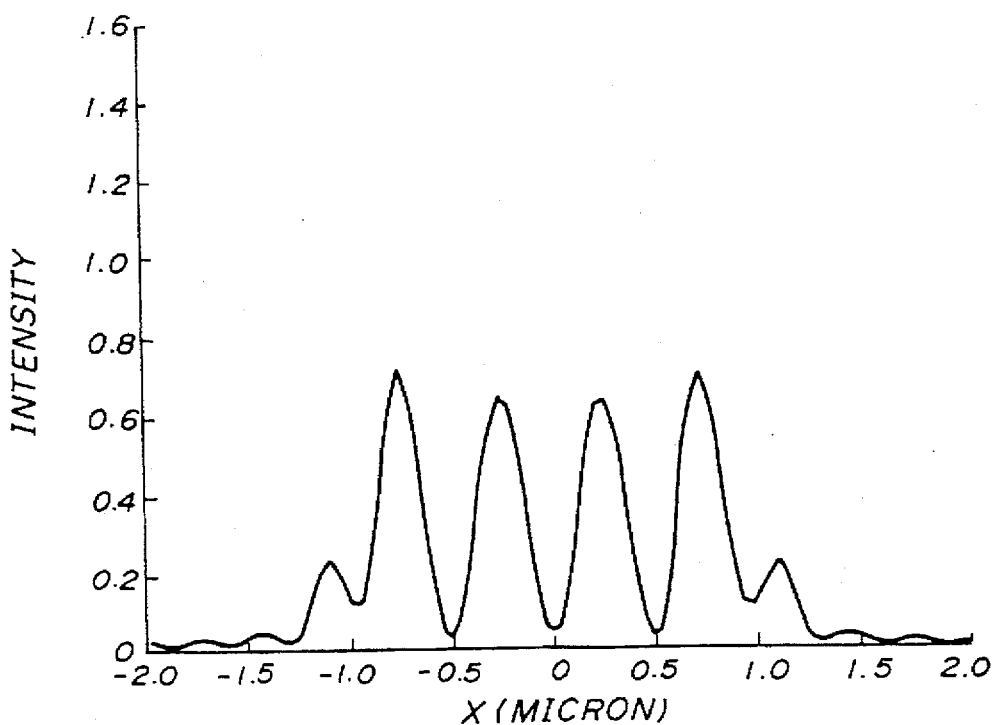
Figure 28C:
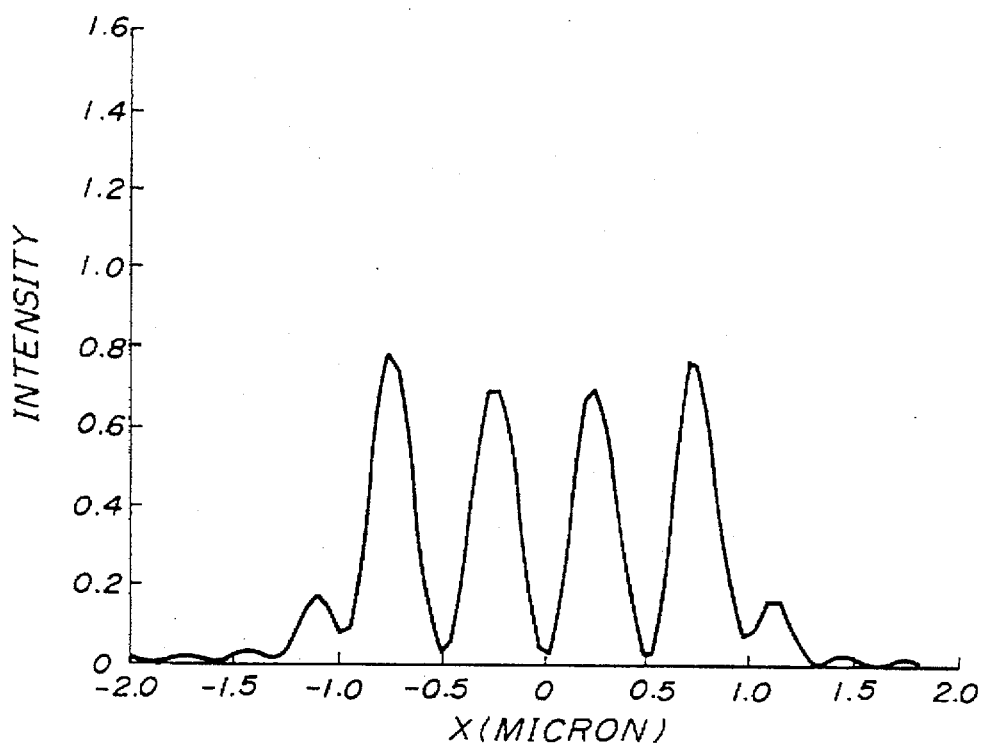
Figure 28D:
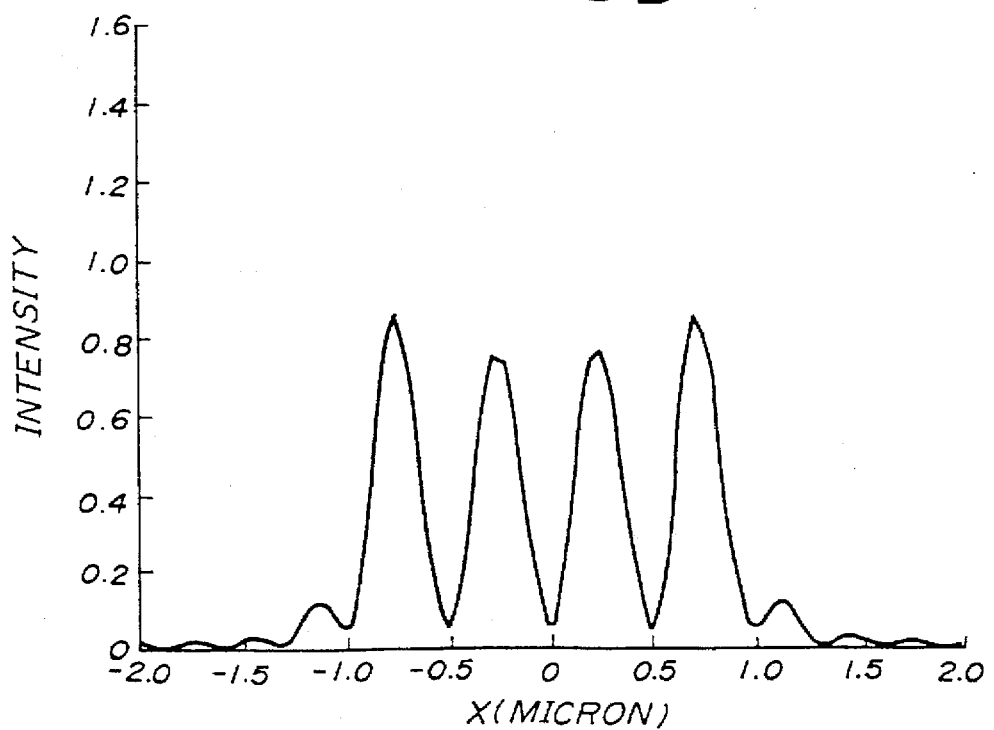
Figure 28E:
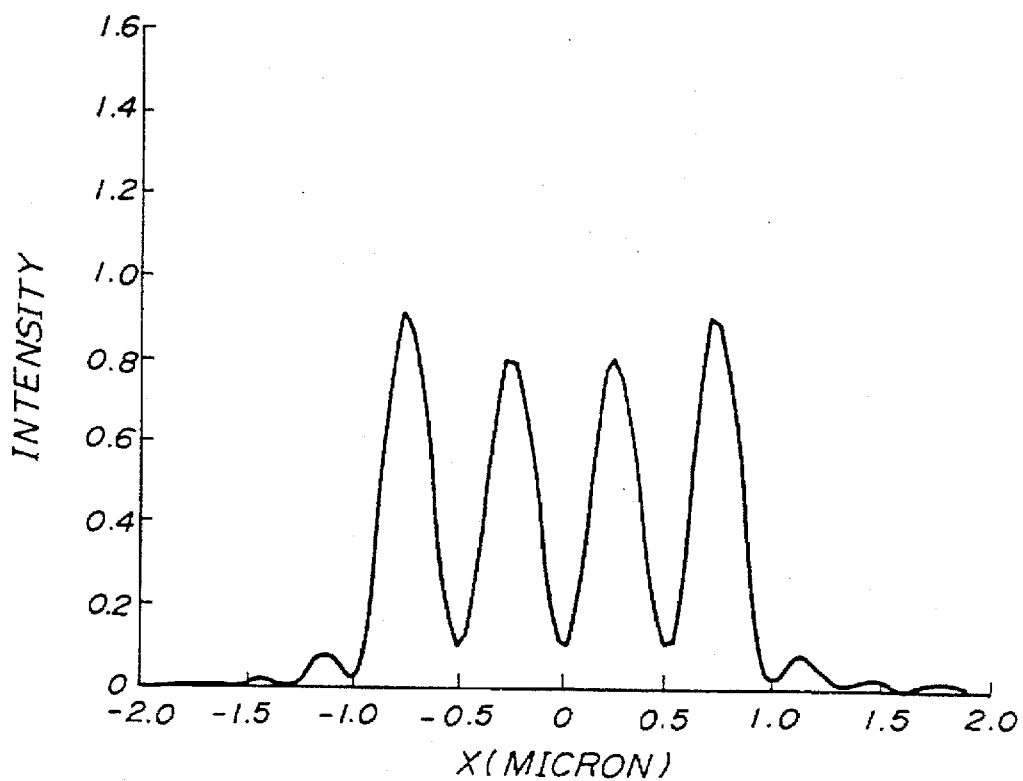
Figure 28F:
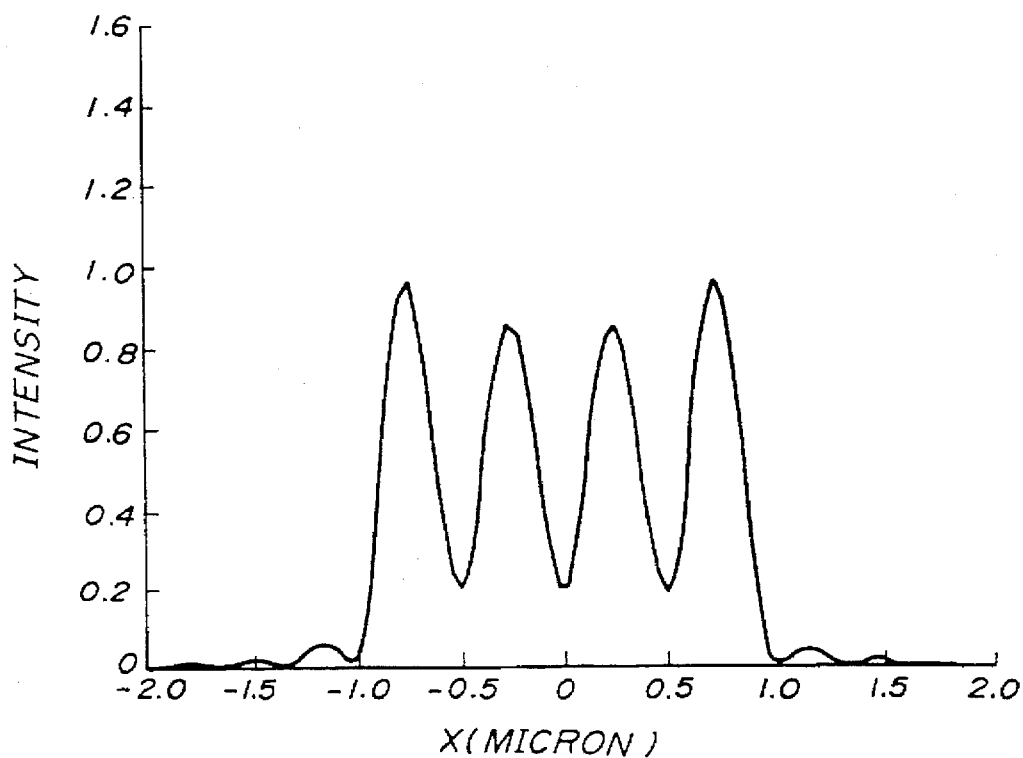

When an KrF excimer laser is used to emit a light having a wavelength of 248 nm and the lens system used has a numerical aperture NA of 0.48, the resolution limit is 0.25 μm when phase shifting is employed. FIGS. 28B through 28F show the light intensity distributions for such cases when the dimension a of the exposed portion of the transparent substrate 2 and the width b of the phase shift layer 3a are varied. FIG. 28A shows for comparison the light intensity distribution for a case where no phase shift is made. FIG. 28B shows the light intensity distribution for the case where a=0.35 μm and b=0.15 μm. FIG. 28C shows the light intensity distribution for the case where a=0.36 μm and b=0.14 μm. FIG. 28D shows the light intensity distribution for the case where a=0.38 μm and b=0.12 μm. FIG. 28E shows the light intensity distribution for the case where a=0.40 μm and b=0.10 μm. FIG. 28F shows the light intensity distribution for the case where a=0.42 μm and b=0.08 μm. Optimum contrast is obtained when b=0.12 μm as may be seen from FIG. 28D. The width b of the phase shift layer 3a must be set within 30 to 60% of the resolution limit.

Figure 29:
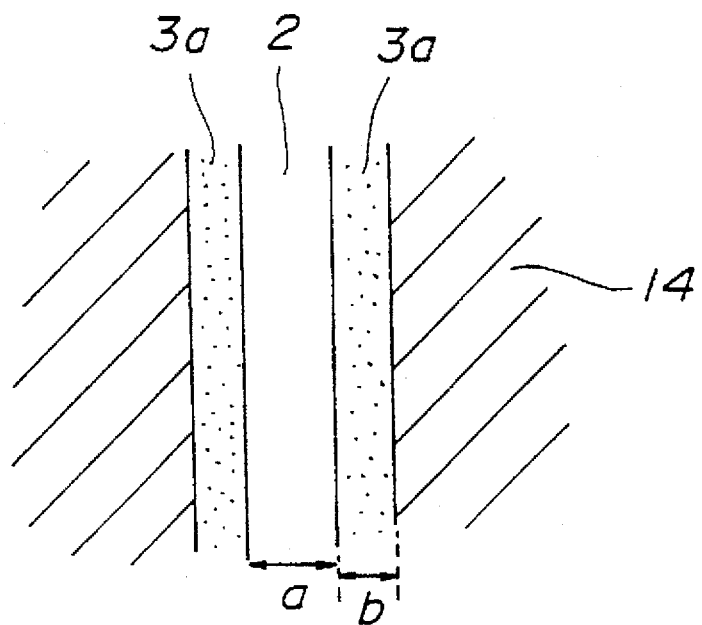
FIGS. 29A and 29B are diagrams respectively showing a portion of the mask of FIG. 19 and a portion of the mask of FIG. 1.
Figure 29B:
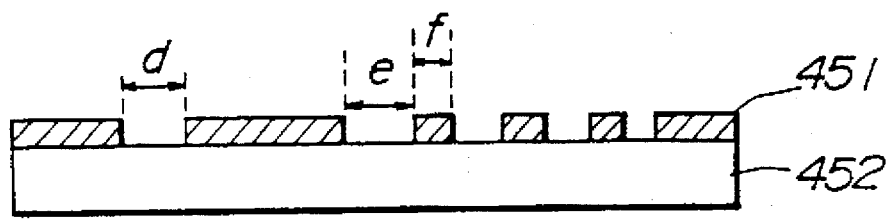

FIG. 29A shows a portion of the mask 1A of FIG. 19. In FIG. 29A, the phase shift layer 3a is formed at both edge portions of the opaque layer 14, and the transparent substrate 2 is exposed between the phase shift layers 3a. On the other hand, FIG. 29B shows a portion of the conventional mask 450 of FIG. 1 for comparison purposes. In FIG. 29B, a mask pattern made solely of the opaque layer 451 is formed on the transparent substrate 452.

Figure 30A:
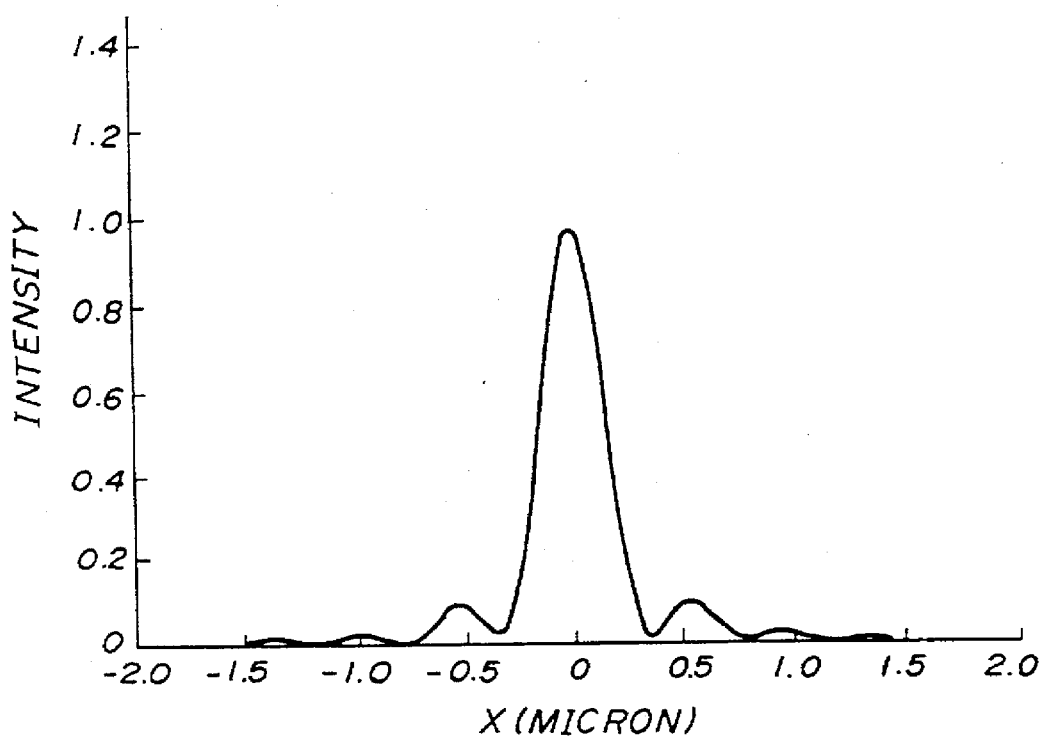
FIGS. 30A and 30B are respective diagrams for explaining the light intensity distribution patterns which are produced using the masks of FIGS. 29A and 29B.
Figure 30B:
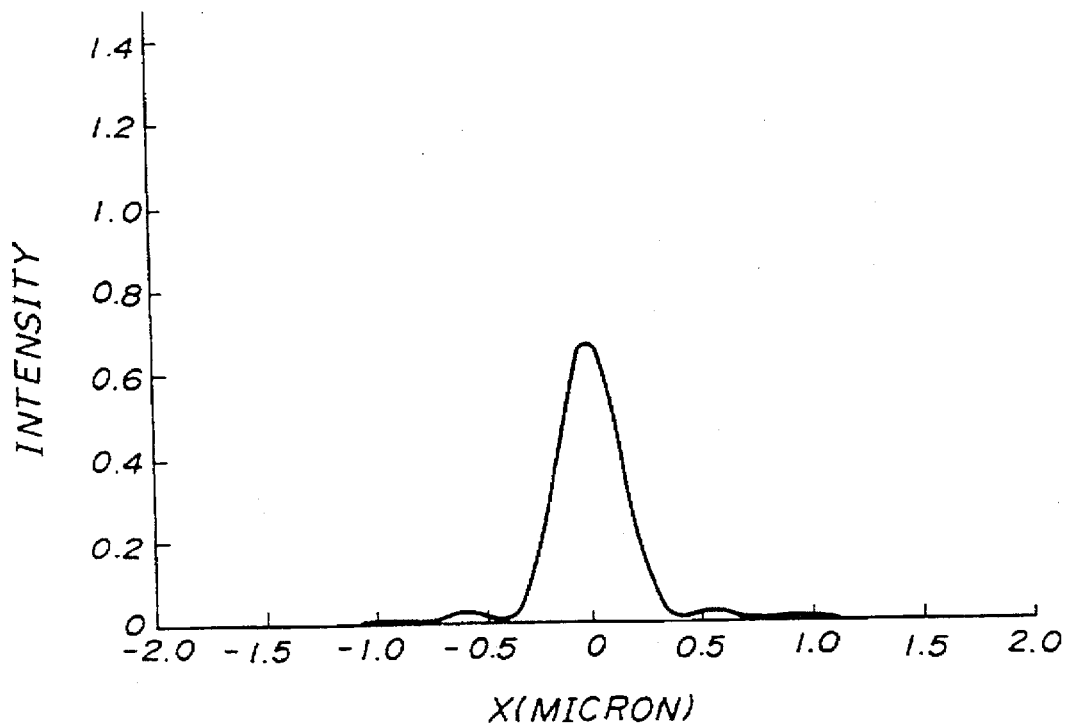

When comparing FIGS. 29A and 29B, it is assumed that the width a of the exposed portion of the transparent substrate 2 shown in FIG. 29A is 0.55 μm (reticle size of 2.75 μm), the width b of the phase shift layer 3a is 0.15 μm (reticle size of 1.75 μm), and the width d of the exposed portion of the transparent substrate 452 shown in FIG. 29B is 0.35 μm (reticle size of 1.75 μm). FIGS. 30A and 30B respectively show the light intensity distributions for the cases shown in FIGS. 29A and 29B. As may be seen from FIG. 30A, the peak light intensity is approximately 100% in this embodiment while the peak light intensity is approximately 65% in the conventional case, and it can be seen that the contrast is greatly improved according to this embodiment of the invention. Therefore, it is possible to obtain satisfactory results when the exposed portion of the transparent substrate 2 is larger than the design pattern to be formed on the wafer and the phase shift layer 3a is located at the peripheral portions of the exposed portion of the transparent substrate 2.

Figure 32A:
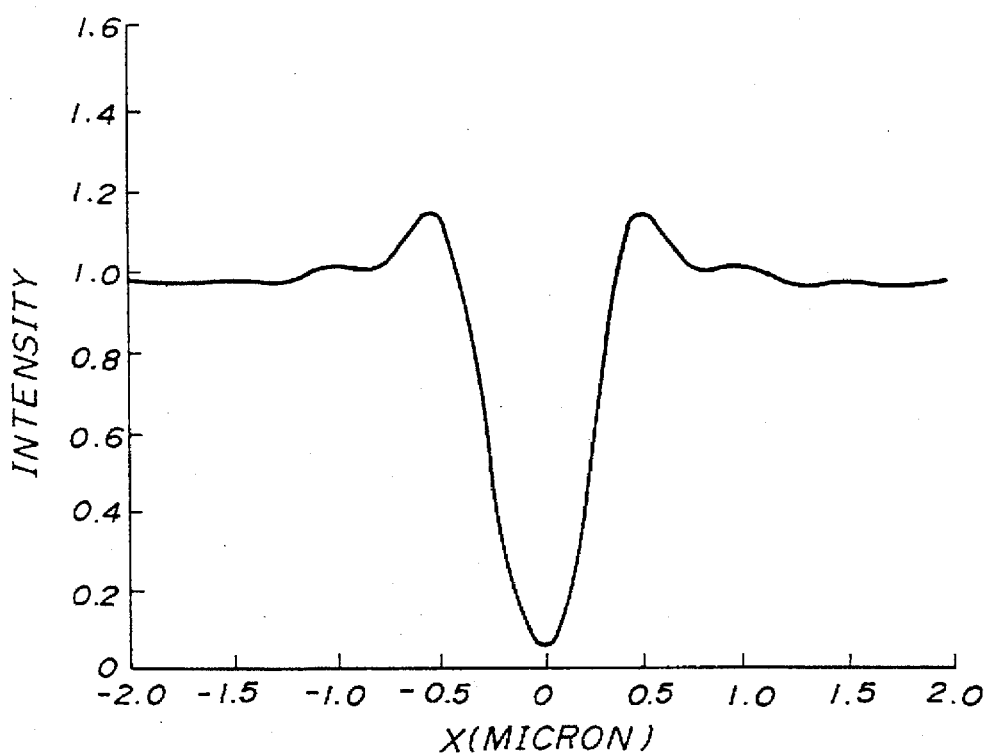
FIGS. 32A and 32B are respective diagrams for explaining the light intensity distribution patterns produced in connection with FIGS. 31A and 31B.
Figure 32B:
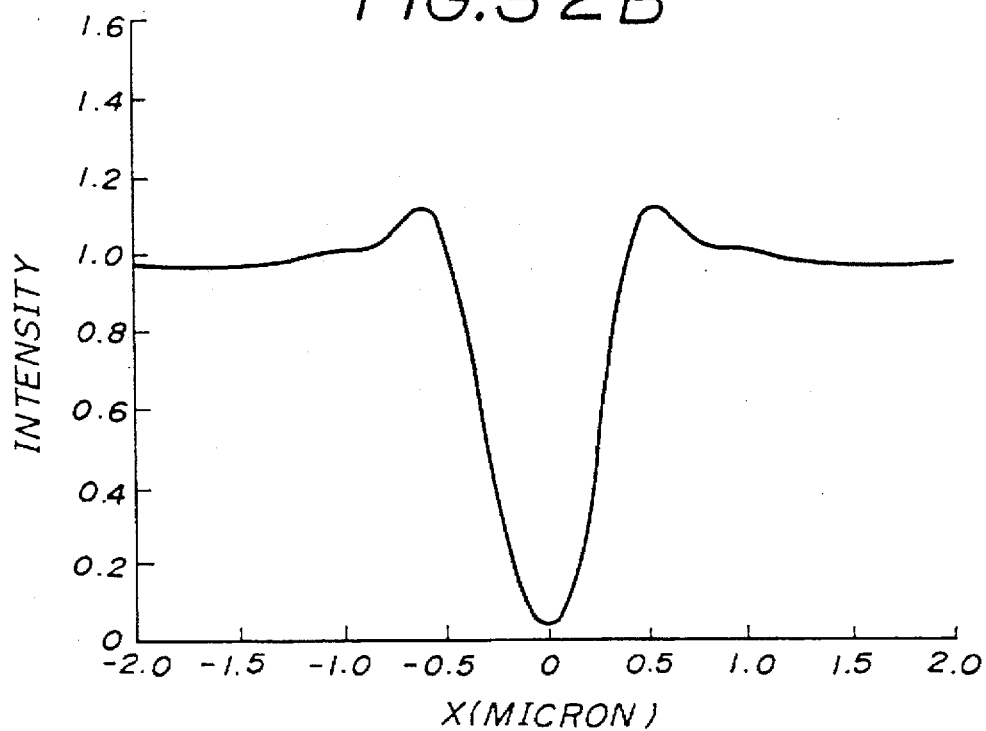

A case where a black pattern is formed on a white background is described with reference to FIGS. 31A and 31B. FIG. 31A shows a mask for forming a black pattern of 0.35 μm using phase shift principles. According to the rule described above, the mask pattern is made up solely of a phase shift layer 3a having a width c of 0.15 μm (reticle size of 0.75 μm). In this case, the light intensity of the pattern imaged on the wafer is as shown in FIG. 32A. On the other hand, FIG. 31B shows a mask for forming a black pattern of 0.35 μm without using phase shift principles. The mask shown in FIG. 31B is made up of an opaque layer 14 having a width of 0.35 μm (reticle size of 1.75 82 m). In this case, the light intensity of the pattern imaged on the wafer is as shown in FIG. 32B. As may be seen by comparing FIGS. 32A and 32B, there is a sharp decrease in the light intensity when phase shifting is used, and the resolution of the black pattern is improved.

FIGS. 33A and 33B show a case where this embodiment is applied to the formation of an integrated circuit pattern. FIG. 33A is a plan view showing a portion of a mask 1A, and FIG. 33B is a plan view showing the pattern which is imaged on the wafer 11. In FIG. 33A, the phase shift layer 3a is formed at the edge portion of the opaque layer 14 and at the portions of the transparent substrate 2 where fine patterns are adjacent to each other. In other words, in FIG. 33A there are provided an isolated region 15 and a pattern adjacent region 16.

FIG. 34A shows a pattern which is formed on a wafer 11 using the mask 1A, and a description will now be given of the interference caused by the mask 1A. In FIG. 34A, it is assumed that the pattern width g is 0.35 μm and the pattern width h is varied to take the values 0.35, 0.4, 0.5, 0.6, 0.7, 0.8 and 1.0 μm. In this case, according to the rule described above, the mask pattern for cases where the patterns with a pattern width h of 0.35, 0.4 and 0.5 μm are adjacent is as shown in FIG. 34B wherein the mask pattern is made up solely of the phase shift layer 3a for isolating the white patterns. In addition, the mask pattern for cases where the patterns with a pattern width h of 0.6, 0.7, 0.8 and 1.0 μm are isolated from each other to a certain extent are as shown in FIG. 34C wherein a region of the opaque layer 14 exists between the white patterns.

Figure 35A:
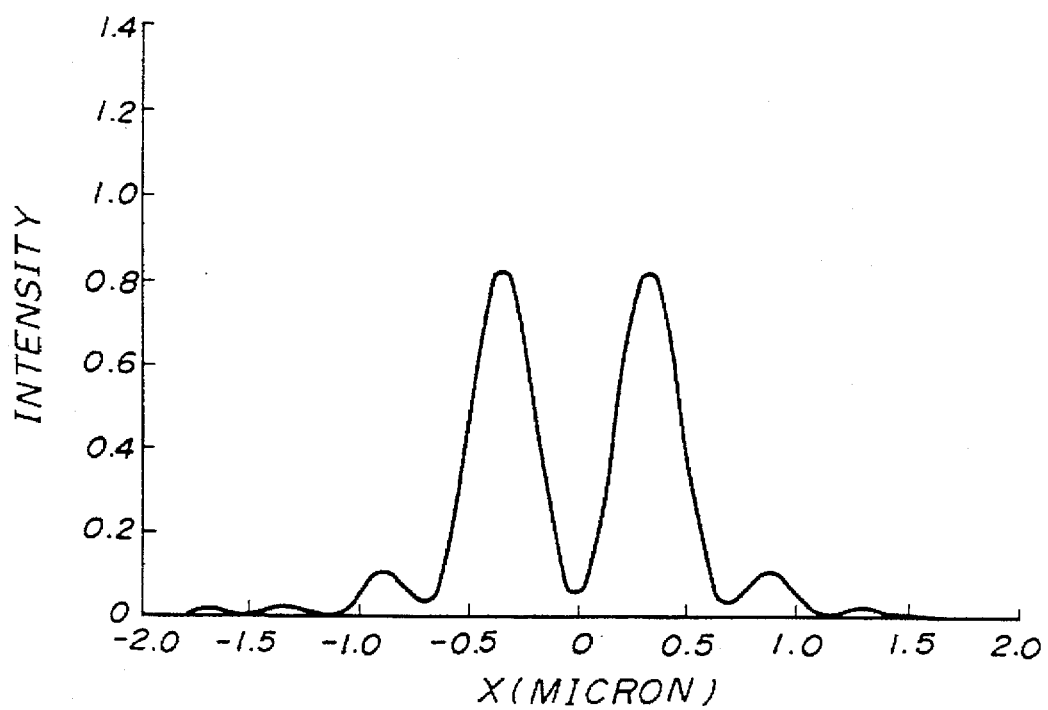
FIGS. 35A and 35B are diagrams for explaining the light intensity distribution patterns of the masks of FIGS. 34B and 21B respectively when a pattern width h=0.35 µm.
Figure 35B:
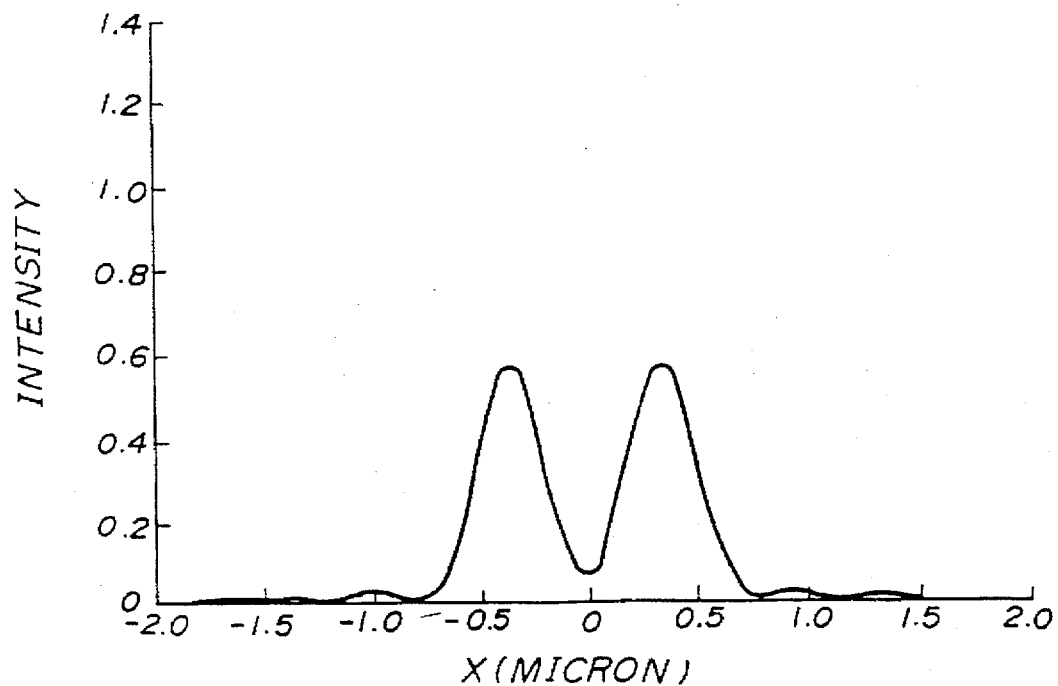

For the sake of convenience, it is assumed that the pattern width h on the wafer 11 is 0.35 μm. FIG. 35A shows the light intensity distribution for the mask shown in FIG. 34B when the mask dimension a is 0.55 µm (reticle size of 2.75 m), b is 0.15 µm (reticle size of 0.75 µm) and c is 0.15 µm (reticle size of 0.75 µm). On the other hand, FIG. 35B shows the light intensity distribution for the conventional mask shown in FIG. 29B when the mask dimension e is 0.35 µm (reticle size of 1.75 µm) and f is 0.35 µm (reticle size of 1.75 µm). When FIGS. 35A and 35B are compared, it can be seen that the light intensity is approximately 85% according to this embodiment of the invention while the light intensity is approximately 55% for the conventional case, and the contrast is improved according to this embodiment.

Figure 36:
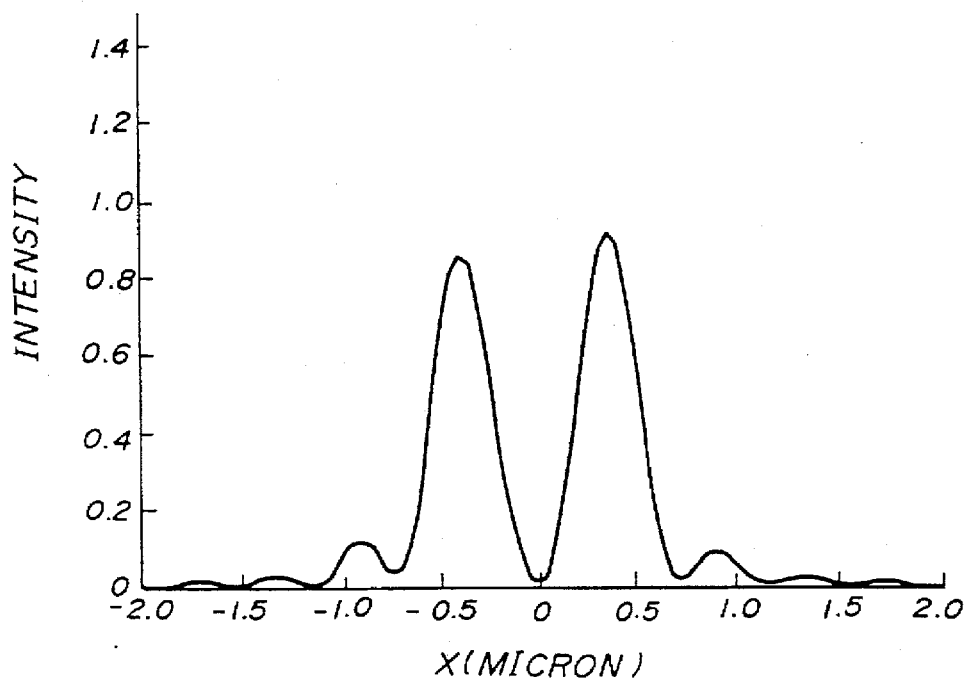
FIGS. 36 through 41 respectively are diagrams for explaining the light intensity distribution patterns when the pattern width h=0.4, 0.5, 0.6, 0.7, 0.8 and 1.0 µm.
Figure 37:
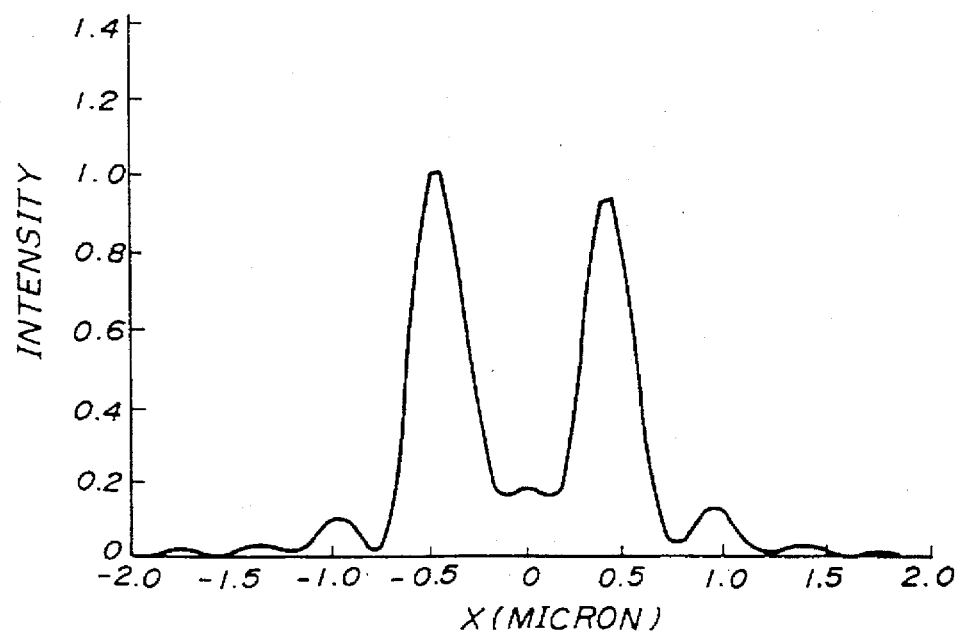
Figure 38:
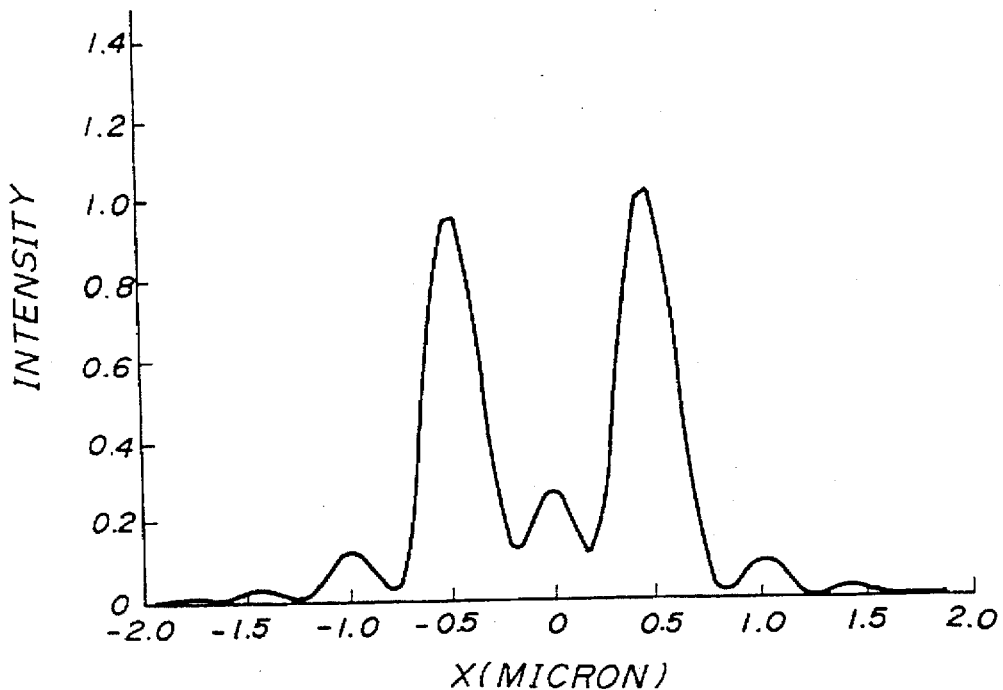
Figure 39:
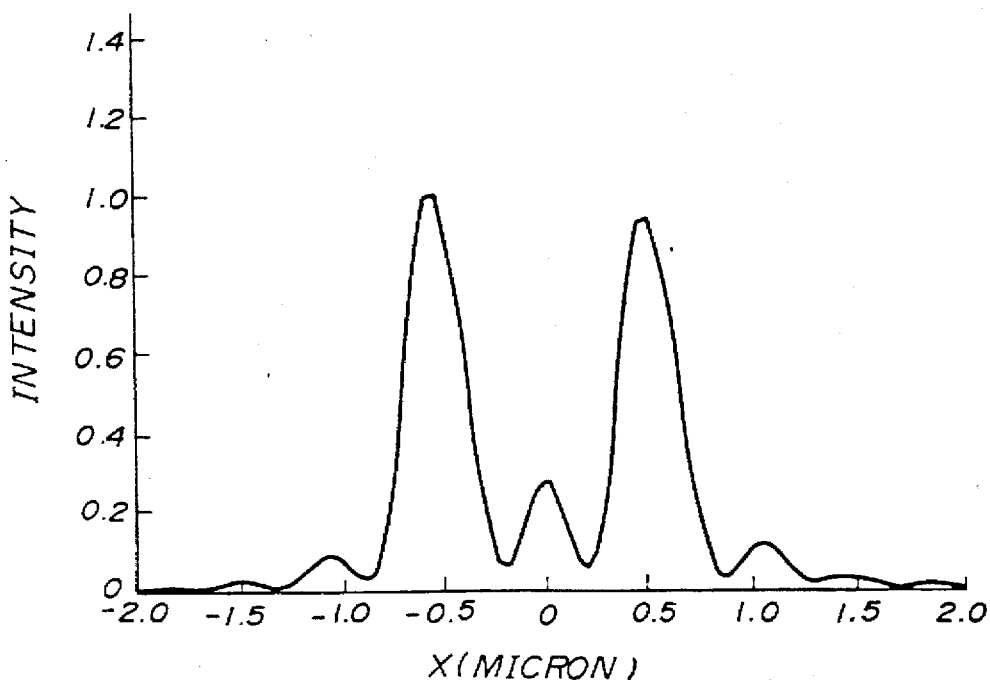
Figure 40:
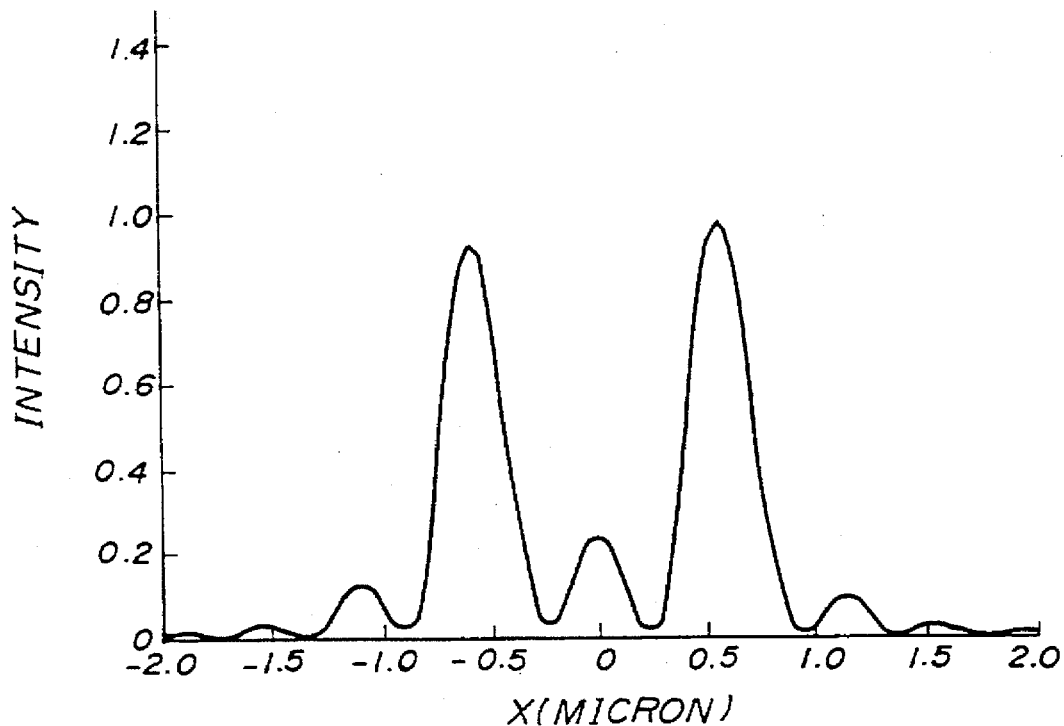
Figure 41:
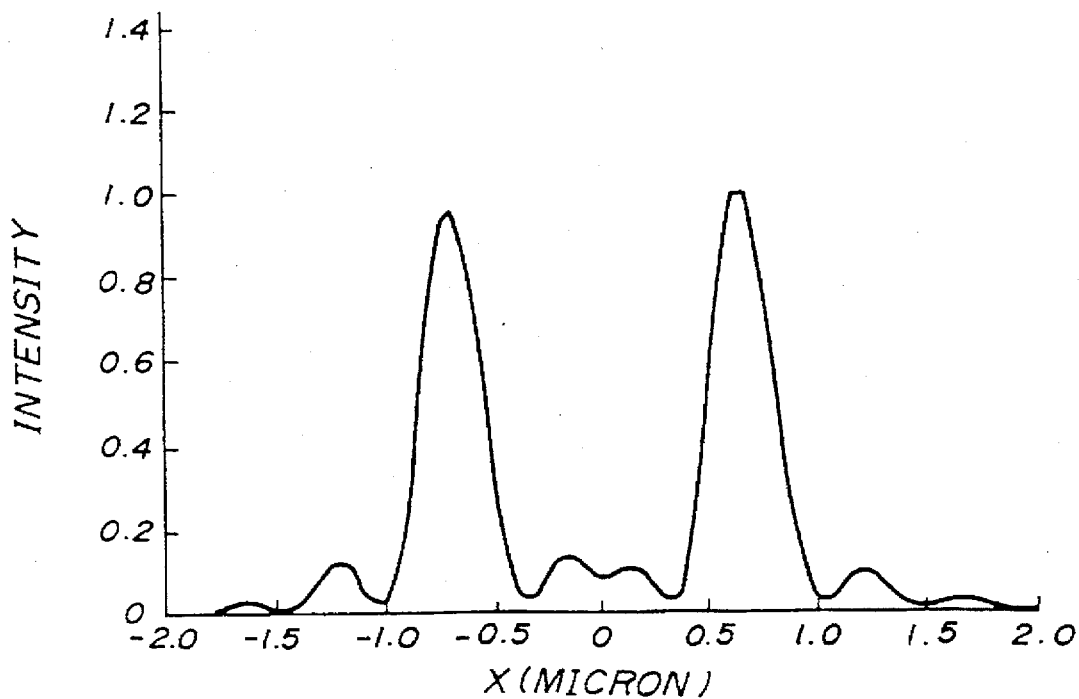

FIG. 36 shows the light intensity distribution when the pattern width h of the mask of FIG. 34A is 0.4 µm, FIG. 37 shows the light intensity distribution when the pattern width h is 0.5 µm, FIG. 38 shows the light intensity distribution when the pattern width h is 0.6 µm, FIG. 39 shows the light intensity distribution when the pattern width h is 0.7 µm, FIG. 40 shows the light intensity distribution when the pattern width h is 0.8 µm, and FIG. 41 shows the light intensity distribution when the pattern width h is 1.0 µm. It is also clear from FIGS. 36 through 41, that the light intensity is large and that the contrast is improved according to this embodiment of the invention.

The following Table shows the pattern dimension of the isolated pattern 15 shown in FIG. 33A for various values of the pattern width h.

TABLE

| h (µm) | Pattern Dimension (µm) |
|---|---|
| 0.35 | 0.35 |
| 0.40 | 0.36 |
| 0.50 | 0.35 |
| 0.60 | 0.35 |
| 0.70 | 0.35 |
| 0.80 | 0.35 |
| 1.00 | 0.35 |
| Isolated Pattern | 0.35 |

As may be seen from the Table, the change in the pattern dimension of the isolated pattern 15 caused by the interference is within ±0.01 µm. Accordingly, it is possible to control the pattern dimension. But in order to more accurately control the pattern dimension, it is preferable to change the values of the pattern widths a, b, c and i in FIGS. 34B and 34C.

Figure 42A:
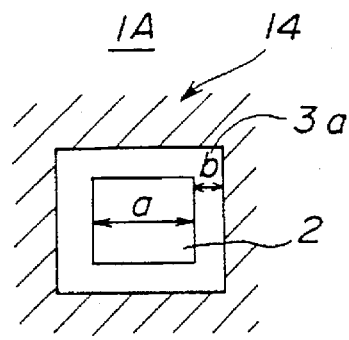
FIGS. 42A and 42B are diagrams for explaining the case where a second embodiment of the mask is applied to the formation of a contact hole pattern.
Figure 42B:
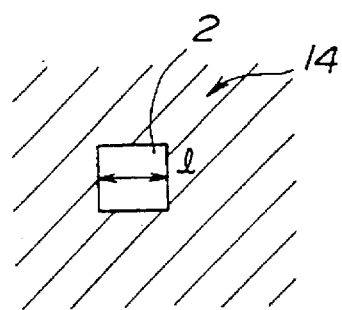
Figure 43A:
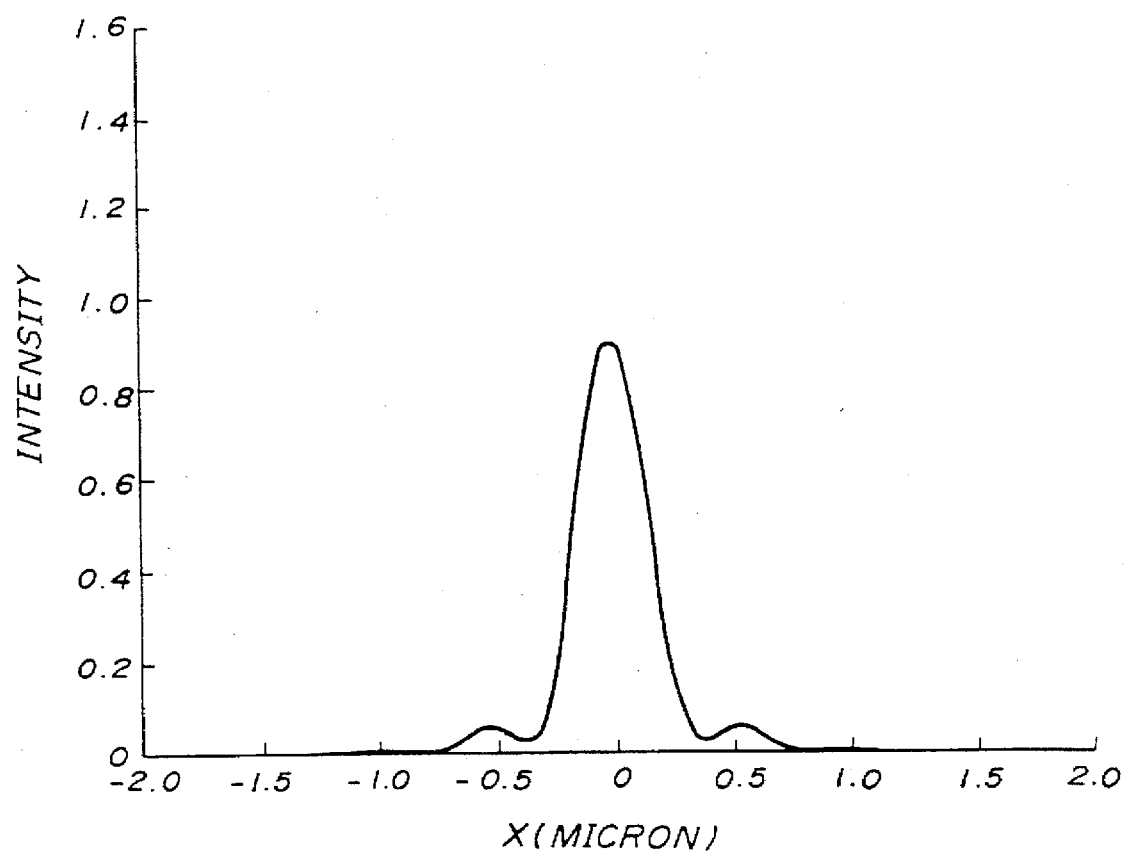
FIGS. 43A and 43B are respective diagrams for explaining the light intensity distribution patterns produced in connection with FIGS. 42A and 42B.
Figure 43B:
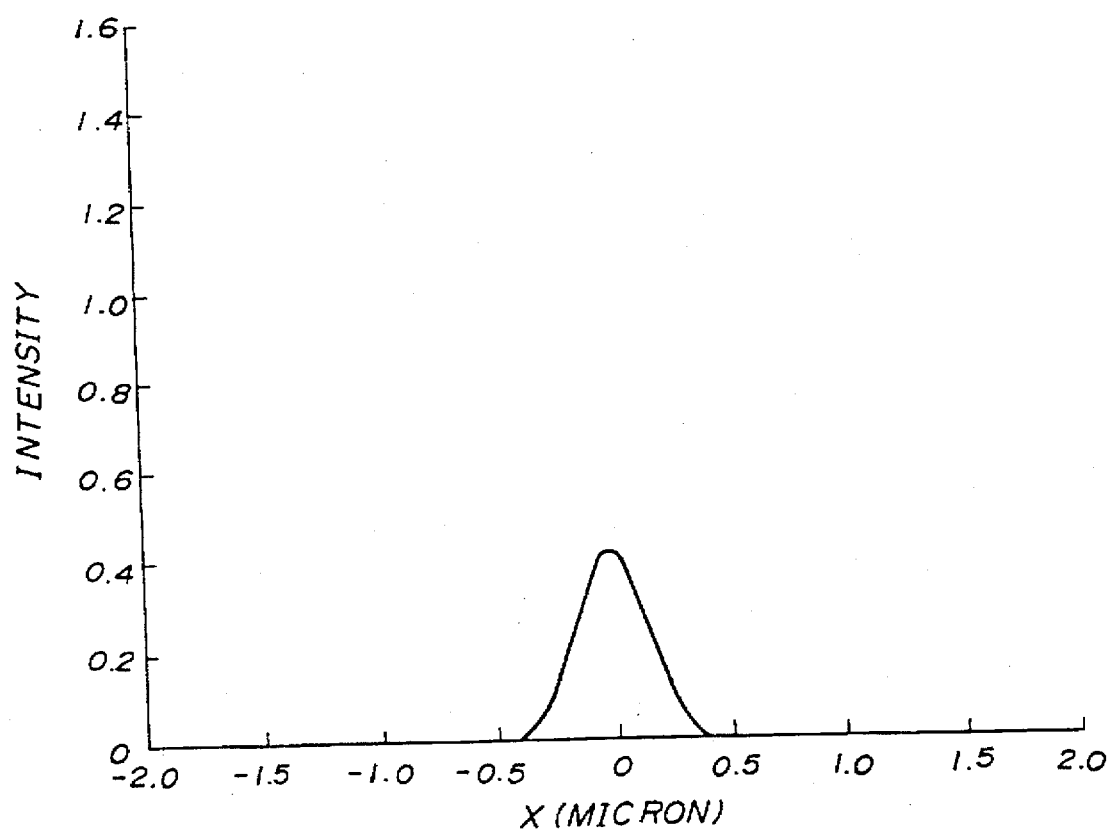

Next, a description will be given of the case where this embodiment of the invention is applied to the formation of a contact hole pattern. FIG. 42A shows a mask 1A for forming a contact hole having a width of 0.35 µm. According to the rule described above, the width a of the exposed portion of the transparent substrate 2 is 0.55 µm and the width b of the phase shift layer 3a is 0.15 µm. FIG. 43A shows the light intensity distribution for this case using the mask 1A shown in FIG. 42A. On the other hand, FIG. 42B shows a conventional mask for forming a 0.35 µm contact hole without the use of phase shift principles. In this case, the width 1 of the exposed portion of the transparent substrate 2 is 0.35 µm. FIG. 43B shows the light intensity distribution for this case using the mask shown in FIG. 42A. As may be seen from FIGS. 43A and 43B, the contrast of the contact hole is greatly improved according to this embodiment of the invention.

Third and fourth embodiments of mask producing methods according to the present invention are described with reference to FIGS. 44A through 44F and FIGS. 45A through 45E. In FIGS. 44A through 44F and FIGS. 45A through 45E, parts which are essentially the same as corresponding parts in FIGS. 14A through 14E and FIGS. 15A through 15F are designated by the same reference numerals, and a description thereof will be omitted.

Figure 44A:
FIGS. 44A through 44F are cross-sectional views for explaining a third embodiment of a mask producing method according to the present invention.
Figure 44B:
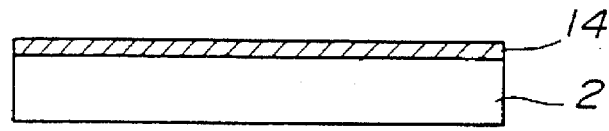
Figure 44C:
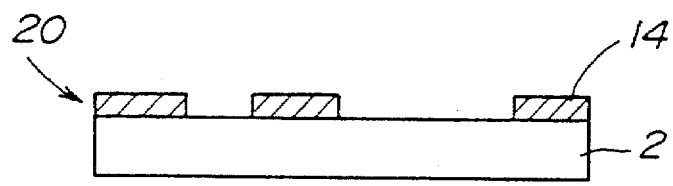
Figure 44D:
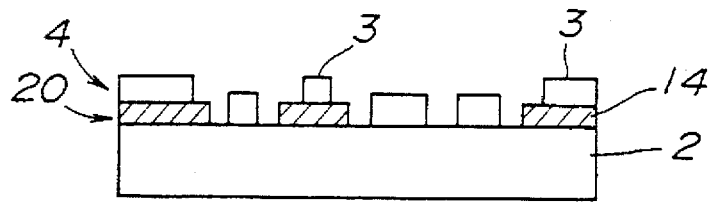
Figure 44E:
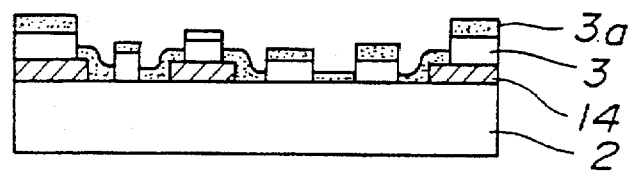
Figure 44F:
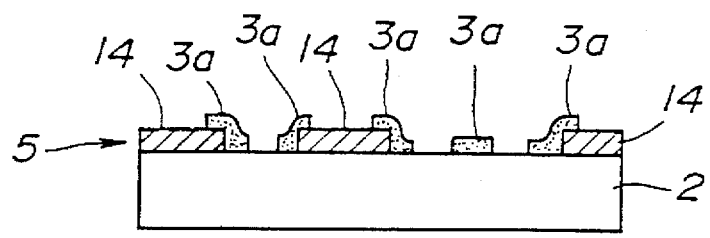

The transparent substrate 2 shown in FIG. 44A is made of quartz, for example. The opaque layer 14 is formed on the transparent substrate 2 as shown in FIG. 44B. For example, the opaque layer 14 is made of Cr and is formed to a thickness of 50 to 80 nm. A resist material 3 such as an EB resist is formed on the opaque layer 14. The resist material is subjected to a conventional mask production process (not shown) including electron beam drawing, developing, etching and resist removal steps. Thereafter, a pattern 20 of the opaque layer 14 is formed as shown in FIG. 44C. An EB resist material 3 is formed on the pattern 20, and the resist pattern 4 shown in FIG. 44D is formed by electron beam drawing and developing steps. Furthermore, the phase shift layer 3a is formed on the resist pattern 4 as shown in FIG. 44E. For example, the phase shift layer 3a is made of a silicon oxide and has a thickness of 0.388 µm. Next, the resist material 3 is removed by use of a removal agent and the mask pattern layer 5 of the opaque layer 14 and the phase shift layer 3a is formed as shown in FIG. 44F.

Figure 45A:
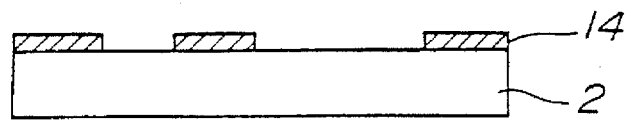
FIGS. 45A through 45E are cross-sectional views for explaining a fourth embodiment of a mask producing method according to the present invention.
Figure 45B:
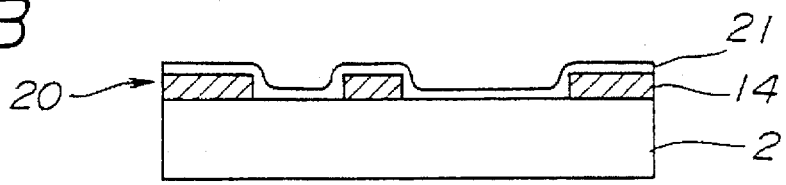

In the embodiment shown in FIGS. 45A through 45E, the pattern 20 of the opaque layer 14 is formed similarly to the steps shown in FIGS. 44A through 44C. For example, the opaque layer 14 is made of Cr and has a thickness of 50 to 80 nm. A stopper layer 21 is formed on the pattern 20 as shown in FIG. 45B. The stopper layer 21 acts as a stopper when making a plasma etching of an oxide layer on the pattern 20.

Figure 45C:
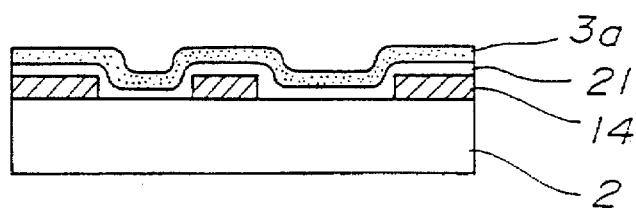
Figure 45D:
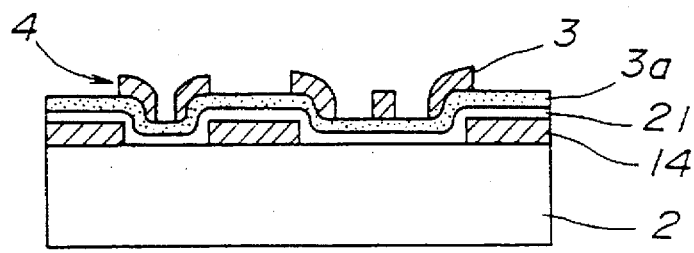
Figure 45E:
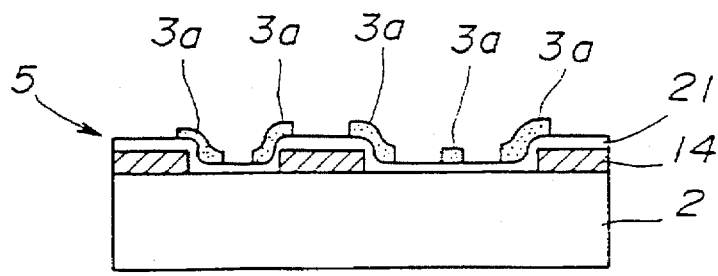

For example, the stopper layer 21 is formed on the pattern 20 by sputtering of a thin film of aluminum oxide which acts as a stopper for a plasma etching process which uses $CF_4$. The phase shift layer 3a is formed on the stopper layer 21 as shown in FIG. 45C to a desired thickness. For example, the phase shift layer 3a is made of silicon oxide. The desired thickness of the phase shift layer 3a is determined to be 0.388 µm in this embodiment using the formula (3) so as to cause a phase shift of 180°. The resist material 3 is formed on the phase shift layer 3a, and the resist pattern 4 is formed as shown in FIG. 45D by electron beam drawing and developing steps. Then, the exposed phase shift layer 3a is etched using a $CF_4$ plasma and the resist material 3 is removed so as to form the mask pattern layer 5 which comprises the phase shift layer 3a as shown in FIG. 45E.

Figure 46A:
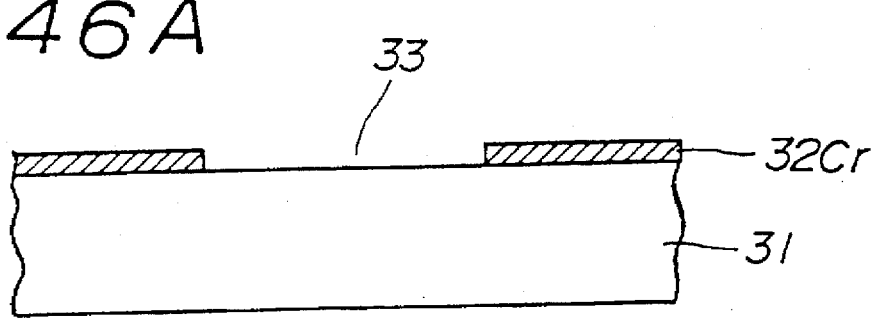
FIGS. 46A through 46E are cross-sectional views for explaining a fifth embodiment of a mask producing method according to the present invention.
Figure 46B:
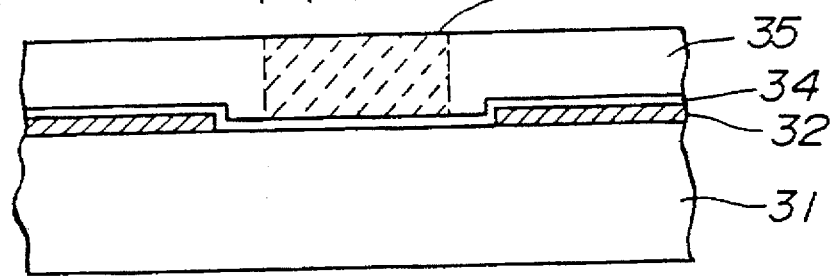
Figure 46C:
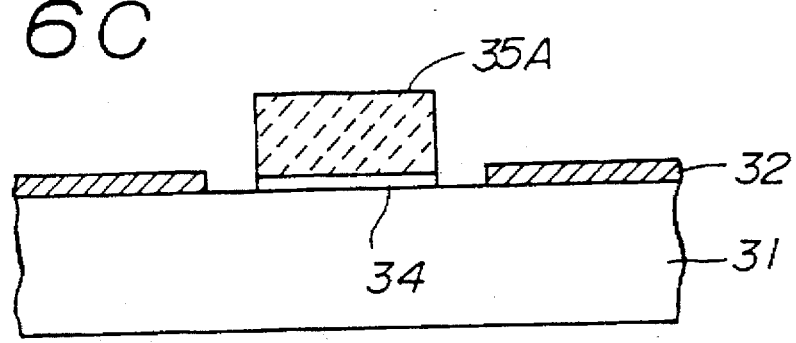
Figure 46D:
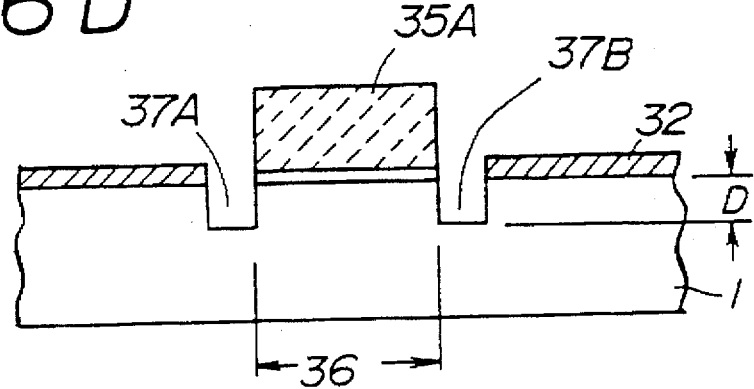
Figure 46E:
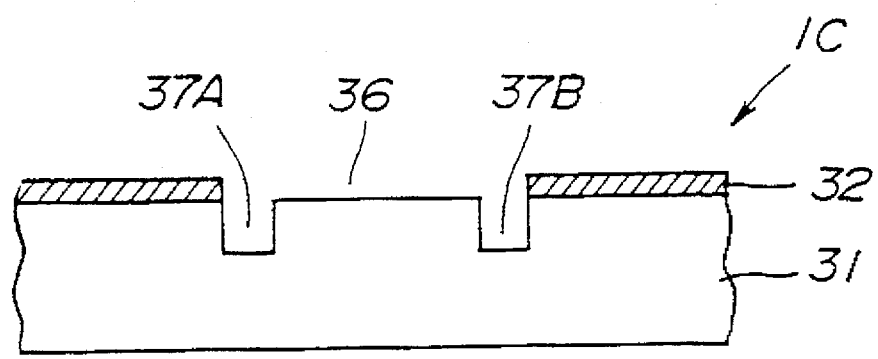

A fifth embodiment of a mask producing method according to the present invention is illustrated in FIG. 46A through 46E. This embodiment of the mask producing method is used to produce a third embodiment of the mask according to the present invention as shown in FIG. 46E. The third embodiment of the mask has a design pattern having a width of 1 µm, for example, and has structure for shifting the phase of the light wherein the phase shift pattern region comprises a portion of the glass substrate which has a thickness that is less than that of the design pattern.

In FIG. 46A, a glass substrate 31 is made of quartz and has a thickness of 2 to 3 mm. An opaque layer 32 is formed on the glass substrate 31. For example, the opaque layer 32 is made of Cr and is formed on the glass substrate 31 by sputtering Cr to a thickness of 500 to 1000 Å. In addition, an aperture pattern 33 is formed in opaque layer 32 by normal lithography using electron beam exposure. The aperture pattern 33 is a width of 0.85 µm in the case of a design pattern having a width of 0.35 µm.

Next, in FIG. 46B, a conductor layer 34 is formed on glass substrate 31 for preventing charge up at the time of electron beam exposure. For example, the conductor layer 34 is made of $MoSi_2$ and is sputtered on the glass substrate 31 to a thickness of 200 to 300 Å. Thereafter, a negative EB resist layer 35 is formed on layer 34 on the glass substrate 31 and prebaked. In addition, a pattern having a width of 0.55 μm is subject to electron beam exposure in an area approximately above the central portion of the aperture pattern 33 in the opaque layer 32. The exposed portion of the EB resist layer 35 is denoted by reference numeral 35A.

As shown in FIG. 46C, the structure is subject to normal developing so as to selectively leave the exposed resist layer 35A at the design pattern forming region. Then an etching process is carried out using a gaseous mixture of $CCl_4$ and $O_2$ so as to selectively remove the exposed conductor layer 34 using the exposed resist layer 35A as a mask.

As shown in FIG. 46D, the exposed resist layer 35A and the exposed opaque layer 32 are used as masks and an RIE process which uses a gaseous mixture of $CF_4$ and $O_2$ is carried out on the exposed top surfaces of the glass substrate 31 which correspond with phase shift regions 37A and 37B. Phase shift regions 37A and 37B are thus formed on respective opposite sides of a pattern 36 having a width of 0.55 μm on the glass substrate 31. The top surface of the pattern in substrate 31 coincides with the original top surface of the glass substrate 31. The phase shift regions 37A and 37B have a width of 0.15 μm and a top surface which is lower than the top surface of the pattern 36. In order to shift the phase of the light which is transmitted through the phase shift regions 37A and 37B by 180° with respect to the light which is transmitted through the pattern 36, the phase shift patterns 37A and 37B are etched to a depth D. When an i-ray beam having a wavelength of 365 nm is used for the exposure and the refractive index of the glass making up the glass substrate 31 is 1.54, the depth D should be approximately 0.36 μm as calculated using formula (1).

Next, with reference to FIG. 46E, the exposed resist layer 35A is removed by a normal ashing process. In addition, the conductor layer 34 is removed by dry etching processing using a gaseous mixture of $CCl_4$ and $O_2$. As a result, the mask 1C is completed. Mask 1C is a third embodiment of a mask according to the present invention.

Figure 47:
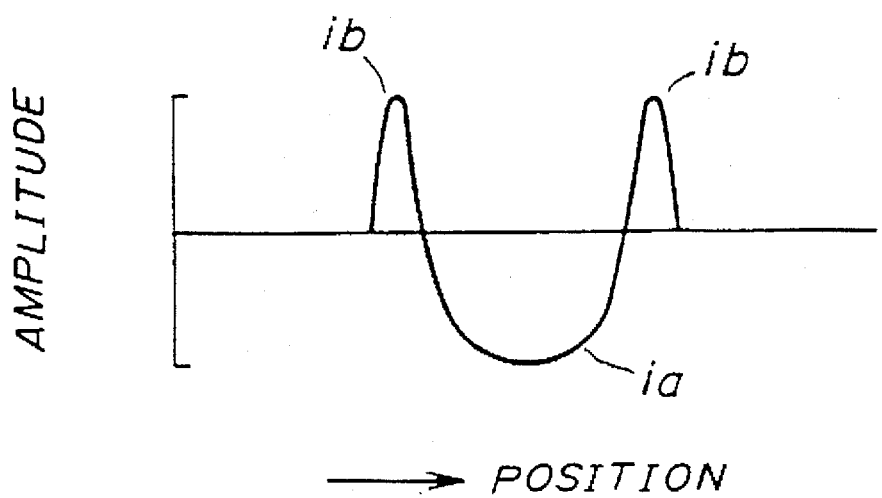
FIG. 47 shows a phase profile of the light transmitted through the mask of FIG. 46E.

FIG. 47 shows the phase profile of the light transmitted through the mask 1C of FIG. 46E. In FIG. 47, the reference numeral ia denotes the light transmitted through the central portion 36 and the reference numeral ib denotes the light transmitted through the phase shift regions 37A and 37B.

In the mask 1C of FIG. 46E, the phase shift regions are formed deeper than portion 36 using a negative resist at the time of patterning the phase shift pattern. However, if a positive resist is used the central portion 36 may be formed so as to be deeper than the phase shift regions. A fourth embodiment of a mask according to the present invention has such a structure and may be produced using steps which are similar to those shown in FIGS. 46A through 46E.

Figure 48A:
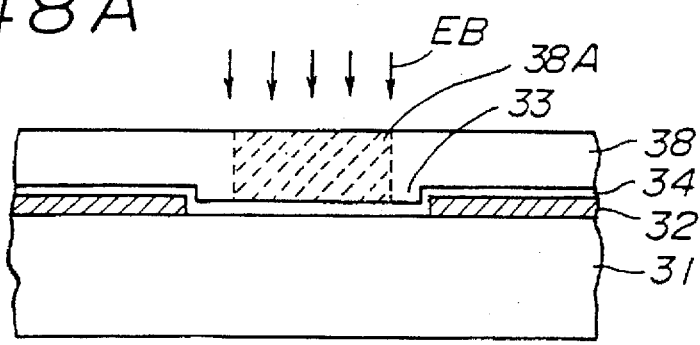
FIGS. 48A through 48C are cross-sectional views for explaining a sixth embodiment of a mask producing method according to the present invention.
Figure 48B:
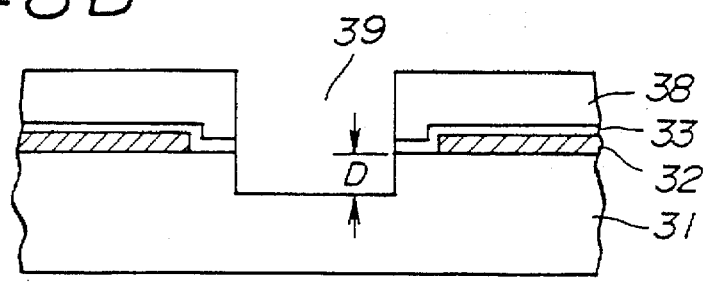
Figure 48C:
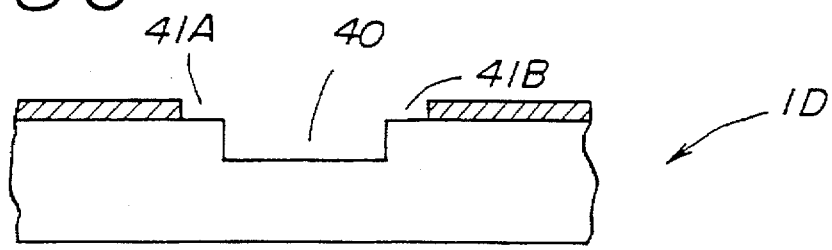

A sixth embodiment of a mask producing method according to the present invention is illustrated in FIGS. 48A through 48C. In this embodiment, a mask 1D as shown in FIG. 48C is produced. In FIGS. 48A through 48C, those parts which are essentially the same as the corresponding parts shown in FIGS. 46A through 46E are designated by the same reference numerals, and a description thereof will be omitted.

In FIG. 48A, the opaque layer 32 is formed on the glass substrate 31, and the aperture pattern 33 is formed in the opaque layer 32. The aperture pattern 33 has a width of 0.85 μm. The conductor layer 34 for preventing charged up is formed on the glass substrate 31, and a positive EB resist layer 38 is thereafter formed on the layer 34 on glass substrate 31. Then, an electron beam exposure is made with respect to a design pattern region 38A in resist layer 38 located above the central portion of the aperture pattern 33 in the opaque layer 32.

As shown in FIG. 48B, the exposed region 38A of the resist layer 38 is removed by a developing process. A dry etching process using a gaseous mixture of $CCl_4$ and $O_2$ is employed to remove the conductor layer 34 exposed at an aperture 39 in the resist layer 38. An RIE process using a gaseous mixture of $CF_4$ and $O_2$ is used to etch the top surface of the glass substrate 31 which is exposed within the aperture 39 similarly to the above described embodiment. The glass substrate 31 is etched to the depth D which is approximately 0.36 μm.

With reference to FIG. 48C, the resist layer 38 is removed by an ashing process, and the conductor layer 34 is removed by dry etching using a gaseous mixture of $CCl_4$ and $O_2$. Accordingly, the mask 1D is completed.

Figure 49:
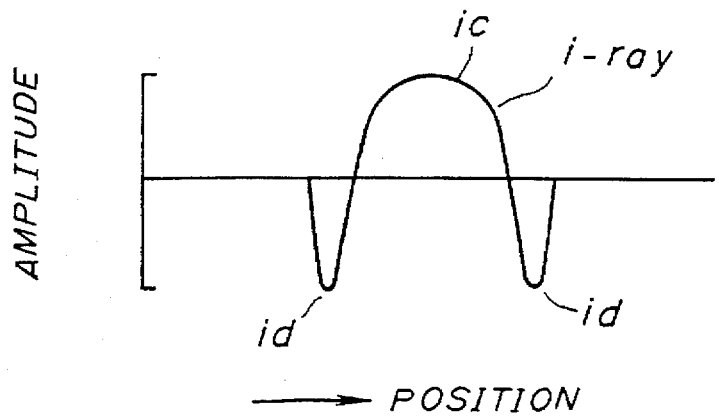
FIG. 49 shows a phase profile of the light transmitted through the mask shown in FIG. 48C.

FIG. 49 shows the phase profile of light transmitted through the mask 1D of FIG. 48C. In FIG. 49, the reference numeral ic denotes the light transmitted through the central portion 40 and the reference numeral id denotes the light transmitted through the phase shift regions 41A and 41B.

Figure 50A:
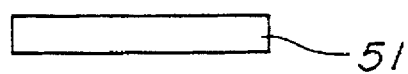
FIGS. 50A through 50H are diagrams for explaining a seventh embodiment of a mask producing method according to the present invention.
Figure 50B:
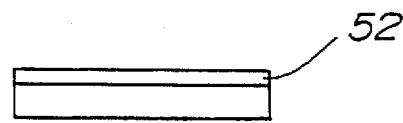

A seventh embodiment of a mask producing method according to the present invention is illustrated in FIGS. 50A through 50H. In FIG. 50A, a transparent substrate 51 is made of glass, quartz or the like. A phase shift layer 52 is formed on the transparent substrate 51 as shown in FIG. 50B. For example, the phase shift layer 52 is made of silicon oxide and is formed by chemical vapor deposition (CVD), sputtering, spin-on-glass (SOG) techniques or the like. In this embodiment, the phase shift layer 52 has a thickness of 3900 Å so as to invert the phase of the light.

Figure 50C:
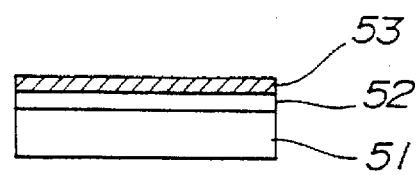

In FIG. 50C, an opaque layer 53 is formed on the phase shift layer 52. For example, the opaque layer 53 is made of Cr and has a thickness of 700 to 1000 Å.

Figure 50D:
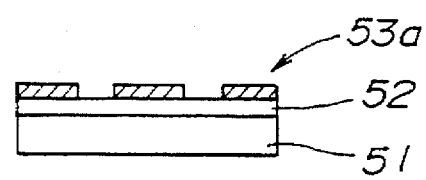

Next, an EB resist is formed on the opaque layer 53 and electron beam drawing, developing and etching processes are carried out with respect to the opaque layer 53. As a result, a pattern 53a of the opaque layer 53 is formed as shown in FIG. 50D.

Figure 50E:
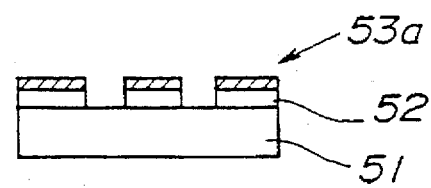

The pattern 53a of the opaque layer 53 is used as a mask when etching the phase shift layer 52 as shown in FIG. 50E. In this embodiment, the phase shift layer 52 is an oxide layer and an RIE process using a gaseous mixture of $CF_4$ and $CHF_3$ is used for etching.

Figure 50F:
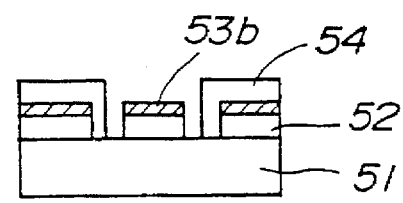
Figure 50G:
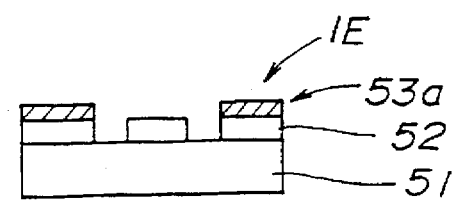

Then, an EB resist layer 54 is formed as shown in FIG. 50F, and an unwanted portion 53b of the opaque layer 53 is exposed to electron beam drawing and developing processes.

Figure 50H:
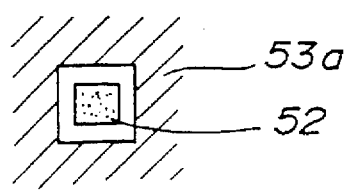

Finally, the EB resist layer 54 is removed and the unwanted portion 53b of the opaque layer 53 is removed by an etching so as to compete as mask 1E. The mask 1E corresponds to a fifth embodiment of a mask according to the present invention. FIG. 50H is a plan view of the mask 1E of FIG. 50G.

An eighth embodiment of a mask producing method according to the present invention is illustrated in FIGS. 51A through 51G. In. FIGS. 51A through 51G, parts which are essentially the same as corresponding parts shown in FIGS. 50A through 50H are designated by the same reference numerals, and a description thereof will be omitted. Steps shown in FIGS. 51A through 51C respectively correspond to the steps shown in FIGS. 50A through 50C, but the phase shift layer 52 is omitted in this embodiment.

Figure 51:
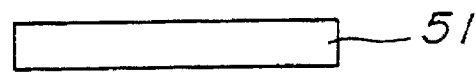
FIGS. 51A through 51G are diagrams for explaining an eighth embodiment of a mask producing method according to the present invention.
Figure 51:
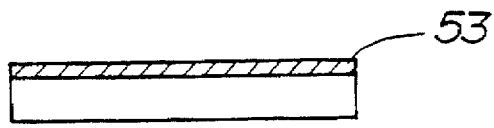
Figure 51:
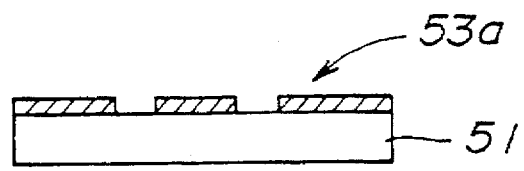
Figure 51:
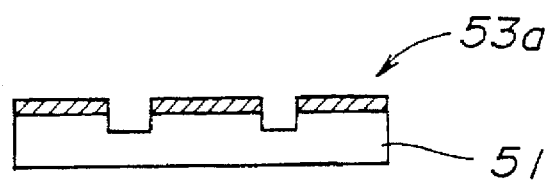
Figure 51:
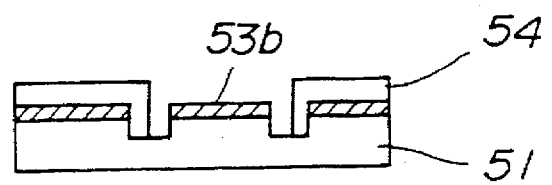
Figure 51:
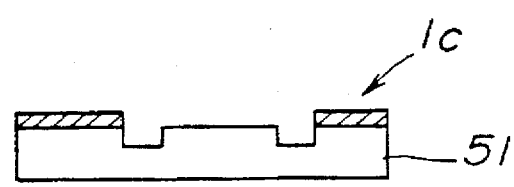
Figure 51:
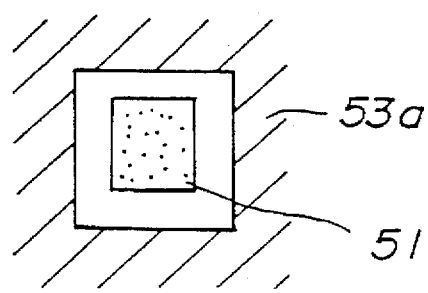

In FIG. 51D, the pattern 53a of the opaque layer 53 is used as a mask for etching the transparent substrate 51. In this embodiment, an RIE process using a gaseous mixture of $CF_4$ and $CHF_3$ is used for etching, and the uncovered transparent substrate 51 is etched to a predetermined depth. To invert the phase of the light, the predetermined depth is 3900 Å.

An EB resist layer 54 is formed as shown in FIG. 51E, and the unwanted portion 53b of the opaque layer 53 is exposed to electron beam drawing and developing processes.

Finally, the EB resist layer 54 is removed and the unwanted portion 53b of the opaque layer 53 is removed by etching so as to complete the mask 1C shown in FIG. 51F. FIG. 51G is a plan view of the mask 1C of FIG. 51F.

According to seventh and eighth embodiments of the mask producing method of the invention, the opaque layer is used as a mask during etching of the phase shift layer or the transparent substrate. Hence, positioning errors between the pattern of the opaque layer and the phase shift pattern are prevented by self-alignment.

A ninth embodiment of the mask producing method according to the present invention is illustrated in FIGS. 52A through 52F. In FIGS. 52A through 52F, parts which are essentially the same as corresponding parts in FIGS. 51A through 51G are designated by the same reference numerals, and a description thereof will be omitted.

Figure 52A:
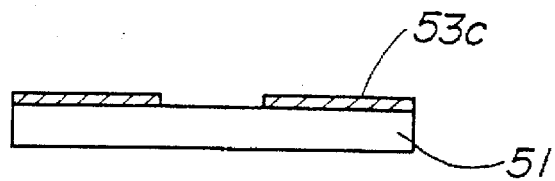
FIGS. 52A through 52F are diagrams for explaining a ninth embodiment of a mask producing method according to the present invention.

In FIG. 52A, the opaque layer 53 is formed on the transparent substrate 51 and a pattern is formed by electron beam drawing after an EB resist layer (not shown) is formed on the opaque layer 53. This pattern is developed and the opaque layer 53 is patterned by etching. For example, the opaque layer 53 is made of Cr and is sputtered onto the transparent substrate 51. The EB resist layer is removed after the patterning.

Figure 52B:
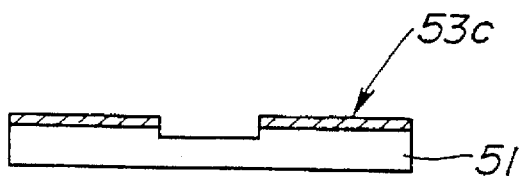

In FIG. 52B, the pattern 53a of the opaque layer 53 is used as a mask as the transparent substrate 51 is etched to a predetermined depth. The exposed transparent substrate 51 is etched using a parallel plate type RIE apparatus with a high-frequency excitation of 13.56 MHz. For example, the etching is carried out with a power of approximately 0.1 W/cm$^2$ at a pressure of 0.1 to 0.05 Torr using a gaseous mixture of $CF_4$ or $CHF_3$ and $O_2$ as the etchant gas. Substrate 51 is etched to a depth of $\lambda/2(n-1)$ by detecting the depth using an end point detector. When $\lambda=0.365$ 82 m, $\lambda/2(n-1)=0.39$ μm.

Figure 52C:
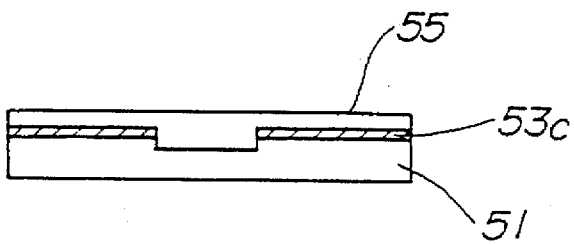

In FIG. 52C, a positive resist layer 55 (for example, OFPR-800) is formed on the transparent substrate 51 and the pattern 53c to a thickness of approximately 1.0 μm after the etching of the transparent substrate 51 and prebaked at a temperature of 100° C.

Figure 52D:
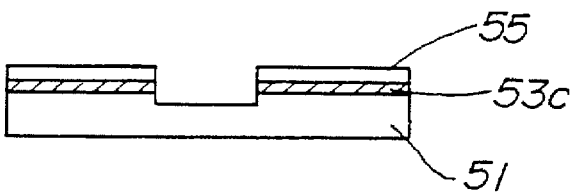

In FIG. 52D, a resist exposure light such as a monochromatic light of 40 to 60 mJ/cm$^2$ and a wavelength of 436 nm is used to illuminate the entirety of the transparent substrate 51 from behind so as to expose only the resist layer 55 on the portions of the transparent substrate 51 not covered by opaque pattern 53c. Thereafter, the transparent substrate 51 is submerged in a solution containing 2.38% of TMAH for 40 seconds, and a developing process is carried out so that the resist layer 55 remains only on the pattern 53c. Rinse and dry processes are then carried out.

Figure 52E:
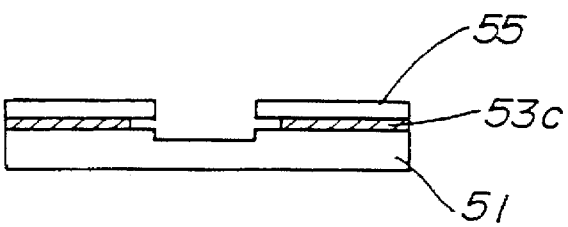

After the resist pattern is formed, side etching is carried out to remove portions of the pattern 53c. The side etching is controlled by the etching time so that approximately 0.4 to 0.8 μm of the opaque pattern 53 is removed on each side as shown in FIG. 52E.

Figure 52F:
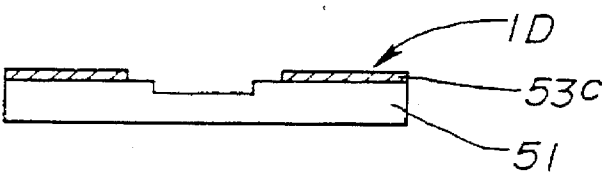

Finally, as shown in FIG. 52F, the resist layer 55 remaining on the opaque layer 53 is removed by $O_2$ ashing and a mask which is substantially the same as the mask 1D shown in FIG. 48C is completed.

A tenth embodiment of the mask producing method according to the present invention is illustrated in FIGS. 53A through 53F. In FIGS. 53A through 53F, parts which are essentially the same as corresponding parts of FIGS. 52A through 52F are designated by the same reference numerals, and a description thereof will be omitted.

Figure 53A:
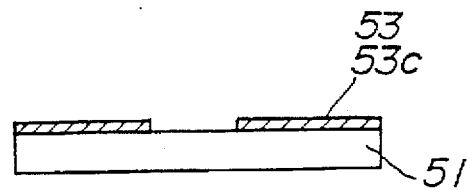
FIGS. 53A through 53F are diagrams for explaining a tenth embodiment of a mask producing method according to the present invention.
Figure 53B:
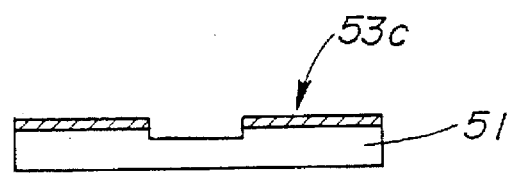
Figure 53C:
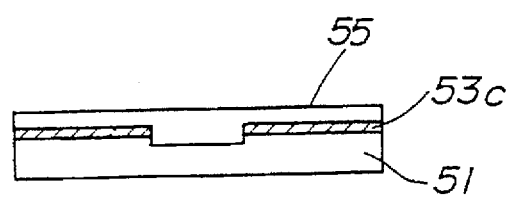

Steps shown in FIGS. 53A through 53C respectively correspond to the steps shown in FIGS. 52A through 52C. However, in FIG. 53B, the transparent substrate 51 is etched to a depth of $\lambda/2(n-1)$, where $\lambda=0.365$ μm and $\lambda/2(n-1)=0.39$ μm.

Figure 53D:
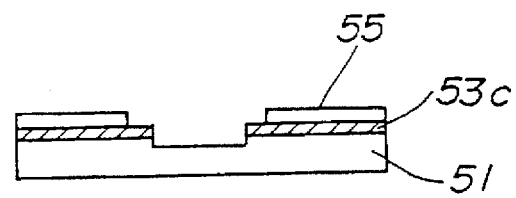

In FIG. 53D, a resist exposure region light is used to illuminate the entirety of the transparent substrate 51 from behind so as to expose only the resist layer 55 on the portions of transparent substrate 51 which are not covered by opaque pattern portions 53c. Thereafter, a developing process is carried out so that the resist layer 55 remains only on the pattern 53c. Then, in this embodiment, resist layer 55 is overexposed or overdeveloped, or ashing is used for a short time after the developing and drying so as to partially expose the opaque layer 53 as shown.

Figure 53E:
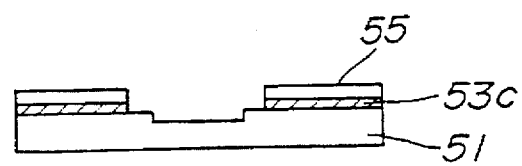

Next, as shown in FIG. 53E, the exposed opaque layer 53 is etched using the resist layer 55 as an etching mask.

Figure 53F:
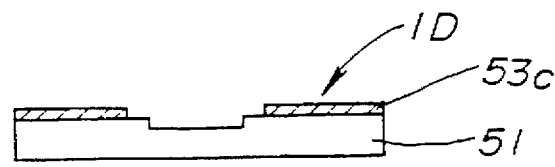

In FIG. 53F, the remaining resist layer 55 on the opaque layer 53 is removed by $O_2$ ashing. As a result, a mask which is substantially the same as the mask 1D is completed.

An eleventh embodiment of a mask producing method according to the present invention is illustrated in FIGS. 54A through 54E. In FIGS. 54A through 54E, parts which are essentially the same as corresponding parts in FIGS. 52A through 52F are designated by the same reference numerals, and a description thereof will be omitted.

Figure 54A:
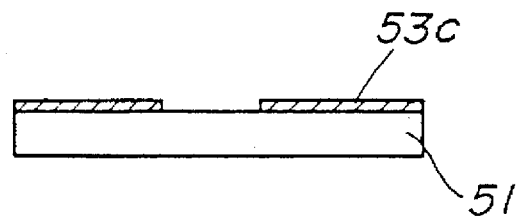
FIGS. 54A through 54E are diagrams for explaining an eleventh embodiment of a mask producing method according to the present invention.
Figure 54B:
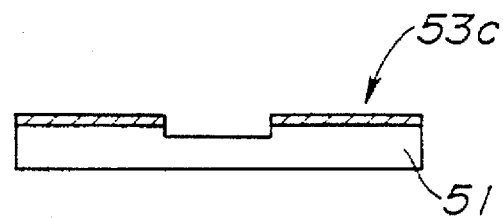

The step illustrated in FIG. 54A may be the same as the step of FIG. 52A. However, in this embodiment, the resist layer 55 is formed on the transparent substrate 51 of FIG. 54B without etching of the transparent substrate 51.

Figure 54C:
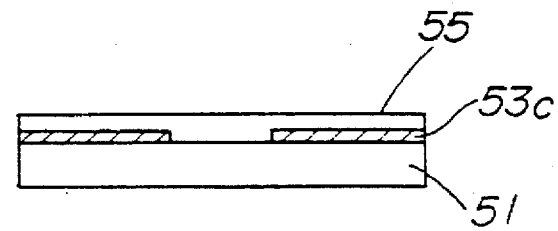

In FIG. 54C, only the resist layer 55 on the portion of the transparent substrate 51 which is not covered by opaque pattern portions 53c is moved similarly to the step shown in FIG. 52D. Thereafter, the resist layer 55 is used as an etching mask to etch the transparent substrate 51 to a depth of $\lambda/2(n-1)$, where $\lambda=0.365$ μm and $\lambda/2(n-1)=0.39$ μm.

Figure 54D:
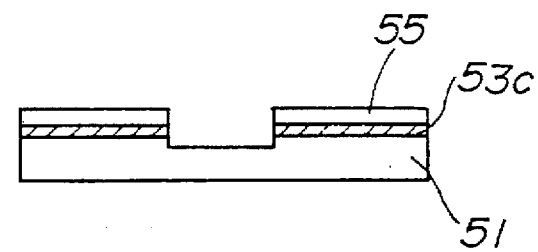
Figure 54E:
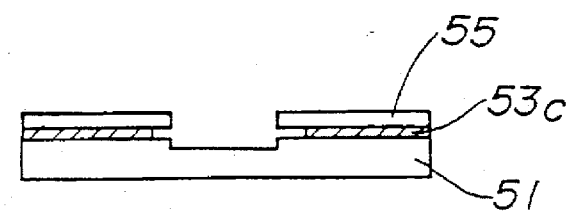
Figure 54F:
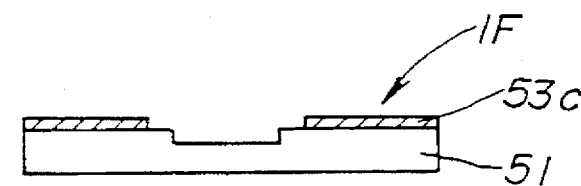

In FIG. 54D, a portion of the pattern 53c of the opaque layer 53 is removed by a side etching. The step shown in FIG. 54E may be the same as the step shown in FIG. 52F.

According to the embodiments described in conjunction with FIGS. 52A through 54F, there is no need to match the positions of the pattern of the opaque layer and the phase shift pattern. Thus, it is possible to produce a mask having a pattern with a high degree of accuracy and no positioning error. In addition, in embodiments where the shift layer and the substrate are separate, independent components, the adhesion between the phase shift layer and the substrate during cleaning and the like may be affected depending on the material used as the phase shift layer. However, in embodiments where a portion of the transparent substrate itself is used as the phase shift layer or phase shift region, the material of the phase shift layer is not a problem. Accordingly, there is no need to take into consideration the stability and durability of the material used for the phase shift layer, and it is possible to easily form fine patterns exceeding the resolution limit of the exposure apparatus.

Figure 55:
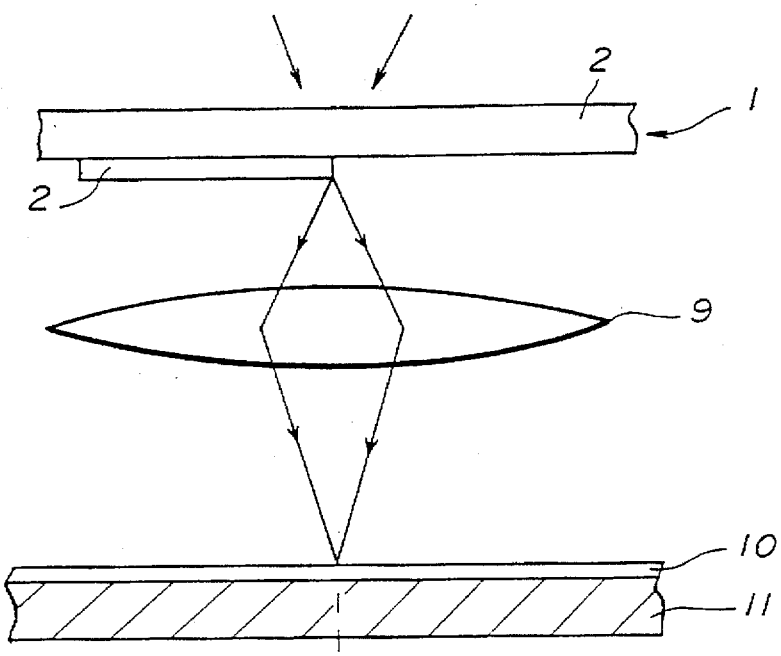
FIGS. 55A through 55C are diagrams for explaining the pattern forming method of the invention using a mask.
Figure 55:
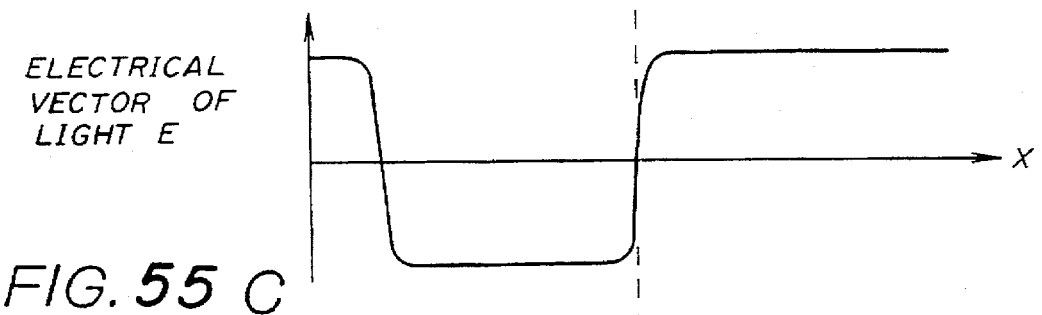
Figure 55:
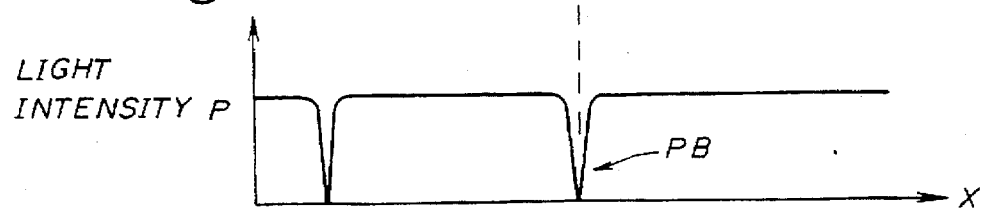

A pattern forming method according to the present invention is illustrated in FIGS. 55A through 55C which are diagrams for explaining a pattern forming method using the edge portion of the phase shift layer of the mask. FIGS. 55A through 55C correspond to FIGS. 10A through 10C, and FIGS. 55A through 55C, parts which are essentially the same as corresponding parts in FIG. 12 are designated by the same reference numerals, and a description thereof will be omitted.

In FIG. 55A, a phase shift layer 3a having a refractive index n and a thickness t is formed on the transparent substrate 2 so as to constitute a mask 1. The pattern of mask 1 is imaged onto the photoresist layer 10 on the semiconductor wafer 11 via the imaging lens system 9. The desired pattern is imaged by utilizing the edge portion of the phase shift layer 3a.

The light impinging on mask 1 is transmitted through the phase shift layer 3a. Since the refractive index n of the phase shift layer 3a is different from that of air or vacuum, the phase of the transmitted light is shifted. The phase shift quantity (S) is described by the relationship $S=(n-1)t/\lambda$ in degrees or $2\pi(n-1)t/\lambda$ in radians. For the sake of convenience, it is assumed for purposes of the following description that the phase shift quantity S is equal to $\pi$ so that the phase of the transmitted light is inverted.

As shown in FIG. 55B, the phase of the electrical vector E of the light transmitted through the mask 1 is inverted in those areas of the mask where the light passes through the pattern of the phase shift layer 3a. When light having an electrical vector distribution as shown in FIG. 55B is used to illuminate the photoresist layer 10 and is absorbed thereby, the light intensity distribution on the photoresist layer 10 is proportional to $E^2$. Hence, as shown in FIG. 55C, a black pattern PB having a narrow width is formed at the position where the phase transition occurs. In other words, when the sign of the electrical vector E changes in FIG. 55B, there is a point where the electrical vector E becomes zero. The light intensity distribution is proportional to $E^2$, and a minimum value of the light intensity P is zero at the point where the electrical vector E is zero. Accordingly, it is possible to obtain a clear black pattern.

Generally, when the phase shift layer 3a shifts the phase of the transmitted light, it is possible to obtain a pattern in which the phase shift is spatially distributed. When the phase shift is 180°, the light intensity P at the position where the 180° phase shift occurs is always zero, and the time interval thereof is also zero. Hence, the light intensity P at the edge portion of the phase shift layer 3a is zero. When the phase shift is other than 180°, the sign of the electrical vector E is the same or opposite depending on the time, and the time interval of the light intensity P is not zero.

Figure 56:
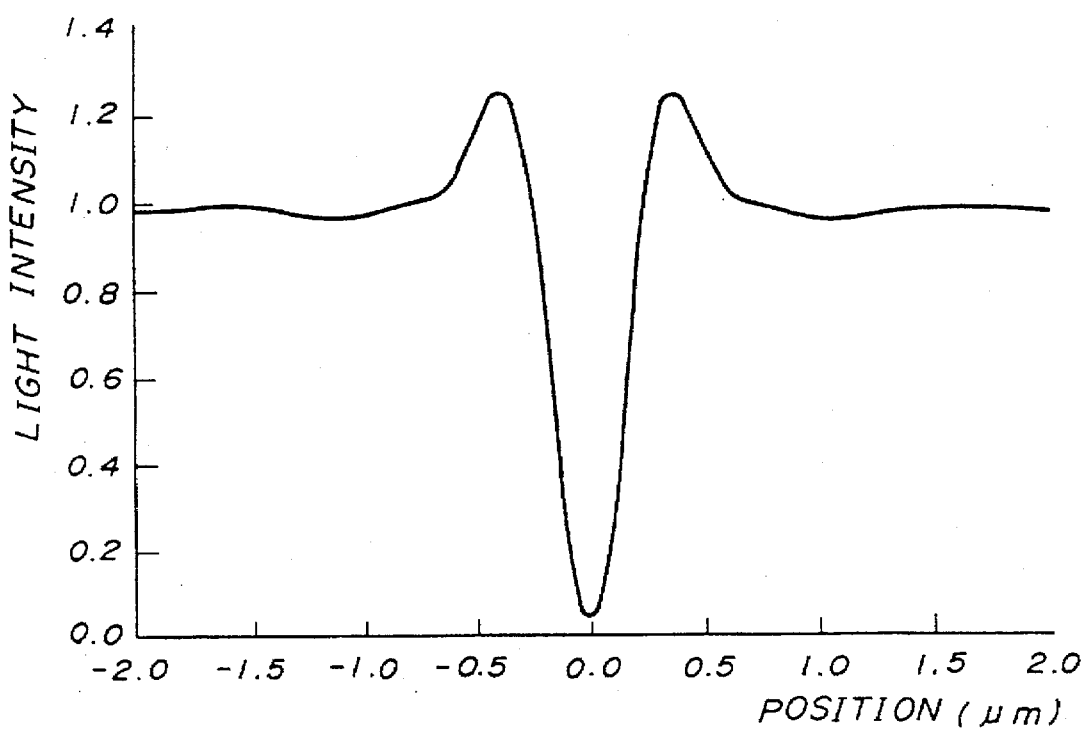
FIGS. 56A and 56B show light intensity distribution patterns for explaining the imaging using the edge portion of the phase shift layer.
Figure 56:
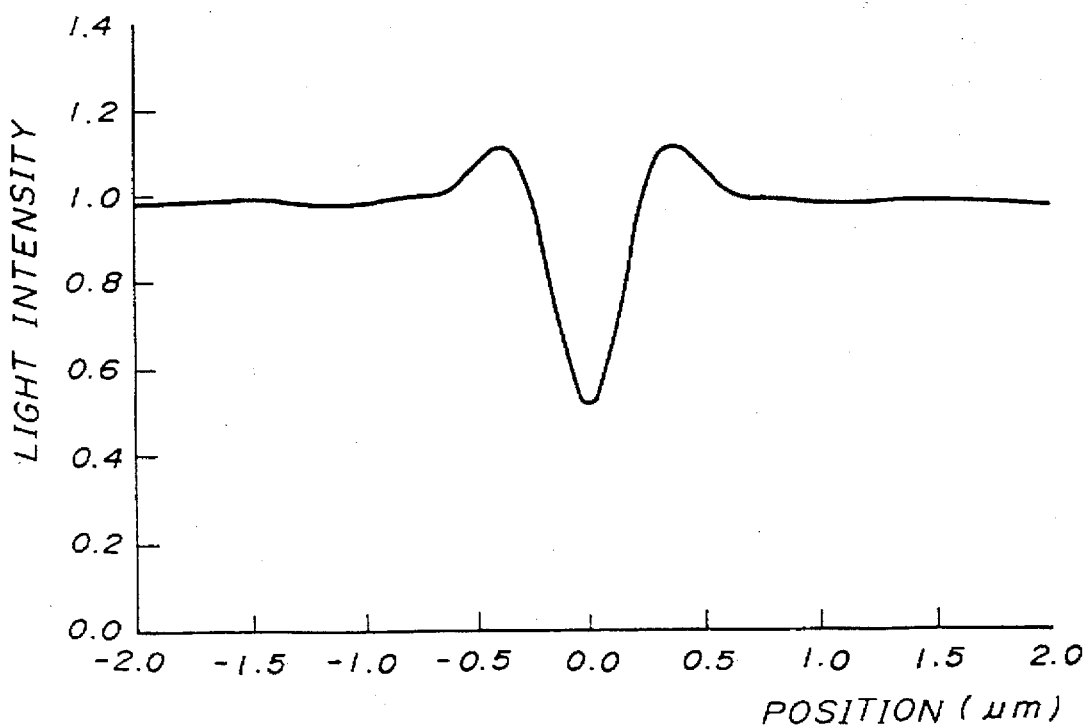

An imaging procedure which uses the edge portion of the phase shift layer is illustrated in FIGS. 56A and 56B.

FIG. 56A shows the light intensity distribution for a case where the phase shift layer produces a 180° phase shift, that is, the phase of the transmitted light is inverted. In FIG. 56A, the region to the left of the abscissa point 0.0 corresponds to the region where there has been a phase shift of 180°, and this phase shift region is adjacent an aperture region to the right of the abscissa point 0.0 where there has been no phase shift. FIG. 56A shows the light intensity distribution at an edge portion of the phase shift layer. The light intensity decreases to approximately zero at the central portion of the pattern corresponding to the edge of the phase shift layer. By utilizing this image principle, it is possible to obtain a line pattern which exceeds the conventional resolution limits. It is possible to obtain similar effects so long as the phase difference at the edge portion of the phase shift layer is within the range of from about 150° to about 210° (180°±30°).

FIG. 56B shows the light intensity distribution for a case where the phase shift layer produces a 90° phase shift. When the phase shift quantity is 90°, the phase of the light transmitted through the phase shift layer and the phase of the light transmitted through the aperture portion may coincide or be inverted. Hence, the minimum value of the light intensity is not zero when the time interval thereof is taken. In FIG. 56B, the minimum value of the light intensity is approximately 0.5 or greater and is approximately 50% of the light intensity transmitted through uniform portions of the mask. When the developing level is less than this light intensity, it is possible to carry out a developing process in which the pattern illuminated is negated. If the phase difference at the edge portion of the phase shift layer is 90°±15°, the pattern is negated and not formed under normal developing conditions (developing level of 35%). In addition, when the developing level is set at an intermediate level between the minimum value and the uniform value of the light intensity, a pattern is developed at the central portion of the light intensity distribution curve.

Figure 57:
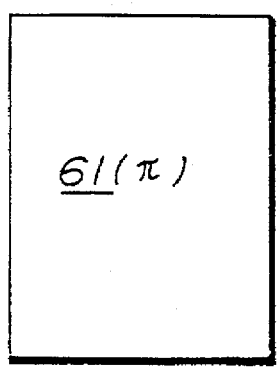
FIGS. 57A and 57B are diagrams for explaining the formation of a loop shaped pattern using a fourth embodiment of a pattern forming method according to the present invention.
Figure 57:
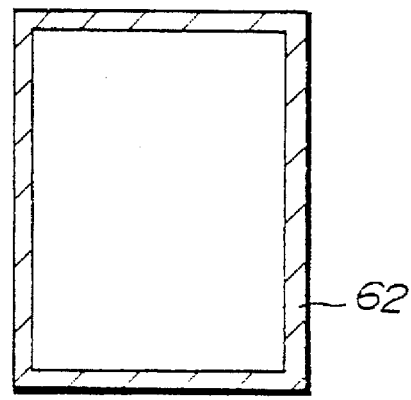

A fourth embodiment of a pattern forming method according to the present invention is illustrated in FIGS. 57A and 57B. FIGS. 57A and 57B are diagrams for explaining the formation of a loop shaped pattern according to this embodiment of the invention.

FIG. 57A shows a mask pattern. A mask 61 is formed on an aperture 60 in the transparent substrate. The mask 61 has a phase shift quantity corresponding to the optical path difference of the half-waves of the incoming light, and shifts the phase of the transmitted light by 180°. When such a mask pattern is imaged, the imaged pattern is shown in FIG. 57B. The portions where only the aperture 60 or only the phase shift layer 61 is imaged have a constant light intensity and are white. A black pattern 62 is formed at the boundary portion between the aperture 60 and the phase shift layer 61. In other words, when the light transmitted through the aperture 60 and the light transmitted through the phase shift layer 61 mix, the interference between mutually opposite phases causes a cancellation of the light and the light intensity becomes zero, thereby forming a black pattern.

When the phase shift layer 61 is made of silicon oxide and an i-ray beam from a mercury lamp is used as the light for the exposure, the refractive index of the phase shift layer 61 is approximately 1.47 which differs by approximately 0.47 with respect to the refractive index of air which is approximately 1.00. The thickness of the phase shift layer 61 is approximately 0.388 μm. In order to cancel the amplitude of the mixed light due to the interference, the use of an inverted phase where the phase shift is 180° is most effective. However, the phase shift quantity is not limited to 180° and light intensity can be effectively reduced in cases where the phase is shifted within the range of from about 150° to about 210° (180°±30°).

When a phase shift layer 61 having a phase shift quantity of 180° is formed above the aperture which produces no phase shift, as in the case of the mask pattern shown in FIG. 57A, a black pattern is formed at positions corresponding to the edge portion of the phase shift layer 61. In this case, the black pattern has a closed loop shape.

Figure 58:
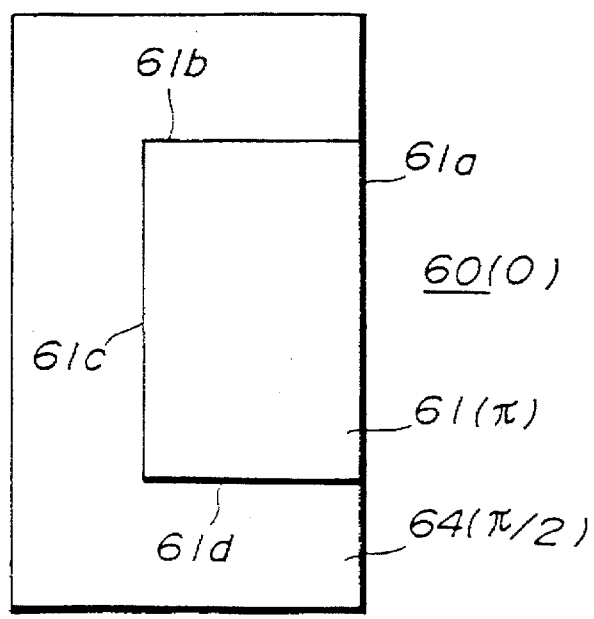
FIGS. 58A and 58B are diagrams for explaining the formation of an open shaped pattern using a fourth embodiment of the pattern forming method according to the present invention.
Figure 58:
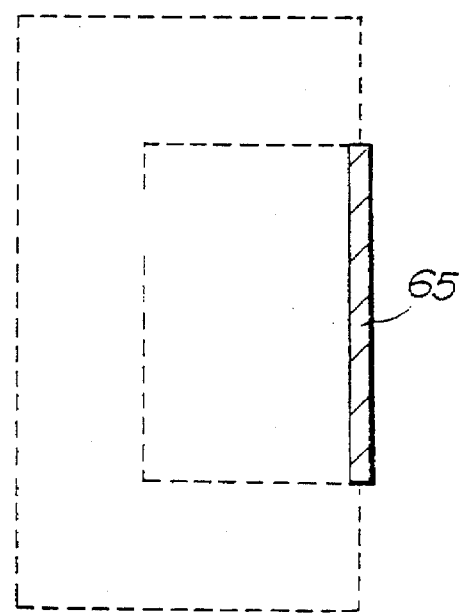

FIGS. 58A and 58B respectively show a mask pattern for forming an open shape (line segment) and an imaged pattern thereof.

In FIG. 58A, the phase shift layer 61 is formed over the aperture 60, and one side of the phase shift layer 61 is used for forming a line segment at edge portion 61a thereof. A phase shift layer 64 having a phase shift quantity of 90° is formed adjacent to the remaining sides of the phase shift layer 61 where no image is to be produced. In other words, of the four sides of the phase shift layer 61 having a phase shift quantity of 180°, one side 61a forms a boundary with a region in which the phase shift quantity is zero (aperture 60), and this side 61a forms a black pattern 65 in the imaged pattern shown in FIG. 58B. The other sides 61b, 61c and 61d are adjacent to a phase shift layer 64 which has a phase shift quantity of 90°. Hence, the phase shift at these sides 61b, 61c and 61d is 90°, and the decrease in light intensity is small at the edge portions of the phase shift layer 61 corresponding to these sides 61b, 61c and 61d. The peripheral sides of the phase shift layer 64 also have a phase shift quantity of 90° and the decrease in light intensity of these edges is similarly small. It is possible to produce only a black pattern 65 by adjusting the developing level. In this case, a gray level is formed between the white and black levels, but it is of course possible to use two or more halftones.

Thus, by using a plurality of phase shift layers having different phase shift quantities, it is possible to form a pattern of an open shape such as a line segment.

Figure 59:
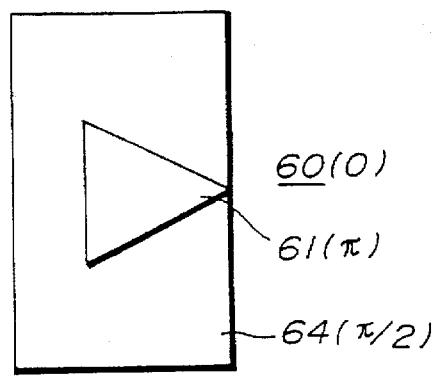
FIGS. 59A and 59B are diagrams for explaining the formation of a point pattern using a fourth embodiment of the pattern forming method according to the present invention.
Figure 59:
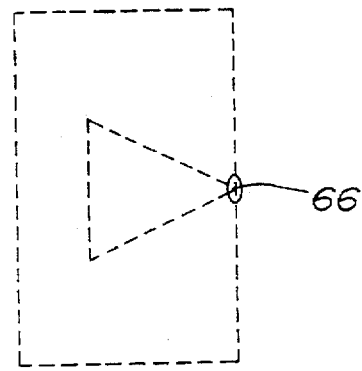

FIGS. 59A and 59B respectively show a mask pattern for forming a dot pattern and an imaged pattern thereof.

In FIG. 59A, a phase shift layer 61 having a phase shift quantity of 180° is formed above the aperture 60. A phase shift layer 64 having a phase shift quantity of 90° surrounds the phase shift layer 61 except for one vertex portion thereof. In other words, the phase shift layer 61 is adjacent to the aperture 60 at only one vertex portion of the phase shift layer 61. When such a mask pattern is imaged, the imaged pattern is as shown in FIG. 59B in which a black pattern 66 is formed only at the portion where the phase shift layer 61 and the aperture 60 connect. Because the phase shift quantity is 90° at the boundary of the phase shift layers 61 and 64, the decrease in light intensity at this boundary is small compared to that at the portion corresponding to the black pattern 66. In addition, the outer peripheral edge portions of the phase shift layer 64 also have a phase shift quantity of 90°, and the decrease in the light intensity is similarly small. For this reason, it is possible to develop only the black pattern 66 as the desired pattern and to treat the outer patterns which are halftones as white patterns.

A case where the pattern to be formed is a line segment pattern has been described above. The following is a description of the formation of a pattern which has an intersection.

Figure 60A:
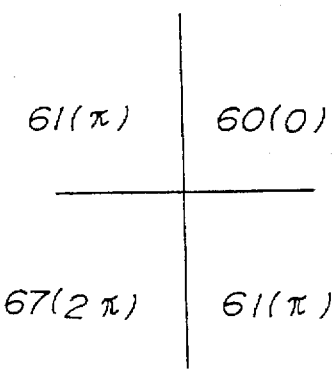
FIGS. 60A through 60C are diagrams for explaining the formation of an intersecting line pattern using a fourth embodiment of the pattern forming method according to the present invention.
Figure 60B:
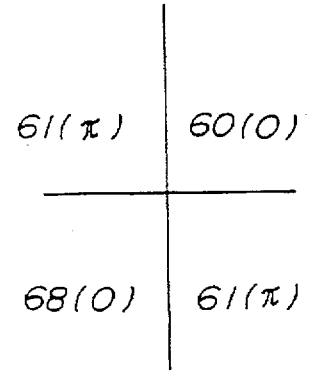
Figure 60C:
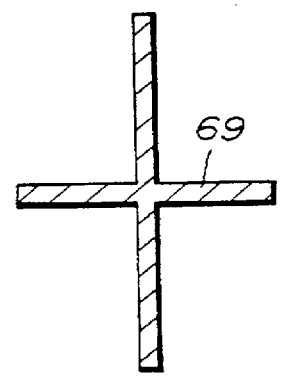

FIGS. 60A and 60B show mask patterns for forming an intersecting pattern, and FIG. 60C shows an imaged pattern which is formed by the mask patterns shown in FIGS. 60A and 60B.

FIG. 60A shows a first mask pattern. The surface of the mask pattern is divided into four quadrants in correspondence with the regions which are divided by the intersecting lines. The aperture 60 which produces no phase shift is provided in the first quadrant. A phase shift layer 61 which has a phase shift quantity of 180° is provided in the two quadrants adjacent to aperture 60. A phase shift layer 67 which has a phase shift quantity of 360° is provided in the remaining quadrant. In other words, the linear boundary between any two quadrants provides a phase shift quantity of 180°.

FIG. 60B shows a second mask pattern. Similar to the first mask pattern shown in FIG. 60A, the surface of the mask pattern shown in FIG. 60B is divided into four quadrants. The aperture 60 which produces no phase shift is provided in the first quadrant. A phase shift layer 61 which has a phase shift quantity of 180° is provided in two quadrants adjacent to aperture 60. An aperture 68 which produces no phase shift is provided in the remaining quadrant. In this case also, the linear boundary between any two quadrants produces a phase shift quantity of 180°.

When the mask patterns shown in FIGS. 60A and 60B are imaged, an imaged pattern as shown in FIG. 60C is obtained.

That is, the portions producing a uniform phase are imaged as a white pattern, and the edge portions which provide a 180° phase shift are imaged as a black pattern 69.

The intersecting lines are not limited to straight lines and may be curved.

Figure 61:
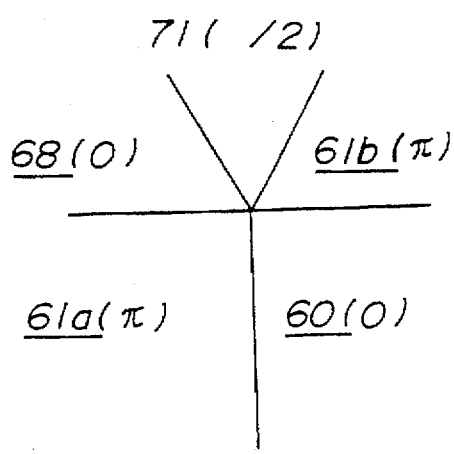
FIGS. 61A and 61B are diagrams for explaining the formation of a T-shaped pattern using a fourth embodiment of the pattern forming method according to the present invention.
Figure 61:
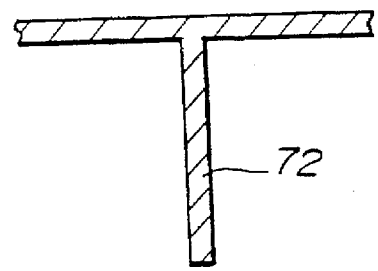

FIGS. 61A and 61B respectively show a mask pattern for forming a T-shaped pattern and a imaged pattern thereof.

In FIG. 61A, phase shift layers 61a and 61b having a phase shift quantity of 180° are formed adjacent to aperture 60 where no phase shift is produced. In addition, an aperture 68 where no phase shift is produced is formed over the phase shift layer 61a so as to present a boundary which provides a phase shift of 180°. As a result, a black pattern as shown in FIG. 61B is produced when this mask pattern is imaged. Furthermore, since a black pattern would be produced if the phase shift layers 61b and 68 were directly adjacent to each other so as to form a boundary providing a phase shift of 180°, a phase shift layer 71 capable of producing a phase shift of 90° is formed between phase shift layers 61b and 68. In other words, the decrease in light intensity is relatively small at the boundaries of the phase shift layer 71 because it produces a phase shift of only 90°.

By appropriately adjusting the developing threshold value, such a decrease in light intensity can be developed as a white pattern. As a result, a black pattern 72 as shown in FIG. 61B is imaged.

In FIG. 61A, there is a gap between the aperture 68 and the phase shift layer 61b. However, such a gap may be reduced if necessary.

In semiconductor devices, there is often a need to provide a wide region for making a contact at an intermediate part of an interconnection pattern. FIGS. 62A through 62C show mask patterns for forming such an interconnection pattern, and FIG. 62D shows the imaged pattern which is produced thereby.

Figure 62:
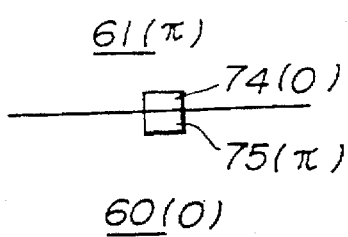
FIGS. 62A through 62D are diagrams for explaining the formation of an interconnection pattern using a fourth embodiment of the pattern forming method according to the present invention.
Figure 62:
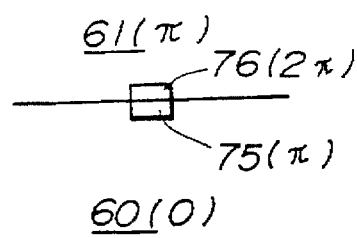
Figure 62:
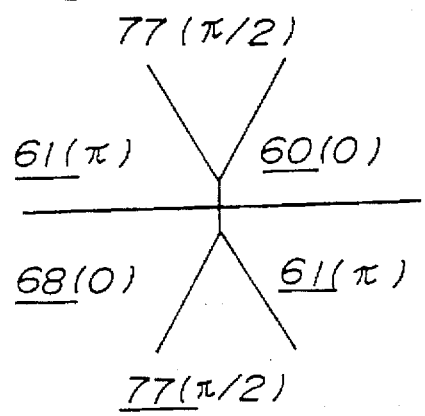
Figure 62:

In FIG. 62A, the aperture 60 which produces no phase shift and the phase shift layer 61 which has a phase shift quantity of 180° are adjacent to each other and present a linear boundary therebetween. A phase shift layer 75 having a phase shift quantity of 180° is formed within the aperture 60 at a central portion of the boundary. An aperture 74 which produces no phase shift is formed in the phase shift layer 61. The aperture 74 and the phase shift layer 75 each has a rectangular shape, and the boundary therebetween is aligned with the linear boundary between the aperture 60 and the phase shift layer 61. In FIG. 62A, all the boundaries indicated by the solid line provide a 180° phase shift.

In FIG. 62B, the boundary which defines each region is formed similarly to FIG. 62A. However, the aperture 74 of FIG. 62A is replaced by a phase shift layer 76 which has a phase shift quantity of 360°. As in the case of the mask pattern of FIG. 62A, there is a 180° phase shift between the upper and lower regions bounded by the straight horizontal boundary. In addition, a rectangular boundary providing a phase shift of 180° is formed at the central portion of the mask pattern.

In FIG. 62C, the mask pattern is generally divided into two regions by a straight horizontal boundary. In the upper region, an aperture 60 which produces no phase shift is formed to the right and a phase shift layer 61 which has a phase shift quantity of 180° is formed to the left. The aperture 60 and the phase shift layer 61 are adjacent to each other for a short distance. In addition, a phase shift layer 77 which has an intermediate phase shift quantity of 90° is 61. The lower region has a structure similar to that of the upper region. That is, in the lower region, an aperture 68 which produces no phase shift is formed to the left beneath phase shift layer 61, and phase shift layer 61 which has a phase shift quantity of 180° is formed to the right beneath aperture 60. The aperture 68 and the phase shift layer 61 in the lower region are adjacent to each other for a short distance. In addition, a phase shift layer 77 which has an intermediate phase shift quantity of 90° is formed between aperture 68 and phase shift layer 61 in the lower region. As a whole, a boundary which produces a 180° phase shift is formed along the straight horizontal line and also at a vertical line segment portion at the central portion of the mask pattern.

FIG. 62D shows an imaged pattern which is obtained when the mask patterns shown in FIGS. 62A through 62C are imaged. In this case, a black pattern 78 which has a wide region at the central portion thereof is imaged.

To make the length of the lines finite in the mask patterns shown in FIGS. 60A, 60B, 61A, 62A, 62B and 62C, it is sufficient to form regions having an intermediate phase shift quantity of 90° or the like at the terminal portions of each line.

Mask patterns for forming various imaged patterns are described above, and the following is a description of the light intensity profiles which are obtained by numerical calculations for some of the described mask patterns.

It is assumed for the sake of convenience in making the following calculations that the light used for the exposure has a wavelength of 365 nm, that the imaging lens system has a numerical aperture NA of 0.50, and that the light from the illumination lens system has a partial coherency $\sigma$ of 0.50.

Figure 63:
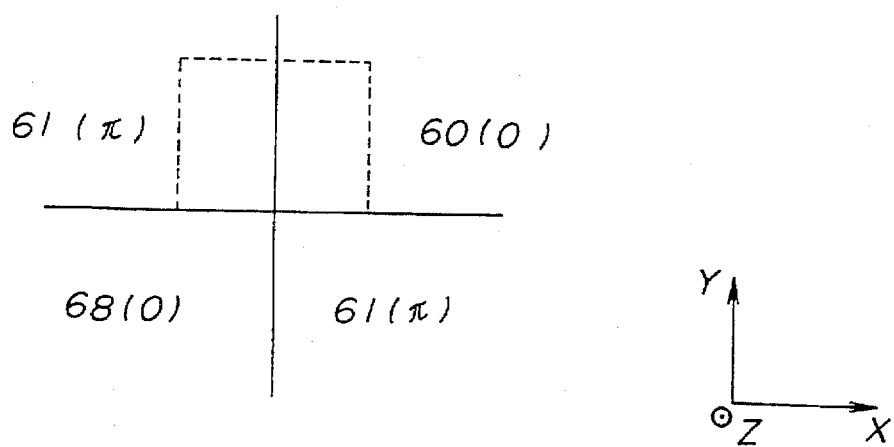
FIGS. 63A through 63C are diagrams for explaining the formation. of an intersecting pattern.
Figure 63:
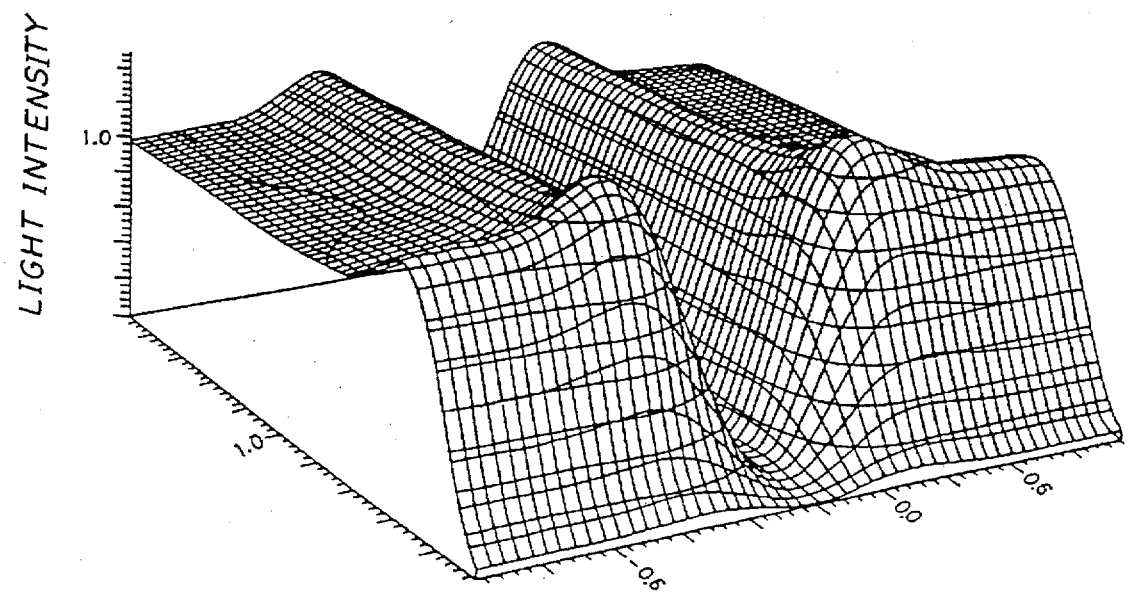
Figure 63:
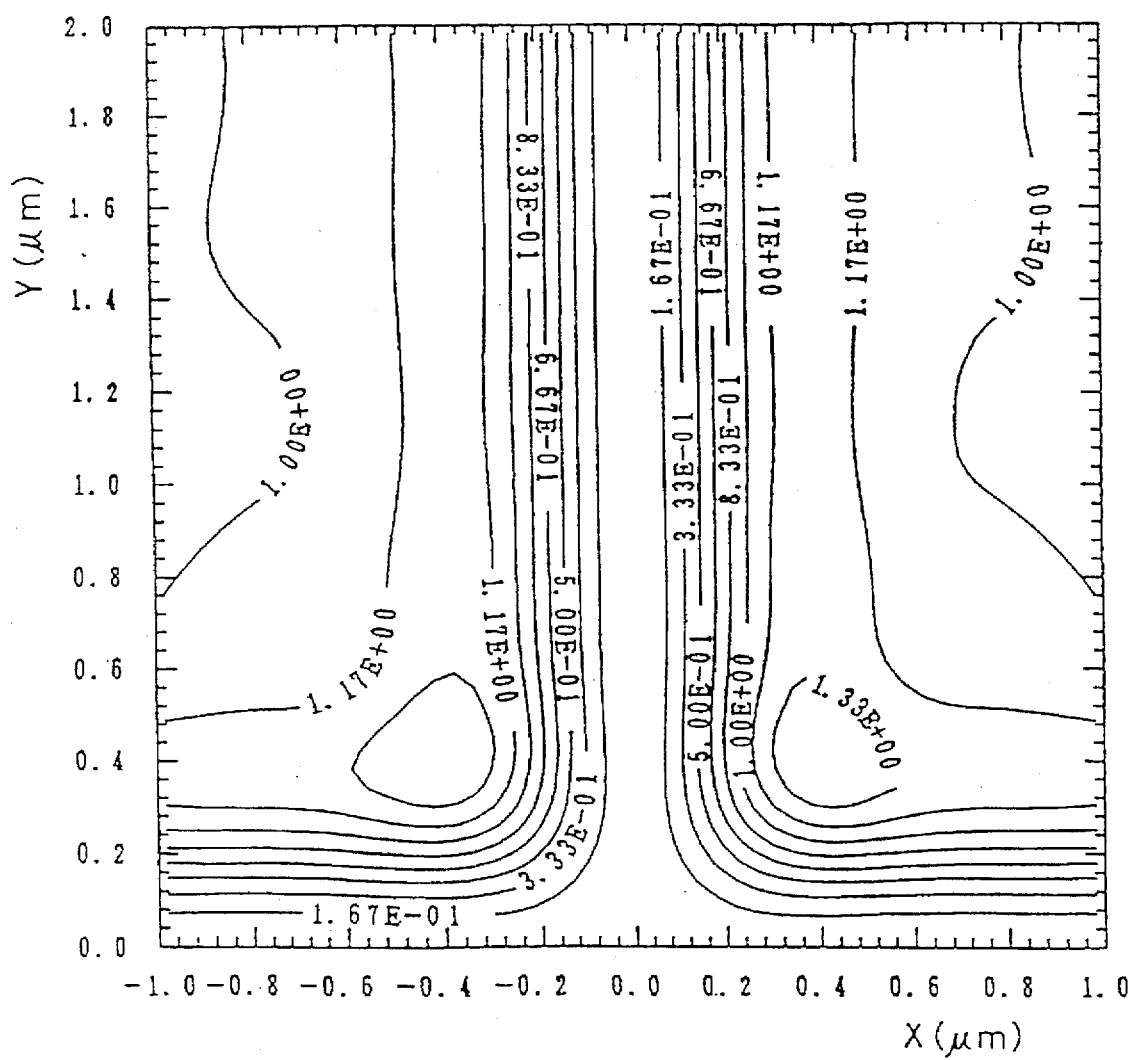

FIGS. 63A through 63C are diagrams for explaining the illumination intensity pattern for imaging intersecting lines.

FIG. 63A generally shows a pattern and a sampling region for the intersecting lines. A mask pattern as shown in FIG. 60B is employed, and the X, Y and Z coordinates shown to the right in FIG. 63A are used. In addition, a region indicated by a phantom line is regarded as the sampling region, and the light intensity within the sampling region is calculated according to a mode. FIG. 63B is a graph showing the light intensity profile within the sampling region shown in FIG. 63A as a three dimensional model. It may be seen from FIG. 63B that a deep valley is formed at the boundary portion accompanying the 90° phase shift. Although FIG. 63B does not show the light intensity profile for the lower half of the pattern of FIG. 63A, it should be apparent to those skilled in the art that the light intensity profile for the lower half of the pattern should have a structure similar to that shown in FIG. 63B. FIG. 63C shows a profile of FIG. 63B on an XY plane where the light intensity profile is described by contour lines of constant light intensity. In other words, regions with the minimum light intensity are formed at the portion of the projection extending along the lower side in the direction X and at the portion of the projection extending along the central portion in the direction Y. Portions where the light intensity gradually increases are formed adjacent to the regions with the minimum light intensity.

Figure 64A:
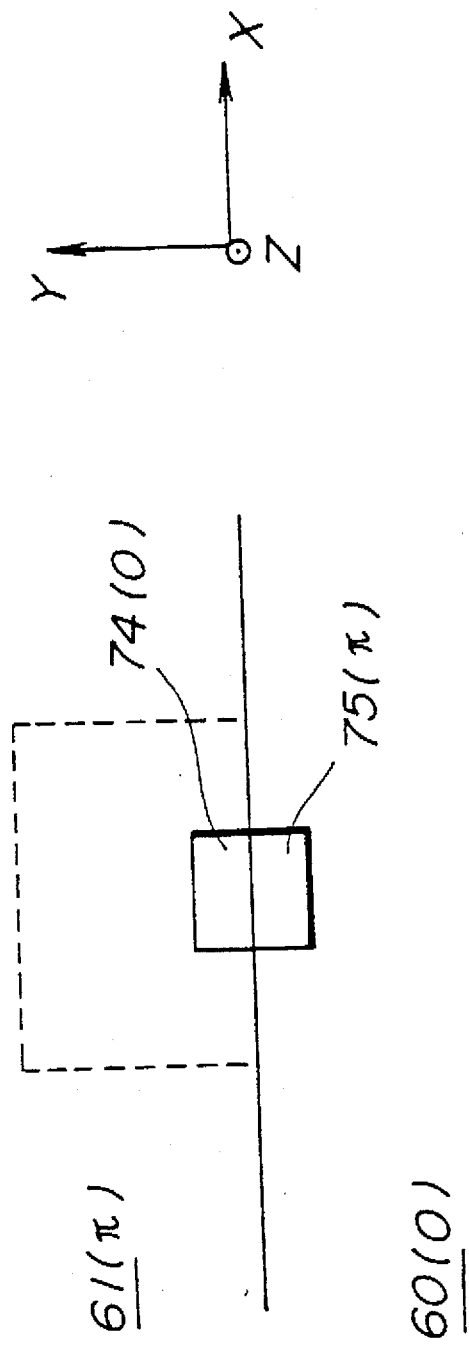
FIGS. 64A through 64C are diagrams for explaining the formation of an interconnection pattern.
Figure 64:
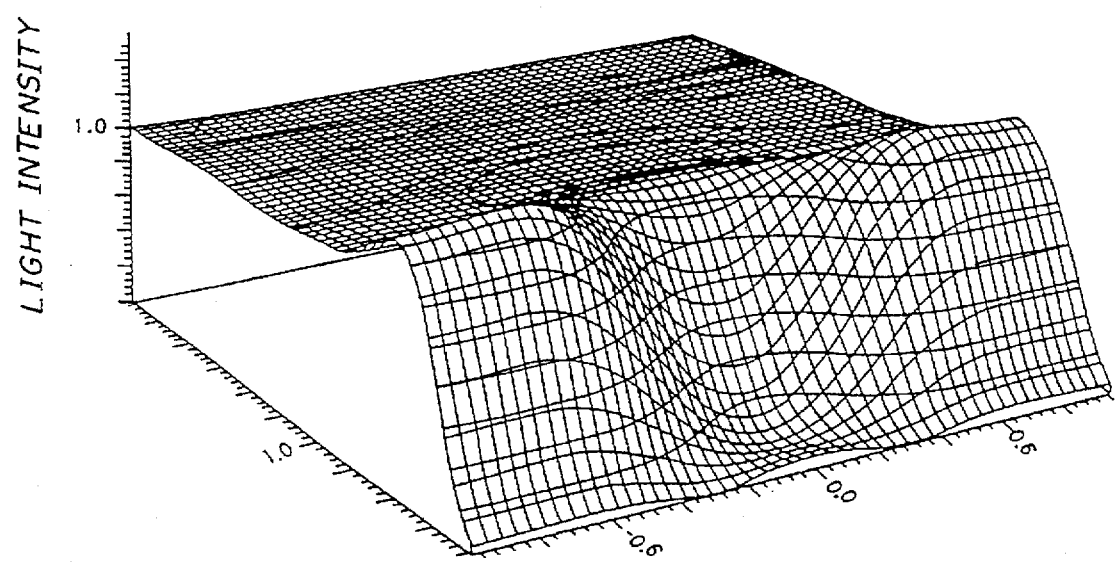
Figure 64:
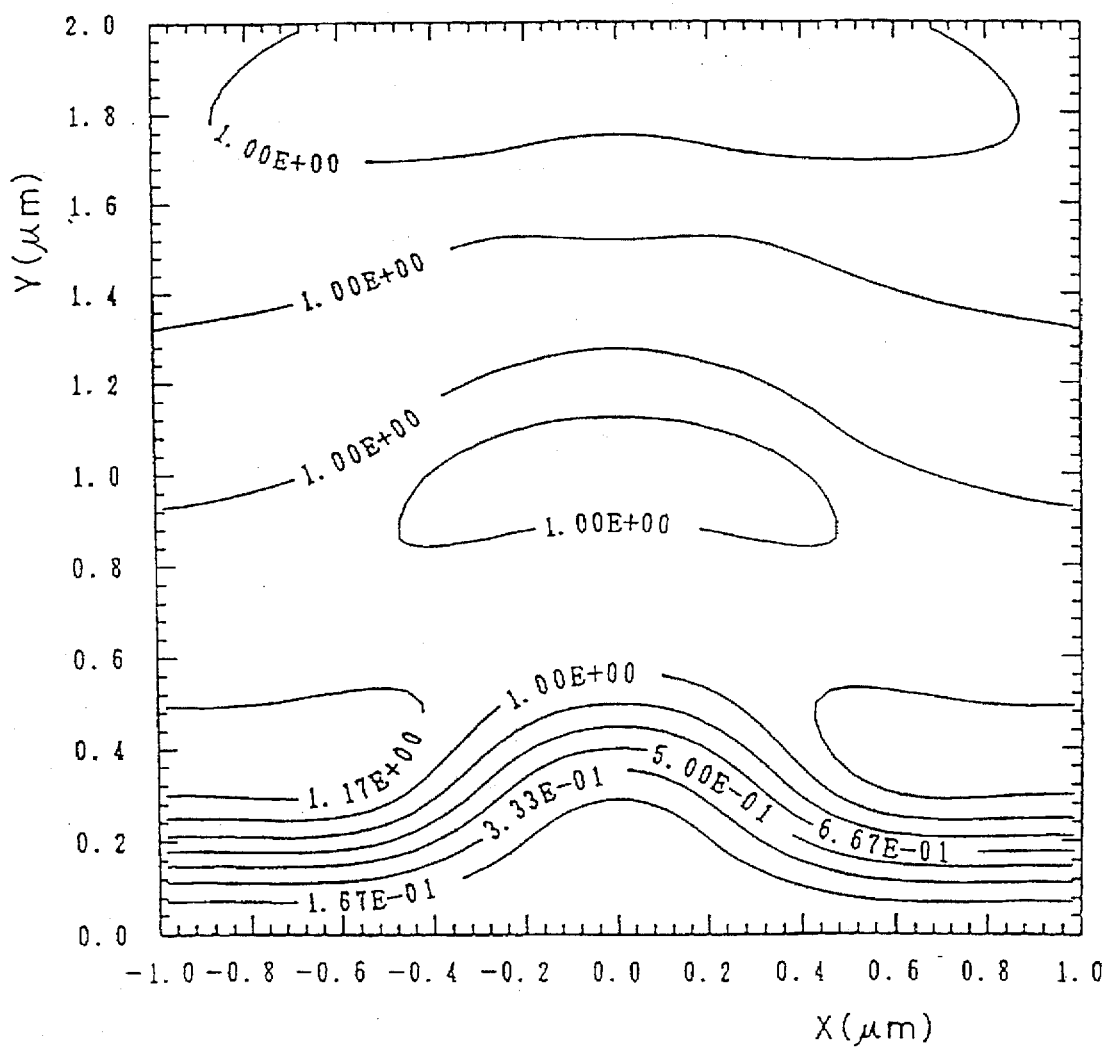

FIGS. 64A through 64C are diagrams for explaining the illumination intensity pattern for imaging interconnections. FIG. 64A shows the mask pattern for the interconnection pattern of FIG. 62A, and a sampling region is indicated by a phantom line. The X, Y and Z coordinates shown to the right hand side of FIG. 64A are used.

FIG. 64B shows the light intensity profile within the sampling region shown in FIG. 64A. A narrow valley is formed along the direction X, and the valley portion widens in the vicinity of a region in which X=0.0. FIG. 64C shows a projection of the light intensity profile of FIG. 64B on the XY plane where the light intensity profile is described by contour lines of constant light intensity. It may be seen from FIG. 64C that a valley portion is formed and the width of this valley portion widens at the central portion of the projection.

Figure 65:
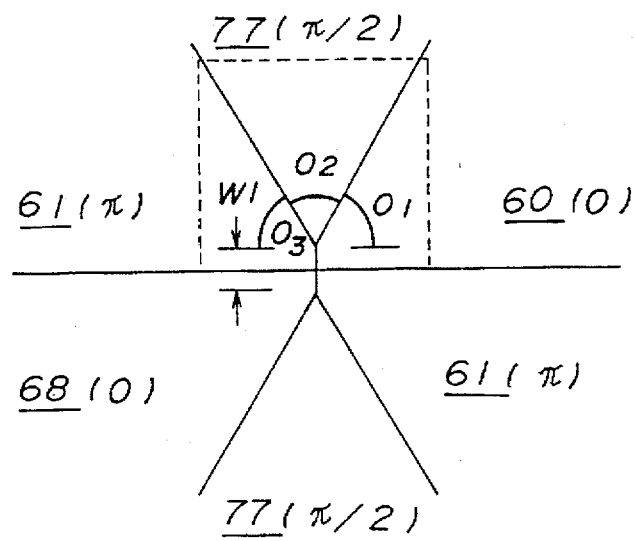
FIGS. 65A through 65C are diagrams for explaining the formation of an interconnection pattern.
Figure 65:
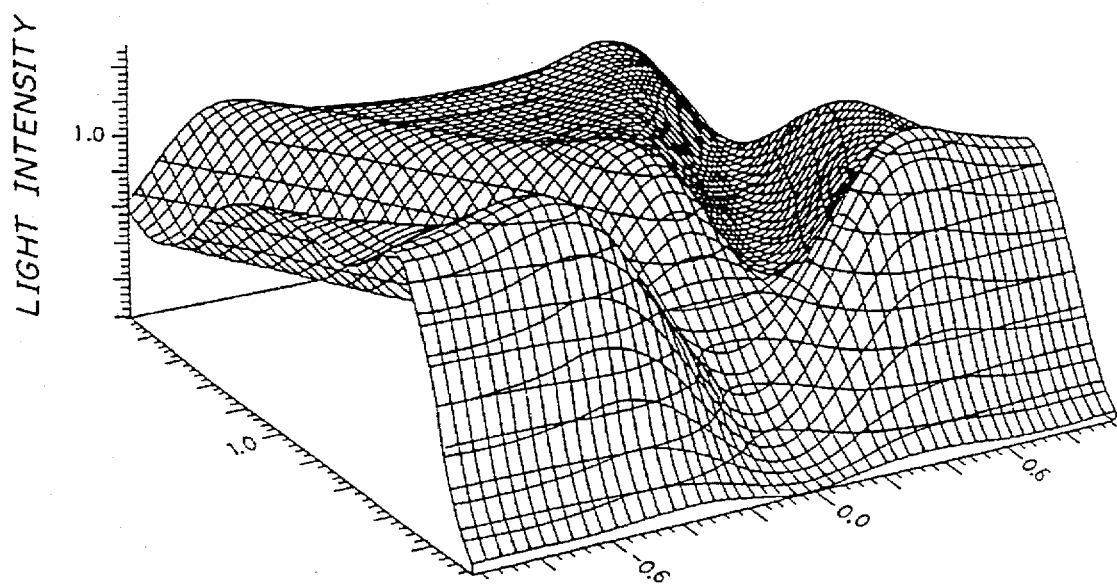
Figure 65:
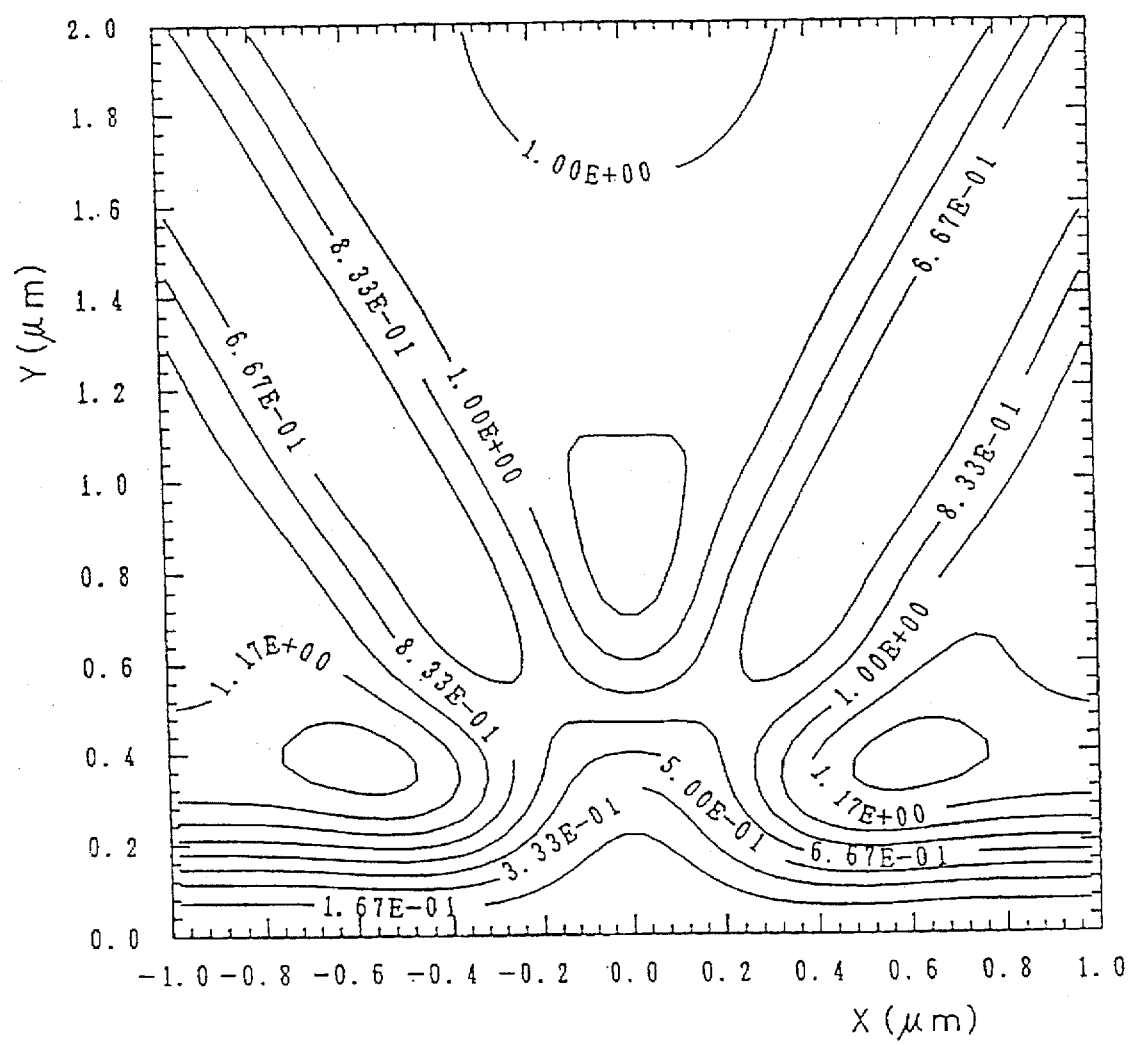

FIG. 65A through 65C are diagrams for explaining another illumination intensity pattern for imaging interconnections.

FIG. 65A shows the mask pattern for the interconnection pattern of FIG. 62C, and a sampling region is indicated by a phantom line. An aperture 60 which produces no phase shift and a phase shift layer 61 which has a phase shift quantity of 180° are positioned on the horizontal axis in FIG. 65A. The aperture 60 and the phase shift layer 61 are adjacent to each other in part and a phase shift layer 77 which has a phase shift quantity of 90° is formed between the aperture 60 and the phase shift layer 61 as shown. In addition, the upper side of the aperture 60 is at an angle 81 relative to the horizontal direction. The two sides of the phase shift layer (intermediate region) 77 are at an angle 82 relative to one another. Further, the upper side of the phase shift layer 61 is at an angle θ3 relative to the horizontal direction. The phase shift layer 61 which has a phase shift quantity of 180° is formed symmetrical with and adjacent to the aperture 60 beneath the horizontal axis, and the aperture 68 which produces no phase shift is formed beneath the phase shift layer 61. In addition, another phase shift layer 77 is formed beneath the horizontal axis at a position symmetrical with the phase shift layer 77 above the horizontal axis. A narrow region at the central portion where the apertures 60 and 68 meet with the phase shift layers 61 has a width W1. In this example, θ1=θ2=θ3=60°, and W1=0.2 μm. FIGS. 65B and 65C show the light intensity imaging pattern which is formed using such a mask pattern.

FIG. 65B shows the light intensity profile within the sampling region shown by phantom lines in FIG. 65A. A deep valley is formed along the direction X, and the valley extends in the direction Y at the central portion. Moreover, a shallow branching valley is formed as shown.

FIG. 65C shows a projection of the light intensity profile of FIG. 65B on the XY plane where the light intensity profile is described by contour lines of constant light intensity.

Figure 66A:
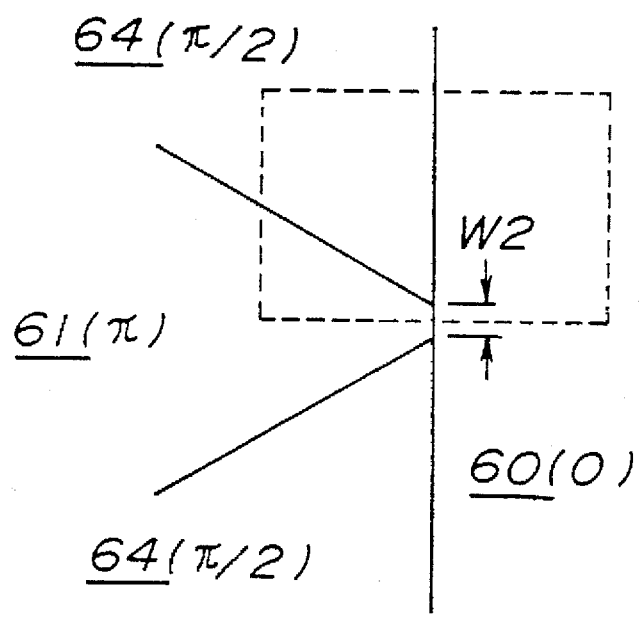
FIGS. 66A through 66C are diagrams for explaining the formation of a point pattern.
Figure 66:
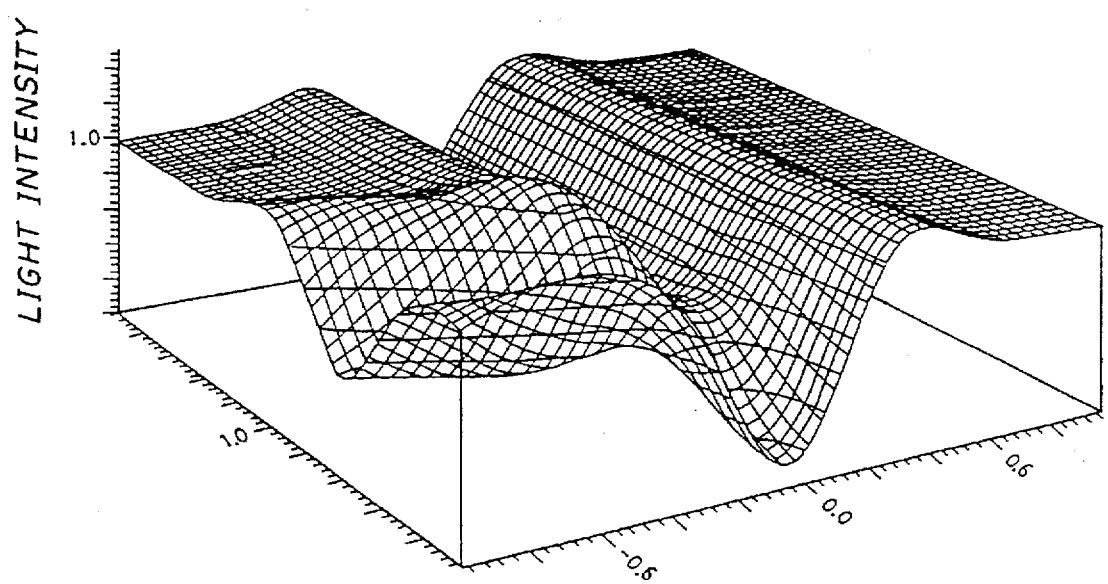
Figure 66:
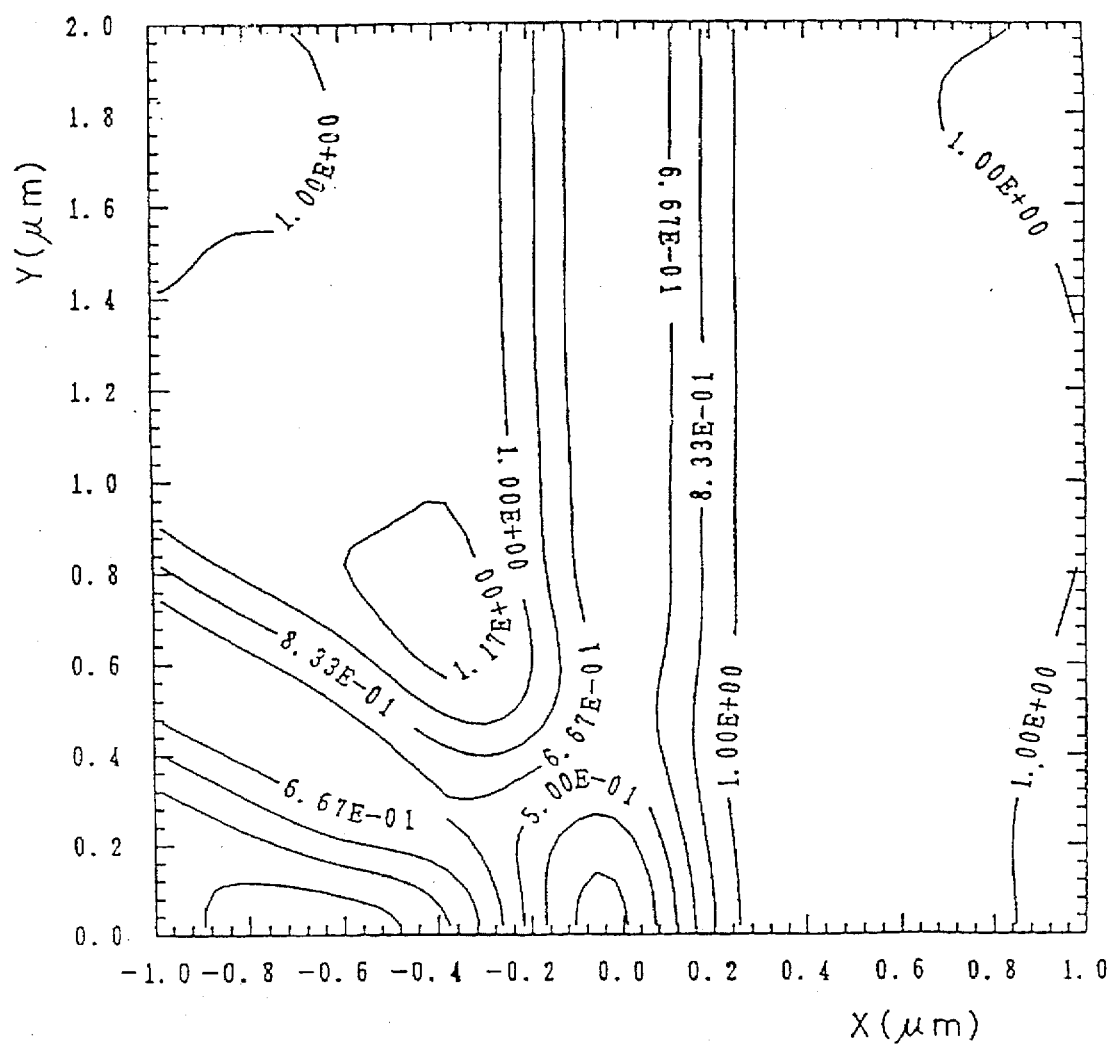

FIGS. 66A through 66C are diagrams for explaining a mask pattern having a structure similar to the mask pattern shown in FIG. 59A.

In FIG. 66A, the aperture 60 which produces no phase shift is formed to the right of the vertical axis and the phase shift layer 61 which has a phase shift quantity of 180° and a triangular shape is formed to the left of the axis. The aperture 60 and the phase shift layer 61 are adjacent to each other along the axis for a width W2. In addition, the phase shift layer 64 which has a phase shift quantity of 90° is formed in each intermediate region between the aperture 60 and the phase shift layer 61. The light intensity distribution is calculated for a sampling region indicated by a phantom line. For example, a gap of 0.08 μm is set for the width W2, and two boundary lines are formed by the phase shift layer 61 and the two phase shift layers 64 are at an angle of 60° relative to the vertical axis.

FIG. 66B shows the light intensity distribution within the sampling region shown in FIG. 66A, and FIG. 66C shows a projection of the light intensity profile of FIG. 66B on the XY plane where the light intensity profile is described by contour lines of constant light intensity. As may be seen from FIG. 66C, an oval region in which the light intensity is at a minimum is formed in the vicinity of the position (0.0).

Figure 67:
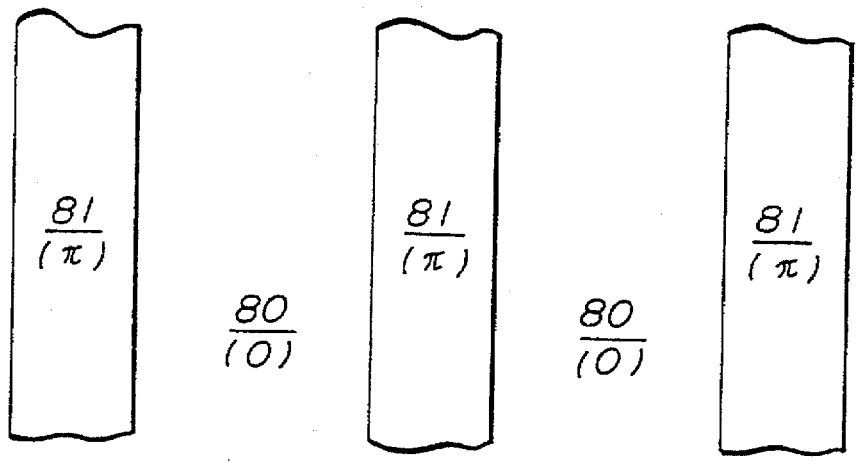
FIGS. 67A and 67B are diagrams for explaining the formation of a line-and-space pattern.
Figure 67:
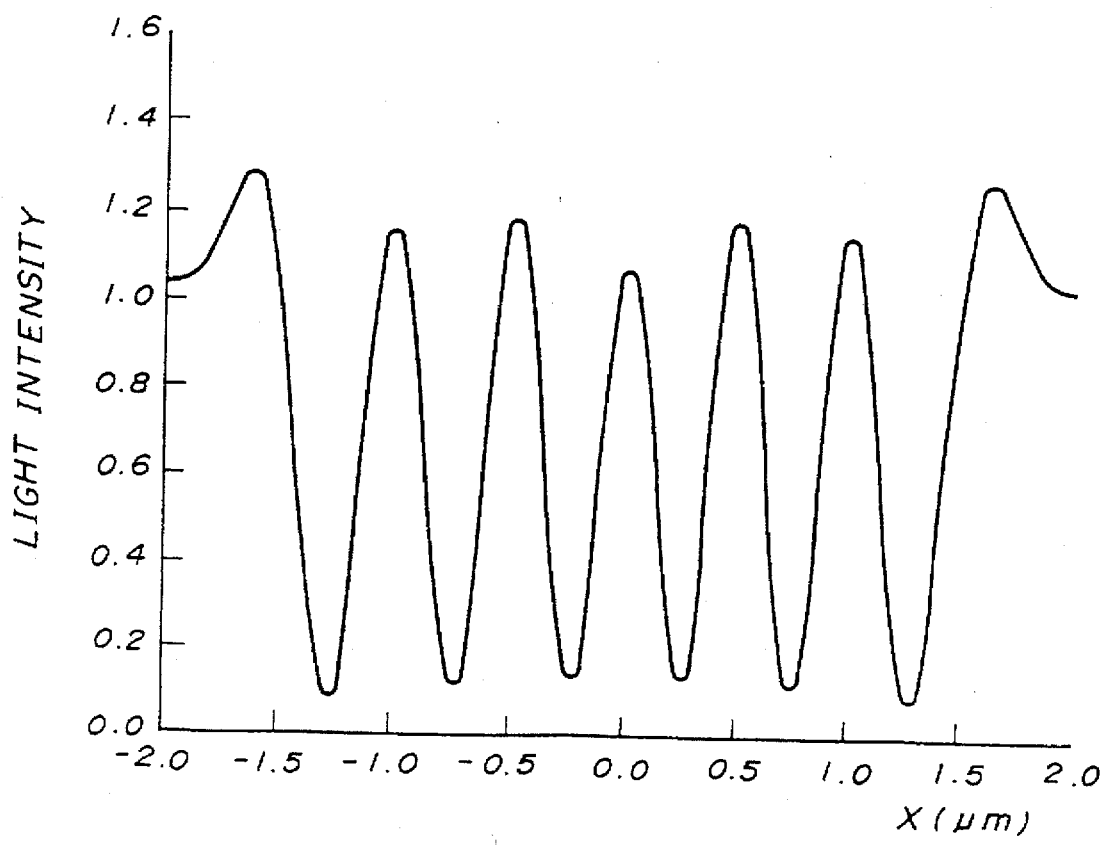

FIGS. 67A and 67B are diagrams for explaining a line-and-space pattern.

FIG. 67A shows a mask pattern for a line-and-space pattern. The line-and-space pattern is formed by alternating aperture regions 80 and phase shift regions 81. The aperture region 80 produces no phase shift and the phase shift region 81 has a phase shift quantity of 180°. For example, in a case where the widths of the aperture regions 80 and the phase shift regions 81 respectively are 0.5 µm and the light intensity profile for the imaged pattern is .calculated, the light intensity profile is as shown in FIG. 67B. The light intensity is at a minimum at regions corresponding to the boundaries between aperture regions 80 and phase shift regions 81. For the sake of convenience in calculating the profile of FIG. 67B, it is assumed that the light used for the exposure has a wavelength of 365 nm, that the numerical aperture NA of the lens system is 0.53, and that the partial coherency σ of the light is 0.5.

Figure 68:
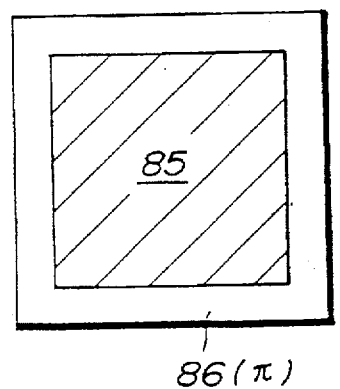
FIGS. 68A and 68B are diagrams for explaining the formation of a mixed pattern of various sizes.
Figure 68:
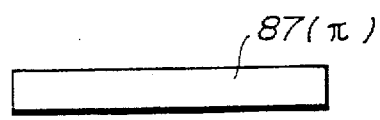
Figure 68:
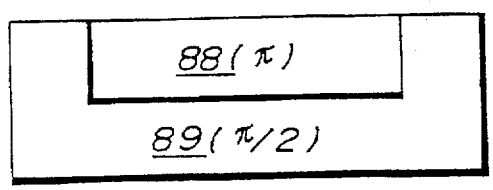
Figure 68:
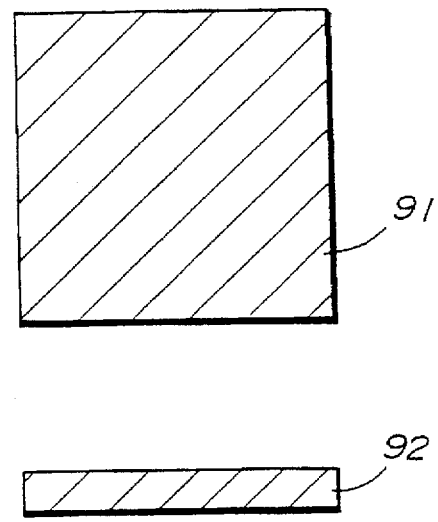
Figure 68:
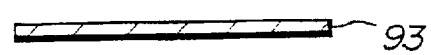

FIGS. 68A and 68B are diagrams for explaining the formation of a pattern in which various pattern sizes are mixed.

FIG. 68A shows a mask pattern. An opaque layer 85 for forming a large black pattern and a phase shift layer 86 are combined at the upper part. A phase shift layer 87 for forming an image of the phase shift layer itself is formed at the intermediate part. A phase shift layer 88 for forming an imaged pattern using an edge portion of the layer is formed at the lower part. A phase shift layer 89 which has an intermediate phase shift quantity for preventing the imaging of the sides of layer 88 is formed at the periphery of the phase shift layer 88. For example, the phase shift layers 86, 87 and 88 have a phase shift quantity of 180°, and the phase shift layer 89 has a phase shift quantity of 90°. When the lens system used has a numerical aperture NA of 0.4 to 0.6 for an i-ray beam, a pattern having a dimension of 0.5 µm or greater is formed by arranging a phase shift region 86 having a phase shift quantity of 90° around the opaque layer 85 as shown in the upper part of FIG. 68A. Where the dimension of the black pattern is in the range from 0.3 to 0.5 µm, the mask is formed solely of a pattern of the phase shift layer 87 having a phase shift quantity of 180°, as shown in the intermediate part of FIG. 68A. A pattern having a dimension of 0.25 µm or less is formed using the boundary between a phase shift layer 88 which has a phase shift quantity of 180° and an aperture region 90 which produces no phase shift, as shown in the lower part of FIG. 68A. In this case, the sides of the phase shift region 88 which are not used for forming the image are surrounded by the phase shift layer 89 which has an intermediate phase shift quantity so imaging may be prevented by adjusting the developing level.

FIG. 68B shows the imaged pattern which is obtained by use of the mask pattern shown in FIG. 68A. A black pattern 91 which corresponds to the mask which is made up of the opaque layer 85 and the phase shift region 86 is formed as the upper part. A black pattern 92 which corresponds to the phase shift layer 67 is formed as the intermediate part. A narrow black pattern 93 which corresponds to the boundary between the phase shift layer 88 and the aperture region 90 is formed as the lower part.

When producing an integrated circuit by the photolithography, the pattern of the reticle is imaged on the wafer using an imaging lens system. Accompanied by an increase in the integration density of the integrated circuit, the numerical aperture NA of the imaging lens system is increased so as to improve the resolution and cope with the fine integrated circuit patterns. However, when the numerical aperture NA is enlarged to improve the resolution the focal point depth FD is reduced according to the following formula (4), where $K_2$ denotes a process coefficient.

$$FD=K_2(\lambda/NA^2) \quad (4)$$

Accordingly, it is impossible to accurately form a pattern with respect to a concavoconvex surface.

Figure 69:
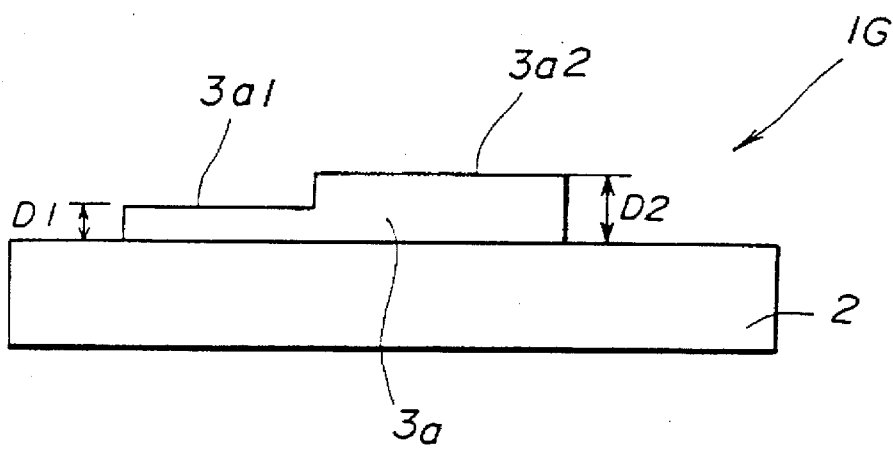
FIG. 69 is a cross-sectional view showing a sixth embodiment of a mask according to the present invention.

The following is a description of an embodiment which can satisfactorily be used to form a pattern even with respect to a concavoconvex surface. FIG. 69 shows a sixth embodiment of a mask according to the present invention. In FIG. 69, parts which are essentially the same as corresponding parts in FIG. 9 are designated by the same reference numerals, and a description thereof will be omitted. In this embodiment, the phase shift layer 3a comprises a shifter portion 3a1 having a thickness D1 and a shifter portion 3a2 having a thickness D1, where D2>D1. By providing such shifter portions which have different thicknesses, it is possible to arbitrarily control the focal point of the image when making the exposure.

The following is a description of a fifth embodiment of a pattern forming method according to the present invention. In this embodiment, the phase shift layer of the mask has local regions where the thickness is different where needed. For the sake of convenience, it is assumed that the mask 1A shown in FIG. 19 and the optical system shown in FIG. 22 are used to form the pattern, and the following description relates to the relationship between the thickness of the phase shift layer 3a and the deviation (defocus quantity) of the focal position. The light used for the exposure, the material used for the phase shift layer 3a and other parameters are the same as those of the embodiment described above. When the thickness t of the phase shift layer 3a is calculated for obtaining phase shift quantities S of 180°, 120° and 240°, respectively, t=0.388, 0.259 and 0.517 µm.

Figure 70:
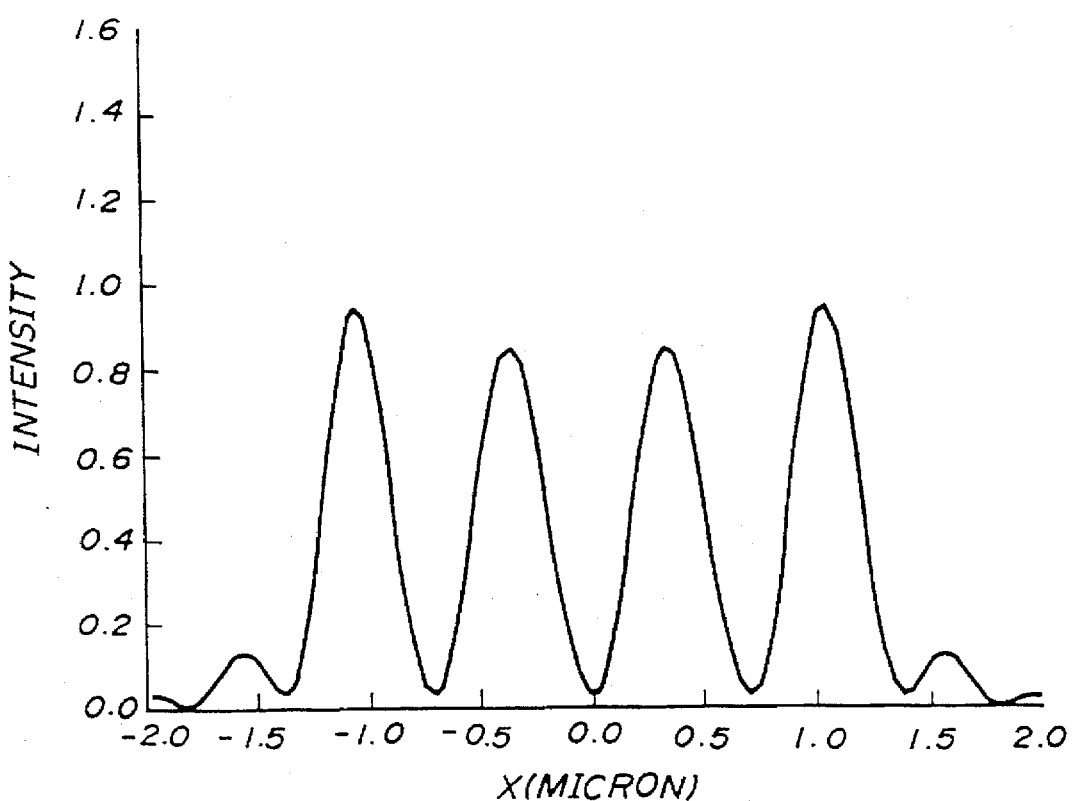
FIGS. 70A through 70E, FIGS. 71A through 71D and FIGS. 72A through 72D are diagrams for explaining the light intensity distribution patterns for phase shift layers having different thicknesses.
Figure 70A:
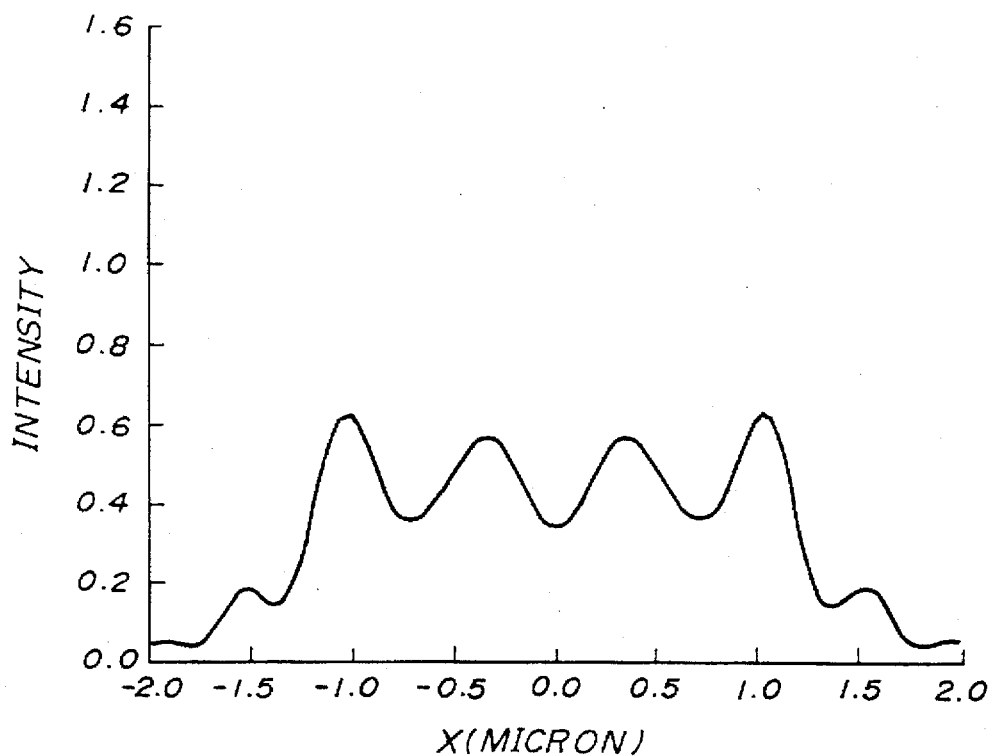
Figure 70B:
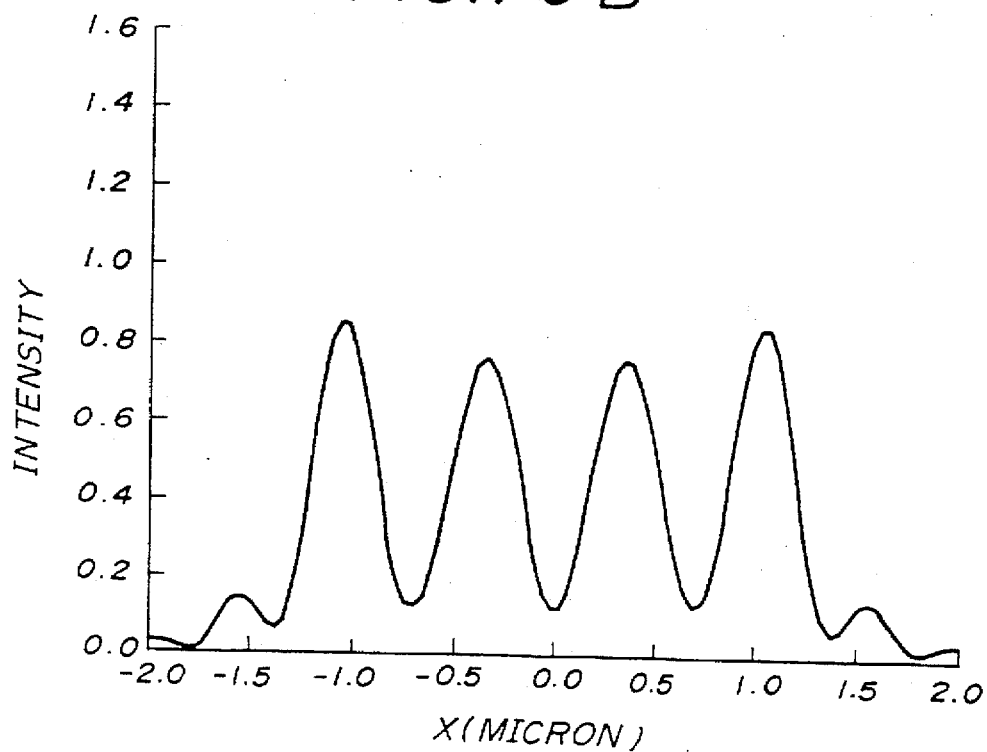
Figure 70D:
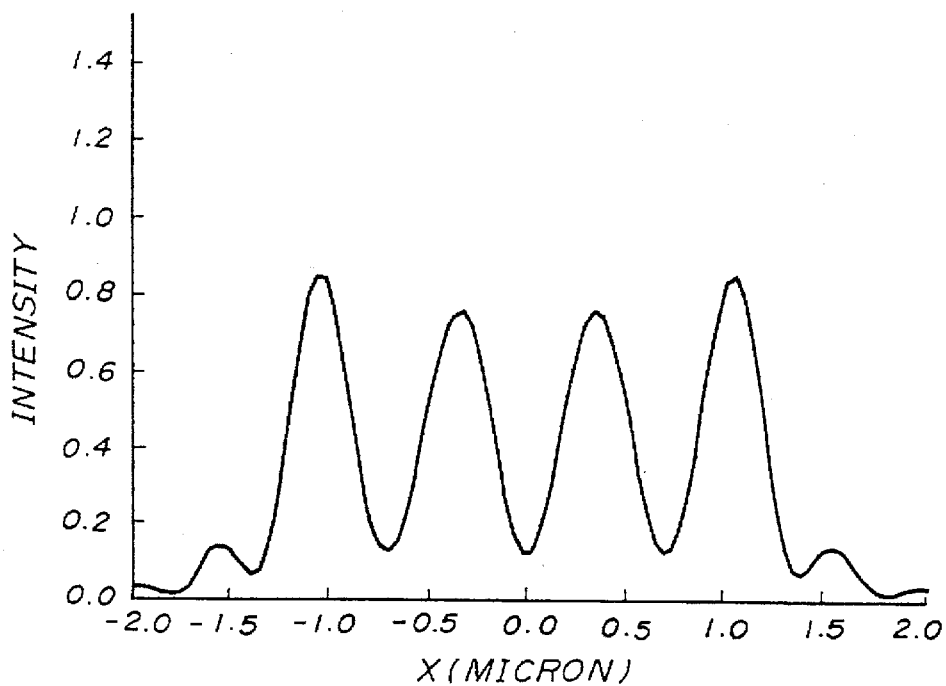
Figure 70E:
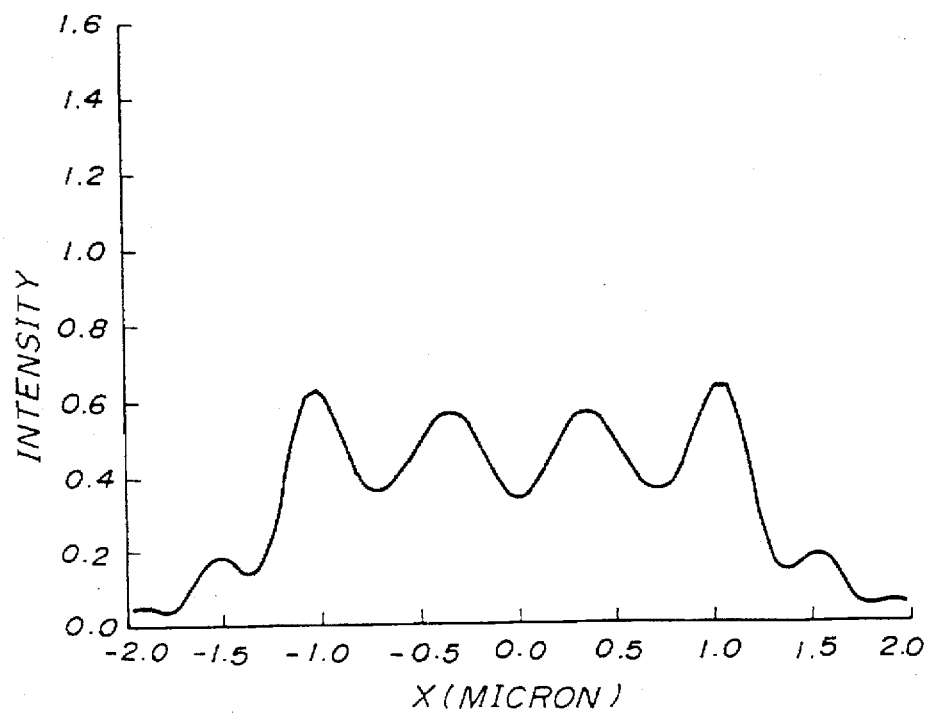
Figure 71:
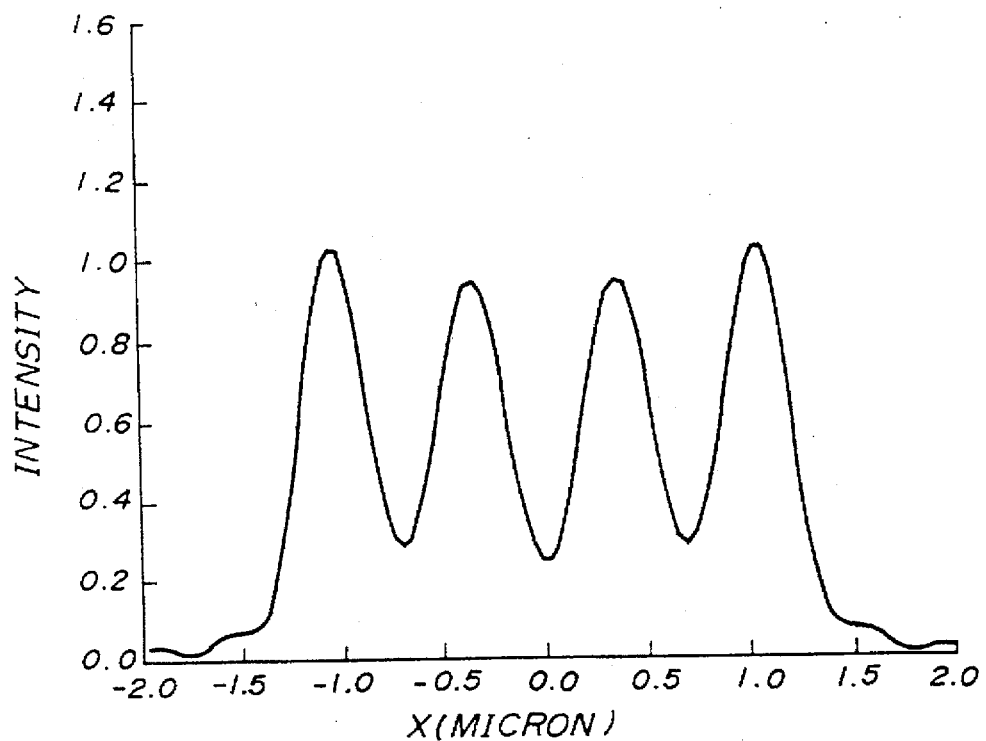
Figure 71:
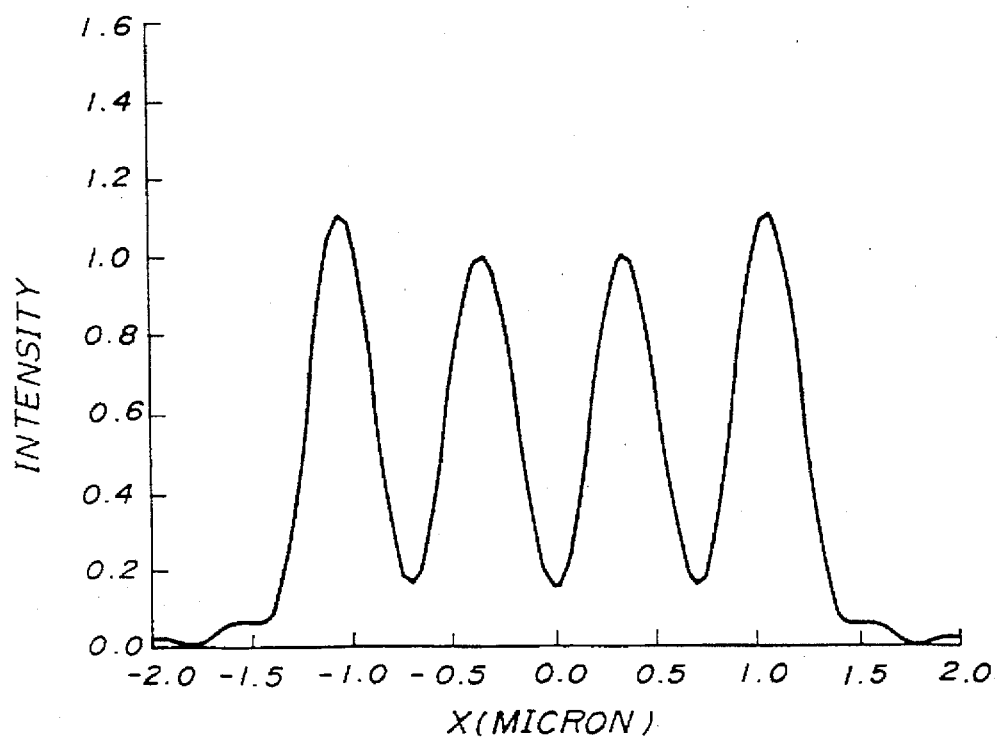
Figure 71:
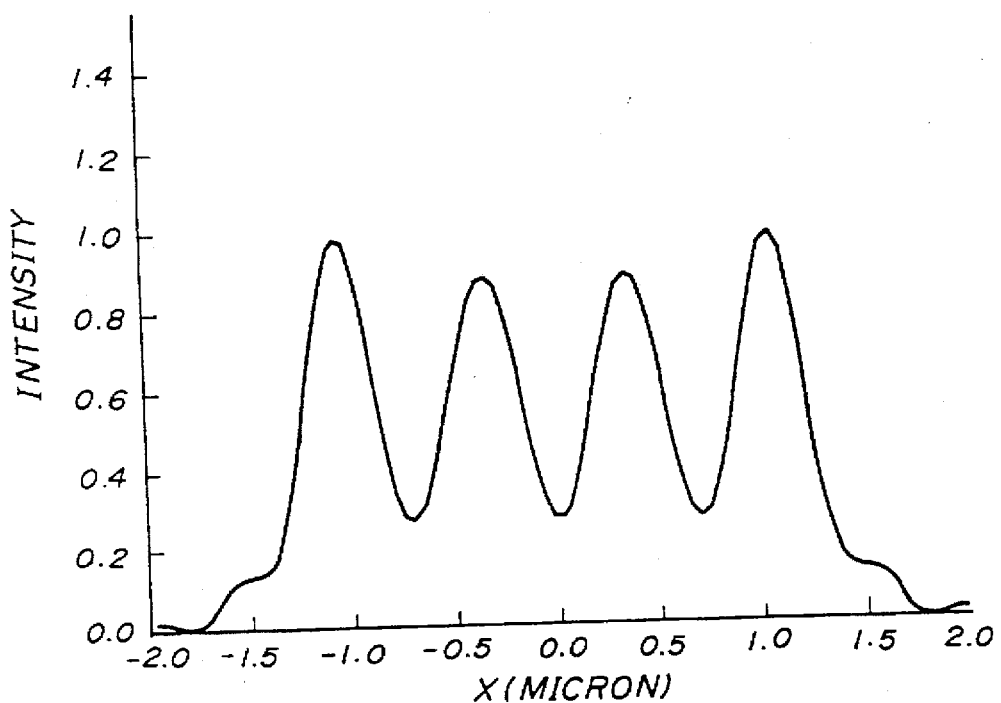
Figure 71:
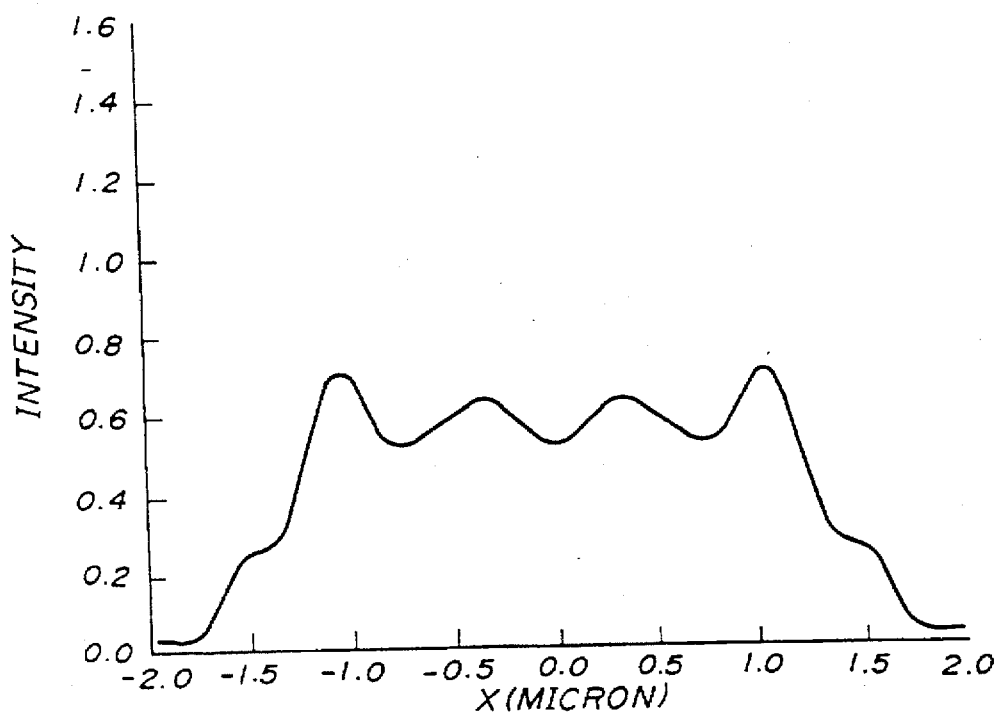
Figure 72:
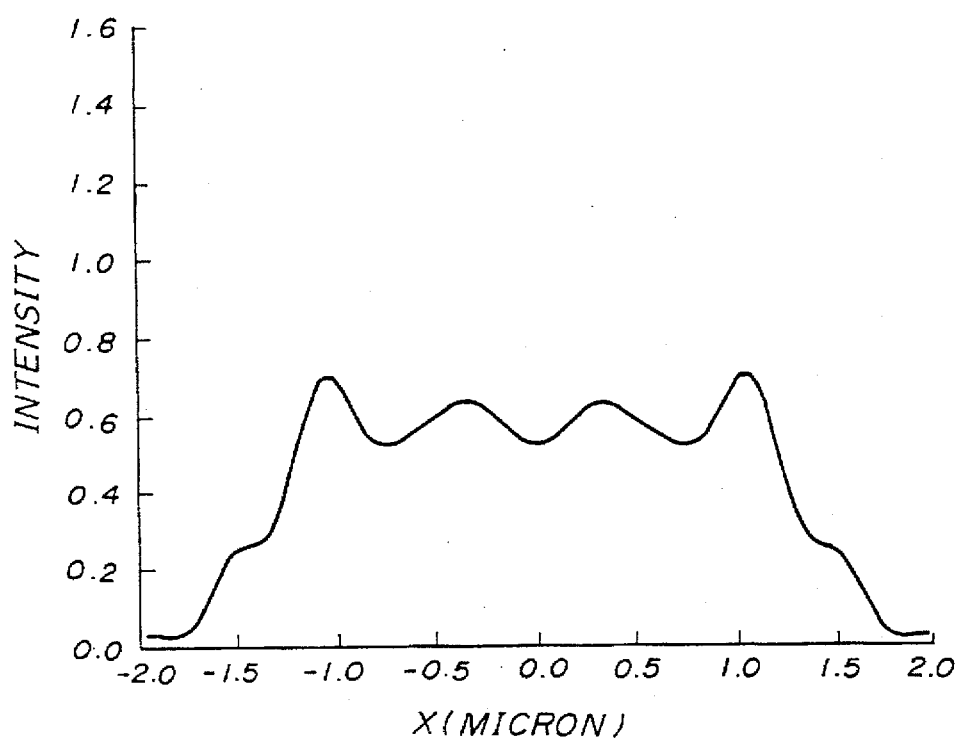
Figure 72:
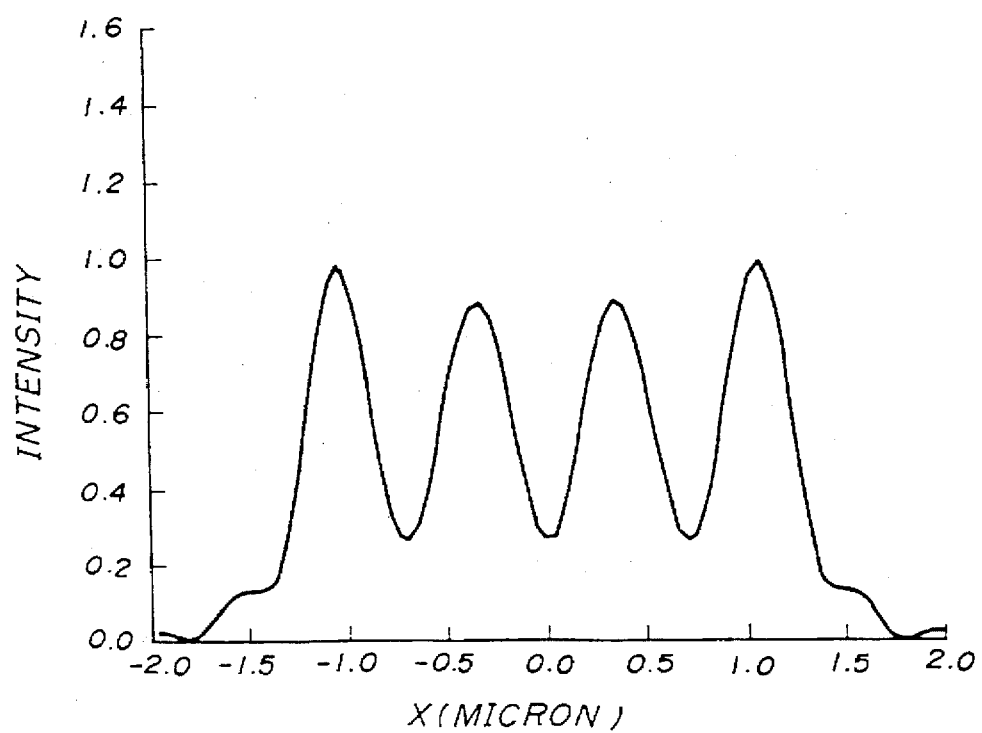
Figure 72:
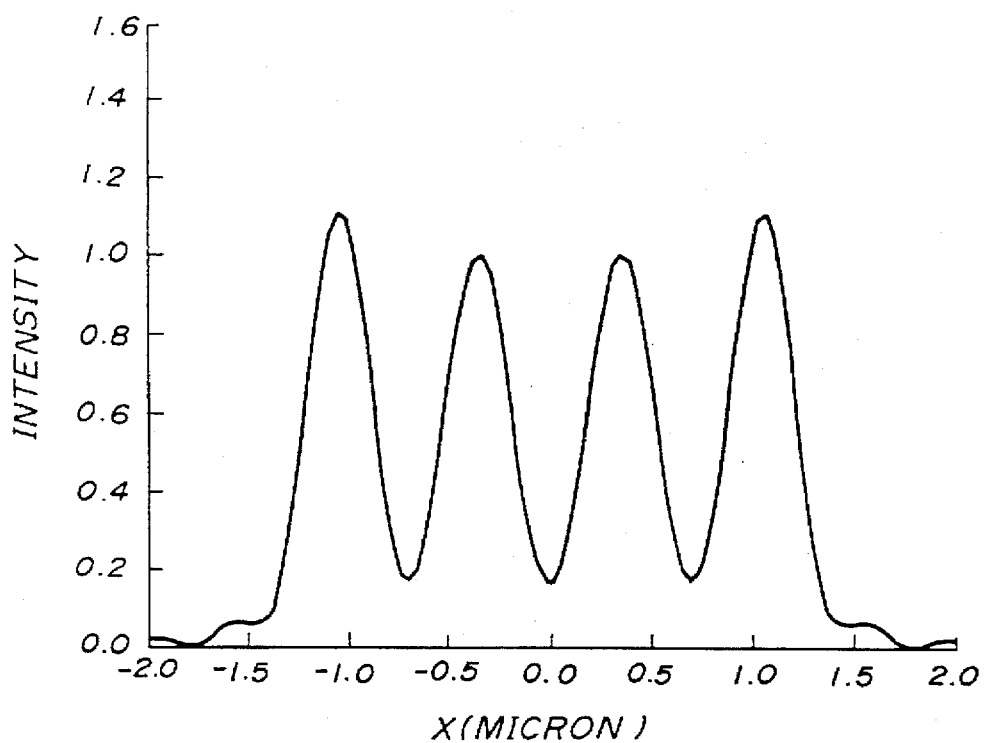
Figure 72:
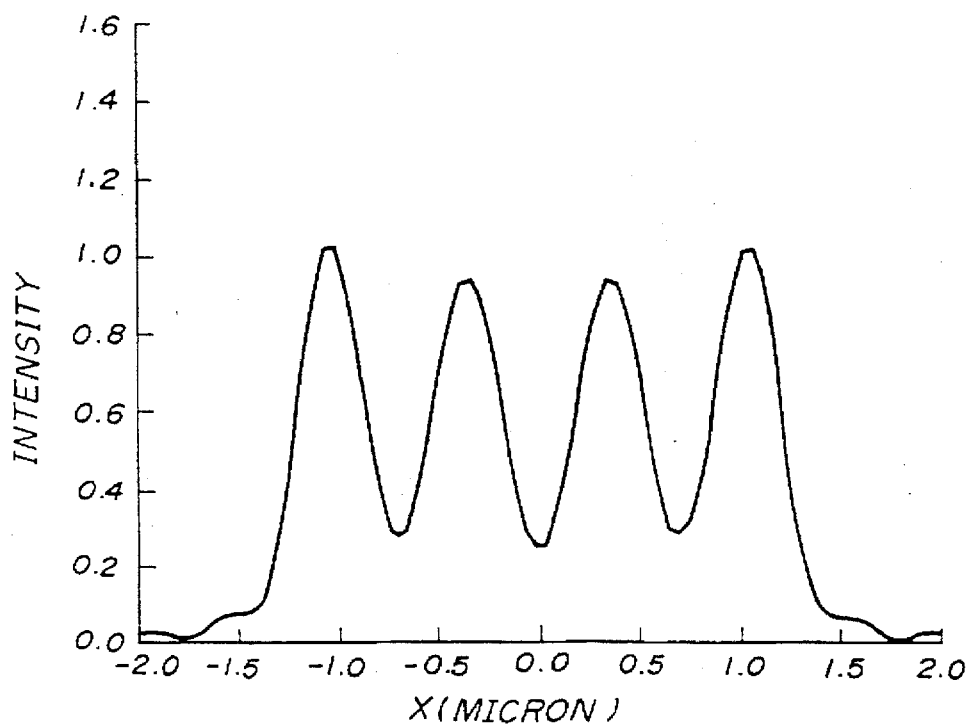

When t=0.388 µm and S=180°, the light intensity distribution is as shown in FIG. 70C when lens system 9 is in focus, that is, when the defocus quantity is zero. However, when the system is out of focus and the defocus quantities are set to be +1.0 and +0.5 µm as a result of the movement of the lens system towards the wafer 11 along the optical axis of the lens system 9, the light intensity distributions are as shown in FIGS. 70A and 70B, respectively. On the other hand, when the lens system is defocused the same amounts in the negative direction (the defocus quantities are set to be −0.5 and −1.0 µm), the light intensity distributions are as shown in FIGS. 70D and 70E, respectively. As may be seen from FIGS. 70A through 70E, the light intensity distribution changes in the same manner regardless of whether the focal point deviates in the positive direction or the negative direction.

FIGS. 71A, 71B, 71C and 71D respectively show the light intensity distributions which are obtained when t=0.259 µm, S=120° and the lens system is set to have defocus quantities of +1.0, +0.5, 0 and −0.5 µm. As may be seen from FIGS. 71A through 71D, the contrast is at a maximum when the defocus quantity is +0.5 µm.

FIGS. 72A, 72B, 72C and 72D respectively show the light intensity distributions which are obtained when t=0.517 µm, S=240° and the defocus quantities are set to be +0.5, 0, −0.5 and −1.0 µm. In this case, as may be seen from FIGS. 72A through 72D, the contrast is at a maximum when the defocus quantity is −0.5 µm.

Accordingly, the focal point can be controlled within the range of 0.5 µm by appropriately determining the thickness t of the phase shift layer.

In conducting production processes for integrated circuits, it sometimes occurs that one region of the integrated circuit may have a height that is greater than other regions. For example, in dynamic random access memory (DRAM) circuits, the memory cell part is 0.5 to 1.0 µm higher than the other peripheral circuit parts when stacked capacitors are used. In such a case, when an attempt is made to form a pattern within the resolution limits using a lens system having a large numerical aperture NA, the focal point depth FD is small and it is difficult to apply pattern formation principles to the production of integrated circuits having concavoconvex surfaces.

Figure 73:
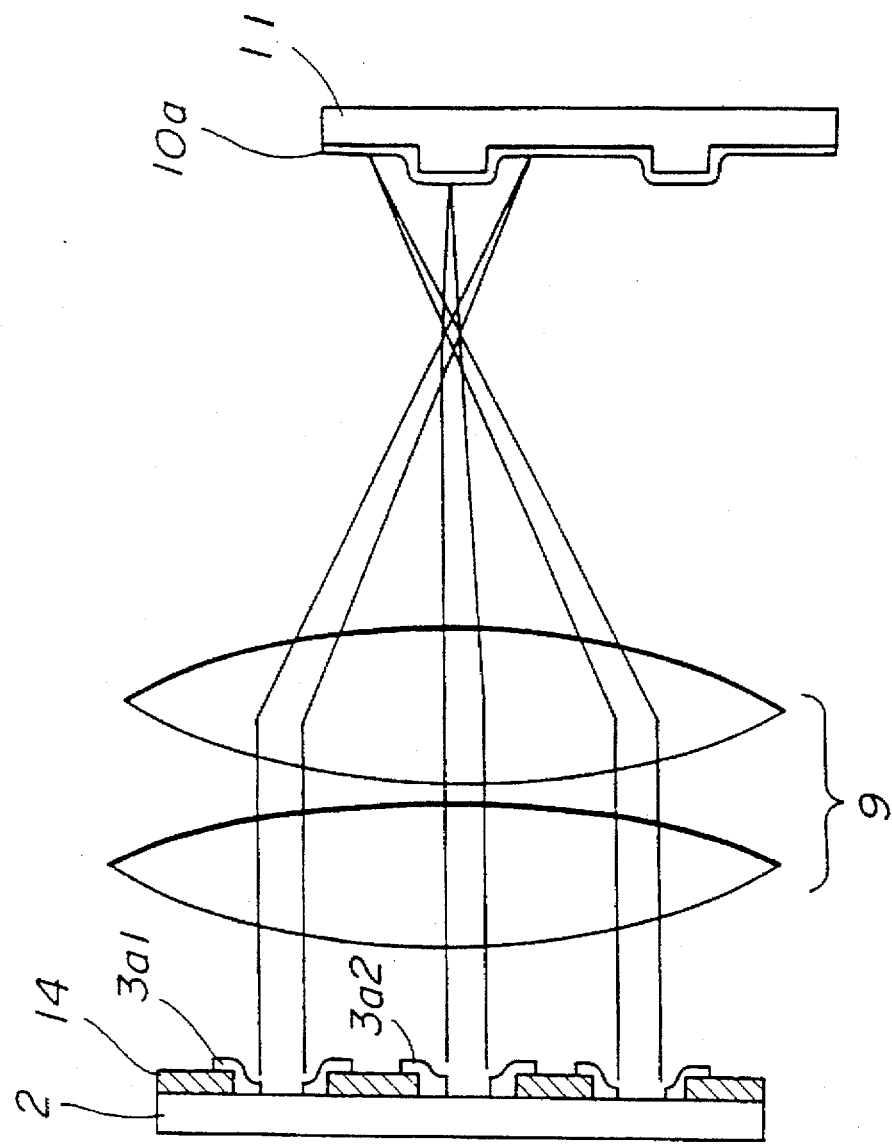
FIG. 73 is a diagram for explaining a fifth embodiment of a pattern forming method according to the present invention.
Figure 74:
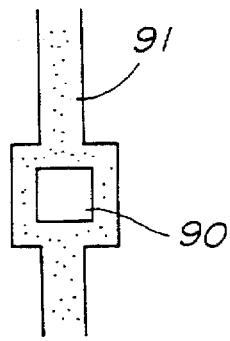
FIGS. 74A, 74B, 75A, 75B, 76A, 76B, 77A and 77B are diagrams showing examples of the patterns formed according to the present invention.
Figure 74:
Figure 75:
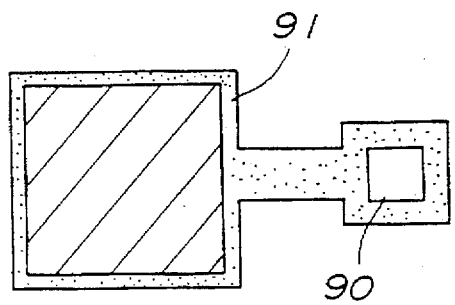
Figure 75:
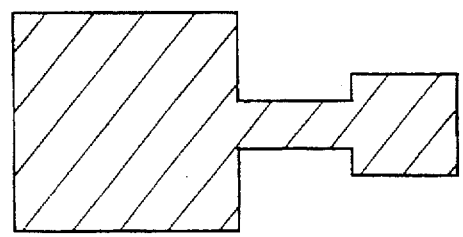
Figure 76:
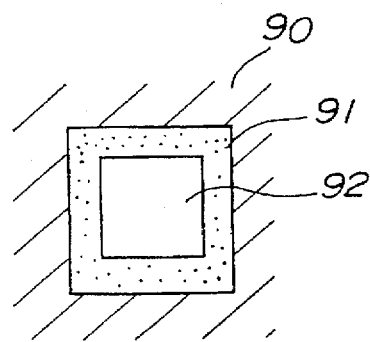
Figure 76:
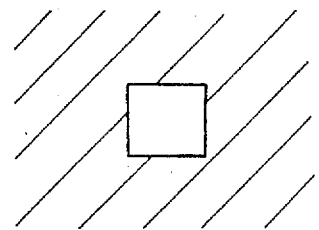
Figure 77:
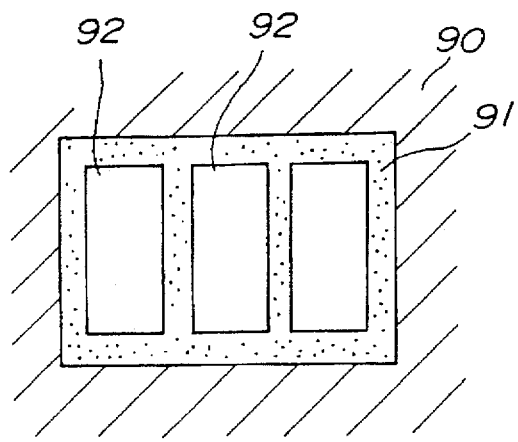
Figure 77:
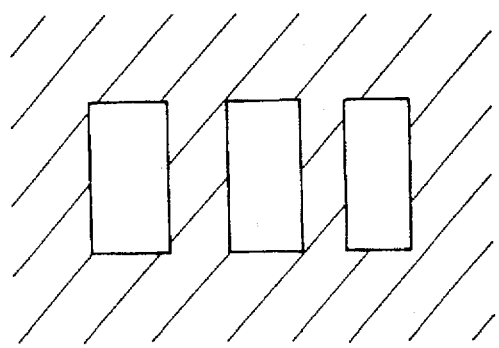

However, according to this embodiment of the invention, it is possible to apply the pattern formation principles of the invention to the production of DRAM ICs using stacked capacitors as shown in FIG. 73. In FIG. 73, parts which are essentially the same as the corresponding parts of FIGS. 22 and 69 are designated by the same reference numerals, and a description thereof will be omitted. In this case, the formation of the pattern at the lower portions of the integrated circuit such as the peripheral circuit parts of the DRAM is accomplished by use of a thinner shifter portion 3a1 of the phase shift layer 3a. Accordingly, D1 for portion 3a1 may be less than 0.388 µm. For example, when the difference in the heights of the cell part and the peripheral circuit parts of the DRAM is approximately 1.0 µm, D1 is set to 0.259 µm. On the other hand, the pattern formation of the high portion of the integrated circuit such as the cell part of the DRAM is accomplished by use of a thicker shifter portion 3a2 of the phase shift layer 3a. Hence D2 for portion 3a2 may be greater than 0.388 µm. For example, D2 is set to 0.517 µm when the cell part is approximately 1 µm higher than the peripheral circuit parts of the DRAM.

By controlling the thickness of the phase shift layer depending in the concavoconvex surface of the integrated circuit, it is possible to form the pattern by matching the focal point to all surface portions of the integrated circuits.

As described heretofore in conjunction with the various embodiments, the present invention provides for the formation of the patterns by utilizing a phase shift layer. For this reason, it is possible to form arbitrary fine patterns through the use of a mask in which the phase shift layer is appropriately arranged. FIGS. 74A, 75A, 76A and 77A show examples of mask patterns and FIGS. 74B, 75B, 76B and 77B show respective patterns which can be formed using the mask patterns of FIGS. 74A, 75A, 76A and 77A. FIGS. 74A through 77B illustrate masks which include an opaque layer 90, a phase shift layer 91 and an aperture (window) 92 and the patterns produced therefrom.

In the embodiments described above, the partial coherency σ has been set at 0.5. However, the partial coherency σ is not limited to a setting of 0.5 and instead may be set within the range of $0.3 \leq \sigma \leq 0.7$.

In addition, the light which is used for the exposure is not limited to i-ray beams. The mask may be illuminated either from the side of the transparent substrate where the phase shift layer is located or from the other side which is opposite from the phase shift layer. The materials used for the transparent substrate and the phase shift layer are of course not limited to those of the described embodiments. For example, the transparent substrate may be made of any material as long as the transparent substrate is transparent with respect to the light which is used for the exposure. Furthermore, the phase shift layer may be made of a material selected from a group including $SiO_2$, $Al_2O_3$ and $MgF_2$.

The masks described in the embodiments include reticles. Accordingly, the pattern forming method according to the present invention is not limited to applications involving the formation of patterns on semiconductor devices, and may of course be applied to the formation of patterns for masks and reticles.

Further, the present invention is not limited to these embodiments, but various variations and modifications may be made without departing from the scope of the present invention.

What is claimed is:

1. A method for producing a mask comprising the steps of:

providing a first layer which is transparent with respect to an exposure light;

forming an opaque layer on portions of one side of said first layer;

etching said first layer to a predetermined thickness using said opaque layer as a mask;

forming a resist layer on said opaque layer and said first layer;

exposing said resist layer from the opposite side of said first layer so as to develop said resist layer into a resist pattern;

removing a portion of said opaque layer by side etching to present an edge portion; and removing said resist pattern to uncover a phase shift region on said first layer adjacent said edge portion, said phase shift region having a different thickness than the remaining areas of said first layer and being adapted for transmitting exposure light impinging thereon and shifting the phase of the transmitted light relative to exposure light which passes through said remaining areas but does not impinge on the phase shift region.

2. A method for producing a mask as set forth in claim 1, wherein said predetermined thickness is such that the phase of exposure light transmitted by said region is shifted within the range of from 150° to 210° relative to the phase of exposure light which passes through the first layer but does not impinge on said region.

3. A method for producing a mask as set forth in claim 1, wherein said edge portion and said phase shift region are configured for forming a line pattern.

4. A method for producing a mask as set forth in claim 1, wherein said opaque layer is etched so as to present two edge portions and a respective phase shift region is disposed adjacent each edge portion, said edge portions and said phase shift regions being configured for forming a pattern having an arbitrary width.

5. A method for producing a mask as set forth in claim 1, wherein said first layer is made of quartz or glass.

6. A method for producing a mask comprising the steps of:

providing a first layer which is transparent with respect to an exposure light;

forming an opaque layer on portions of one side of said first layer;

etching said first layer to a predetermined thickness using said opaque layer as a mask;

forming a resist layer on said opaque layer and said first layer;

exposing said resist layer from the opposite side of said first layer so as to develop said resist layer with a resist pattern and expose a portion of said opaque layer; and removing the exposed portion of said opaque layer to present an edge portion and uncover a phase shift region on said first layer adjacent said edge portion, said phase shift region having a different thickness than the remaining areas of said first area of said first layer and being adapted for transmitting exposure light impinging thereon and shifting the phase of the transmitted light relative to exposure light which passes through said remaining areas but does not impinge on the phase shift region.

7. A method for producing a mask as set forth in claim 6, wherein said predetermined thickness is such that the phase of exposure light transmitted by said region is shifted within the range of from 150° to 210° relative to the phase of exposure light which passes through the first layer but does not impinge on said region.

8. A method for producing a mask as set forth in claim 6, wherein said edge portion and said phase shift region are configured for forming a line pattern.

9. A method for producing a mask as set forth in claim 6, wherein said opaque layer is etched so as to present two edge portions and a respective phase shift region is disposed adjacent each edge portion, said edge portions and said phase shift regions being configured for forming a pattern having an arbitrary width.

10. A method for producing a mask as set forth in claim 6, wherein said first layer is made of quartz or glass.

11. A method for producing a mask comprising the steps of:

providing a first layer which is transparent with respect to an exposure light, the first layer having an original thickness;

forming an opaque layer on portions of one side of said first layer such that the opaque layer has a side boundary through which a target portion of the first layer is exposed;

etching the target portion of the first layer to a predetermined thickness reduced from the original thickness, using said opaque layer as a mask;

forming a resist layer on said opaque layer and the target portion of the first layer etched to the predetermined thickness;

exposing said resist layer from the opposite side of said first layer so as to develop said resist layer into a resist pattern through which the side boundary of the opaque layer and the target portion of the first layer are exposed;

removing a portion of said opaque layer by etching from the side boundary of the opaque layer to define an edge portion of the opaque layer which surrounds a remainder portion of the first layer substantially having the original thickness; and removing said resist pattern to uncover a phase shift region on said first layer adjacent said edge portion, said phase shift region comprising the target portion of the first layer etched to the predetermined thickness and the remainder portion of the first layer substantially having the original thickness, the phase shift region being adapted for transmitting exposure light impinging thereon and shifting the phase of the transmitted light relative to exposure light which passes through said remaining areas but does not impinge on the phase shift region.

12. A method for producing a mask comprising the steps of:

providing a first layer which is transparent with respect to an exposure light, the first layer having an original thickness;

forming an opaque layer on portions of one side of said first layer such that a target portion of the first layer is exposed through the opaque layer;

etching the target portion of the first layer to a predetermined thickness reduced from the original thickness, using said opaque layer as a mask;

forming a resist layer on said opaque layer and the target portion of the first layer etched to the predetermined thickness;

exposing said resist layer from the opposite side of said first layer so as to develop said resist layer into a resist pattern through which the target portion of the first layer and a portion of the opaque layer surrounding the target portion are exposed; and removing the portion of the opaque layer surrounding the target portion to define an edge portion in the opaque layer which surrounds a remainder portion of the first layer substantially having the original thickness, the target portion of the first layer etched to the predetermined thickness and the remainder portion of the first layer having substantially the original thickness defining a phase shift region, said phase shift region being adapted for transmitting exposure light impinging thereon and shifting the phase of the transmitted light relative to exposure light which passes through said remaining areas but does not impinge on the phase shift region.

* * * * *

UNITED STATES PATENT AND TRADEMARK OFFICE
CERTIFICATE OF CORRECTION

PATENT NO. : 5,674,646
DATED : October 7, 1997
INVENTOR(S) : KAWABATA et al.

It is certified that error appears in the above-identified patent and that said Letters Patent is hereby corrected as shown below:

Col. 2, line 31, change "X" to --$\lambda$--.

Col. 4, line 31, change "X" to --$\lambda$--;
line 35, delete the equation and substitute therefore --$D = \lambda/2(n-1)$--.

Col. 6, line 27, delete ",".

Col. 7, line 13, change "Said" to --said--.

Col. 11, line 57, change "Which" to --which--.

Col. 18, line 35, change "82m" to --$\mu$m--.

Col. 19, line 58, change "width 1" to --width $\ell$--.

Col. 23, line 40, change "82m" to --$\mu$m--.

Col. 25, line 27, change "oft he" to --of the--.

Col. 30, line 15, change "81" to --$\theta$1--;
line 17, change "82" to --$\theta$2--.

Signed and Sealed this

Twenty-seventh Day of January, 1998

BRUCE LEHMAN

Attest:

Attesting Officer

Commissioner of Patents and Trademarks